(12) United States Patent
Jiang et al.

(10) Patent No.: US 10,976,010 B2
(45) Date of Patent: Apr. 13, 2021

(54) LED FILAMENT AND LED LIGHT BULB

(71) Applicant: ZHEJIANG SUPER LIGHTING ELECTRIC APPLIANCE CO., LTD, Jinyun (CN)

(72) Inventors: Tao Jiang, Jiaxing (CN); Liqin Li, Jiaxing (CN)

(73) Assignee: ZHEJIANG SUPER LIGHTING ELECTRIC APPLIANCE CO., LT, Jinyun (CN)

( * ) Notice: Subject to any disclaimer, the term of this patent is extended or adjusted under 35 U.S.C. 154(b) by 0 days.

(21) Appl. No.: 16/503,648

(22) Filed: Jul. 5, 2019

(65) Prior Publication Data

US 2019/0331303 A1   Oct. 31, 2019

Related U.S. Application Data

(63) Continuation of application No. 15/590,295, filed on May 9, 2017, now Pat. No. 10,359,152, which is a
(Continued)

(30) Foreign Application Priority Data

| Aug. 17, 2015 | (CN) | 201510502630.3 |
| Dec. 19, 2015 | (CN) | 201510966906.3 |
| Jan. 22, 2016 | (CN) | 201610041667.5 |
| Apr. 27, 2016 | (CN) | 201610272153.0 |
| Apr. 29, 2016 | (CN) | 201610281600.9 |
| Jun. 3, 2016 | (CN) | 201610394610.3 |
| Jul. 7, 2016 | (CN) | 201610544049.2 |

(Continued)

(51) Int. Cl.
*F21K 9/232* (2016.01)
*F21K 9/238* (2016.01)
(Continued)

(52) U.S. Cl.
CPC .............. *F21K 9/232* (2016.08); *F21K 9/238* (2016.08); *F21V 3/02* (2013.01); *H01L 24/48* (2013.01);
(Continued)

(58) Field of Classification Search
CPC ............. F21Y 2103/10; F21Y 2103/30; F21Y 2103/33; F21Y 2103/37; F21S 4/20; F21S 4/24; F21S 4/26
See application file for complete search history.

(56) References Cited

U.S. PATENT DOCUMENTS

| 6,586,882 B1 | 7/2003 | Harbers |
| 7,399,429 B2 | 7/2008 | Liu et al. |

(Continued)

FOREIGN PATENT DOCUMENTS

| CN | 201163628 Y | 12/2008 |
| CN | 201448620 U | 5/2010 |

(Continued)

*Primary Examiner* — Sean P Gramling
(74) *Attorney, Agent, or Firm* — Simon Kuang Lu

(57) ABSTRACT

An LED filament, comprising: an enclosure; a linear array of LED devices; and an electrical connector, wherein: the enclosure includes an optically transmissive binder; and the linear of LED devices is conformally wrapped around by the enclosure to be operable to emit light when energized through the electrical connector.

16 Claims, 54 Drawing Sheets

Related U.S. Application Data continuation-in-part of application No. 15/384,311, filed on Dec. 19, 2016, now Pat. No. 10,487,987, which is a continuation-in-part of application No. 15/366,535, filed on Dec. 1, 2016, now Pat. No. 10,473,271, which is a continuation-in-part of application No. 15/237,983, filed on Aug. 16, 2016, now Pat. No. 10,228,093.

(30) Foreign Application Priority Data

| Date | | Number |
|---|---|---|
| Jul. 22, 2016 | (CN) | 201610586388.7 |
| Nov. 1, 2016 | (CN) | 201610936171.4 |
| Dec. 6, 2016 | (CN) | 201611108722.4 |
| Jan. 13, 2017 | (CN) | 201710024877.8 |
| Feb. 14, 2017 | (CN) | 201710079423.0 |
| Mar. 9, 2017 | (CN) | 201710138009.2 |
| Mar. 23, 2017 | (CN) | 201710180574.5 |
| Apr. 11, 2017 | (CN) | 201710234618.8 |
| May 8, 2017 | (CN) | 201710316641.1 |

(51) Int. Cl.

| | |
|---|---|
| F21V 3/02 | (2006.01) |
| H01L 23/00 | (2006.01) |
| F21Y 115/10 | (2016.01) |
| F21Y 103/10 | (2016.01) |
| F21K 9/90 | (2016.01) |
| F21V 19/00 | (2006.01) |
| H01L 25/075 | (2006.01) |
| F21Y 103/33 | (2016.01) |
| F21Y 103/37 | (2016.01) |
| F21Y 107/00 | (2016.01) |
| F21V 3/06 | (2018.01) |

(52) U.S. Cl.
CPC .............. *F21K 9/90* (2013.01); *F21V 3/061* (2018.02); *F21V 3/062* (2018.02); *F21V 19/003* (2013.01); *F21Y 2103/10* (2016.08); *F21Y 2103/33* (2016.08); *F21Y 2103/37* (2016.08); *F21Y 2107/00* (2016.08); *F21Y 2115/10* (2016.08); *H01L 24/45* (2013.01); *H01L 25/0753* (2013.01); *H01L 2224/45144* (2013.01); *H01L 2224/45147* (2013.01); *H01L 2224/48091* (2013.01); *H01L 2224/48092* (2013.01); *H01L 2224/48137* (2013.01); *H01L 2924/00014* (2013.01); *H01L 2924/19107* (2013.01)

(56) References Cited

U.S. PATENT DOCUMENTS

| | | |
|---|---|---|
| 7,482,059 B2 | 1/2009 | Peng et al. |
| 8,025,816 B2 | 9/2011 | Murase et al. |
| 8,455,895 B2 | 6/2013 | Chai et al. |
| 8,933,619 B1 | 1/2015 | Ou |
| 9,016,900 B2 | 4/2015 | Takeuchi et al. |
| 9,360,188 B2 | 6/2016 | Kircher et al. |
| 9,488,767 B2 | 11/2016 | Nava et al. |
| 9,761,765 B2 | 9/2017 | Basin et al. |
| 9,982,854 B2 | 5/2018 | Ma et al. |
| 10,066,791 B2 | 9/2018 | zhang |
| 10,330,297 B2 | 6/2019 | Kwisthout |
| 10,436,391 B2 | 10/2019 | Hsiao et al. |
| 2004/0008525 A1 | 1/2004 | Shibata |
| 2007/0267976 A1 | 11/2007 | Bohler et al. |
| 2008/0137360 A1 | 6/2008 | Van Jijswick et al. |
| 2009/0184618 A1 | 7/2009 | Hakata et al. |
| 2009/0212698 A1 | 8/2009 | Bailey |
| 2010/0135009 A1 | 6/2010 | Duncan et al. |
| 2010/0265711 A1 | 10/2010 | Lee |
| 2011/0025205 A1 | 2/2011 | Van Rijswick et al. |
| 2011/0050073 A1 | 3/2011 | Huang |
| 2011/0210358 A1 | 9/2011 | Kim et al. |
| 2012/0119647 A1 | 5/2012 | Hsu |
| 2012/0162965 A1 | 6/2012 | Takeuchi et al. |
| 2012/0169251 A1 | 7/2012 | Lai et al. |
| 2012/0175667 A1 | 7/2012 | Golle et al. |
| 2012/0182757 A1 | 7/2012 | Liang et al. |
| 2012/0256238 A1 | 10/2012 | Ning et al. |
| 2012/0281411 A1 | 11/2012 | Kajiya et al. |
| 2012/0293721 A1 | 11/2012 | Ueyama |
| 2013/0003346 A1 | 1/2013 | Letoquin et al. |
| 2013/0009179 A1 | 1/2013 | Bhat et al. |
| 2013/0058080 A1 | 3/2013 | Ge et al. |
| 2013/0058580 A1 | 3/2013 | Wakazono |
| 2013/0099271 A1 | 4/2013 | Hakata et al. |
| 2013/0147348 A1 | 6/2013 | Motoya et al. |
| 2013/0215625 A1 | 8/2013 | Takeuchi et al. |
| 2013/0235592 A1 | 9/2013 | Takeuchi et al. |
| 2013/0265796 A1 | 10/2013 | Kwisthout |
| 2013/0293098 A1 | 11/2013 | Li et al. |
| 2014/0022788 A1 | 1/2014 | Dan et al. |
| 2014/0049164 A1 | 2/2014 | McGuire et al. |
| 2014/0103794 A1 | 4/2014 | Ueda et al. |
| 2014/0152177 A1 | 6/2014 | Matsyda et al. |
| 2014/0185269 A1 | 7/2014 | Li |
| 2014/0218892 A1 | 8/2014 | Edwards et al. |
| 2014/0268779 A1 | 9/2014 | Sorensen et al. |
| 2014/0369036 A1 | 12/2014 | Feng |
| 2015/0022114 A1 | 1/2015 | Kim |
| 2015/0069442 A1 | 3/2015 | Liu et al. |
| 2015/0070871 A1 | 3/2015 | Chen et al. |
| 2015/0085485 A1 | 3/2015 | Park |
| 2015/0255440 A1 | 9/2015 | Hsieh |
| 2016/0064628 A1 | 3/2016 | Fujii et al. |
| 2016/0116120 A1 | 4/2016 | Kwisthout |
| 2016/0238199 A1 | 8/2016 | Yeung et al. |
| 2016/0369952 A1 | 12/2016 | Weekamp |
| 2016/0377237 A1 | 12/2016 | Zhang |
| 2017/0012177 A1* | 1/2017 | Trottier .................... F21K 9/00 |
| 2017/0016582 A1 | 1/2017 | Yang et al. |
| 2017/0122499 A1 | 5/2017 | Lin et al. |
| 2017/0138542 A1 | 5/2017 | Gielen et al. |
| 2017/0167663 A1 | 6/2017 | Hsiao et al. |
| 2017/0167711 A1 | 6/2017 | Kadijk |
| 2017/0299125 A1 | 10/2017 | Takeuchi et al. |
| 2017/0299126 A1 | 10/2017 | Takeuchi et al. |
| 2019/0137047 A1 | 5/2019 | Hu |
| 2019/0186697 A1 | 6/2019 | Jiang et al. |
| 2019/0195434 A1 | 6/2019 | Jiang et al. |
| 2019/0219232 A1 | 7/2019 | Takeuchi et al. |
| 2019/0264875 A1 | 8/2019 | Jiang et al. |
| 2019/0271443 A1 | 9/2019 | Jiang et al. |
| 2019/0277484 A1 | 9/2019 | Kwisthout |
| 2019/0301683 A1 | 10/2019 | Jiang et al. |
| 2019/0368667 A1 | 12/2019 | On et al. |

FOREIGN PATENT DOCUMENTS

| | | |
|---|---|---|
| CN | 101826588 A | 9/2010 |
| CN | 102209625 A | 10/2011 |
| CN | 202209551 U | 5/2012 |
| CN | 202473919 U | 10/2012 |
| CN | 202719450 U | 2/2013 |
| CN | 101968181 B | 3/2013 |
| CN | 102958984 A | 3/2013 |
| CN | 102969320 A | 3/2013 |
| CN | 202834823 U | 3/2013 |
| CN | 103123949 A | 5/2013 |
| CN | 203131524 U | 8/2013 |
| CN | 203367275 U | 12/2013 |
| CN | 203367375 U | 12/2013 |
| CN | 103560128 A | 2/2014 |
| CN | 103682042 A | 3/2014 |
| CN | 203477967 U | 3/2014 |
| CN | 103890481 A | 6/2014 |
| CN | 203628311 U | 6/2014 |
| CN | 203628391 U | 6/2014 |

(56) References Cited

FOREIGN PATENT DOCUMENTS

| | | |
|---|---|---|
| CN | 203628400 U | 6/2014 |
| CN | 203656627 U | 6/2014 |
| CN | 203671312 U | 6/2014 |
| CN | 103939758 A | 7/2014 |
| CN | 103972364 A | 8/2014 |
| CN | 103994349 A | 8/2014 |
| CN | 203771136 U | 8/2014 |
| CN | 20388048 | 10/2014 |
| CN | 203857313 U | 10/2014 |
| CN | 203907265 U | 10/2014 |
| CN | 203910792 U | 10/2014 |
| CN | 203932049 U | 11/2014 |
| CN | 204062539 U | 12/2014 |
| CN | 104295945 A | 1/2015 |
| CN | 104319345 A | 1/2015 |
| CN | 204083941 U | 1/2015 |
| CN | 204088366 U | 1/2015 |
| CN | 204153513 U | 2/2015 |
| CN | 104456165 A | 3/2015 |
| CN | 204289439 U | 4/2015 |
| CN | 104600174 A | 5/2015 |
| CN | 104600181 A | 5/2015 |
| CN | 104716247 A | 6/2015 |
| CN | 204387765 U | 6/2015 |
| CN | 204459844 U | 7/2015 |
| CN | 104913217 A | 9/2015 |
| CN | 104979455 A | 10/2015 |
| CN | 105042354 A | 11/2015 |
| CN | 105090789 A | 11/2015 |
| CN | 105098032 A | 11/2015 |
| CN | 105140381 A | 12/2015 |
| CN | 105161608 A | 12/2015 |
| CN | 204986570 U | 1/2016 |
| CN | 105371243 A | 3/2016 |
| CN | 106468405 A | 3/2017 |
| CN | 106898681 A | 6/2017 |
| CN | 107123641 A | 9/2017 |
| CN | 107314258 A | 11/2017 |
| CN | 206973307 U | 2/2018 |
| CN | 105090782 B | 7/2018 |
| CN | 207849021 U | 9/2018 |
| CN | 209354987 U | 9/2019 |
| EP | 2535640 A1 | 12/2012 |
| EP | 2760057 A1 | 7/2014 |
| EP | 2567145 B1 | 4/2016 |
| GB | 2547085 A | 8/2017 |
| JP | 3075689 U | 2/2001 |
| JP | 2001126510 A | 5/2001 |
| JP | 2003037239 A | 2/2003 |
| JP | 2006202500 A | 8/2006 |
| JP | 2013225587 A | 10/2013 |
| WO | 2012053134 A1 | 4/2012 |
| WO | 2014012346 A1 | 1/2014 |
| WO | 2014167458 A1 | 10/2014 |
| WO | 2017037010 A1 | 3/2017 |

* cited by examiner

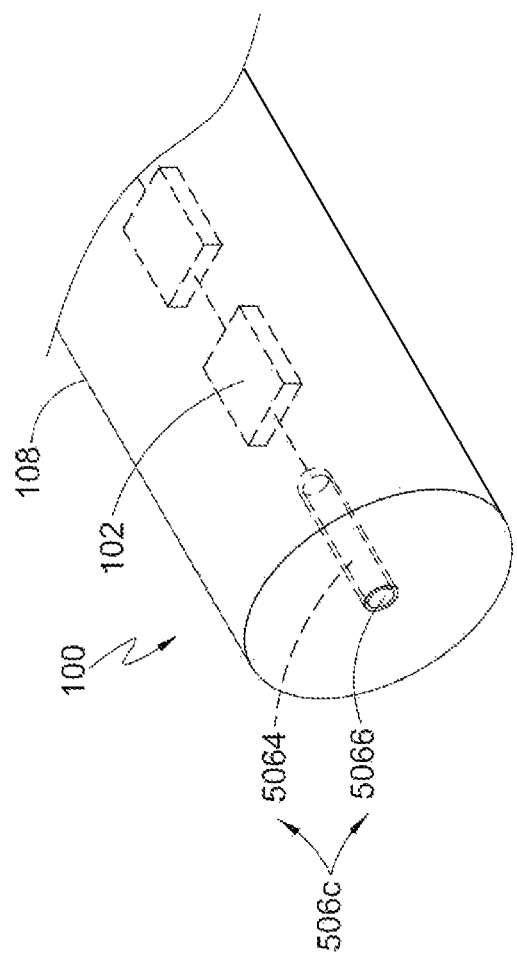
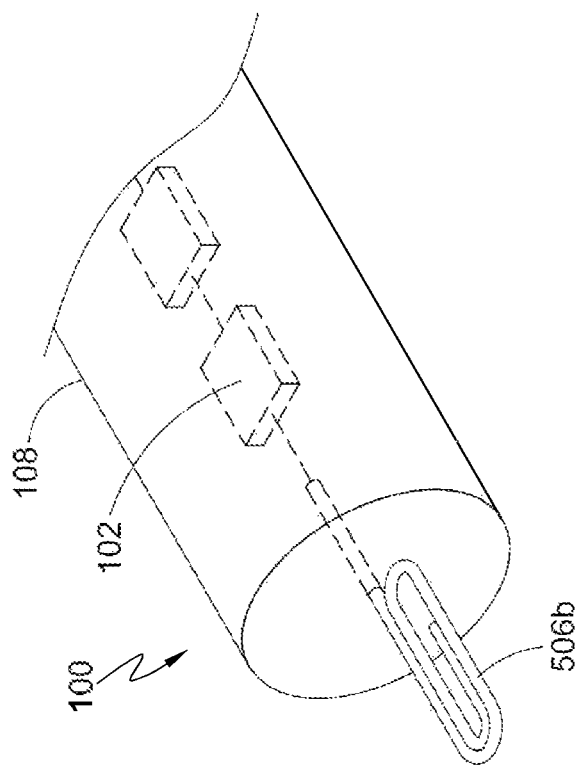

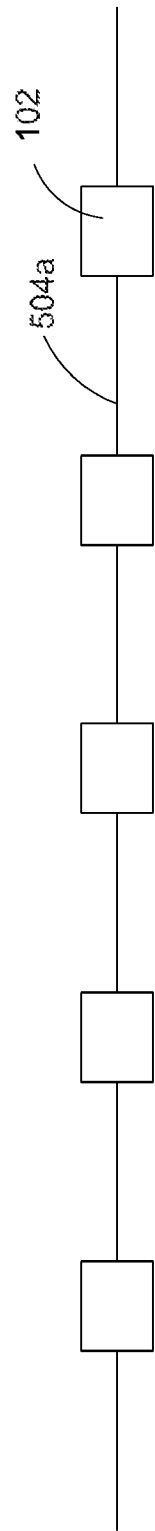
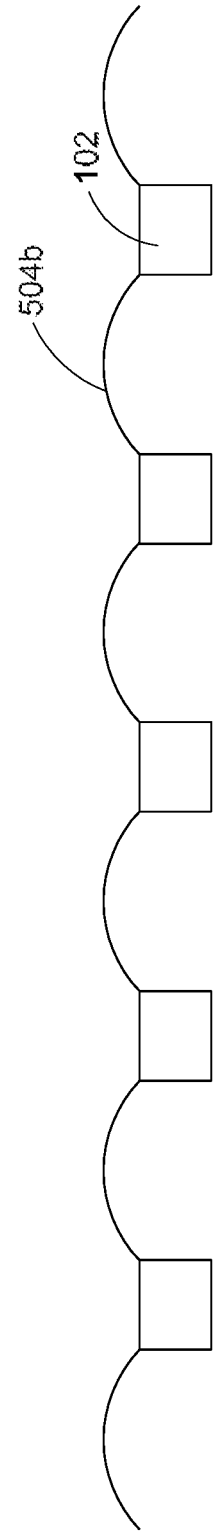
FIG. 7A
FIG. 7B

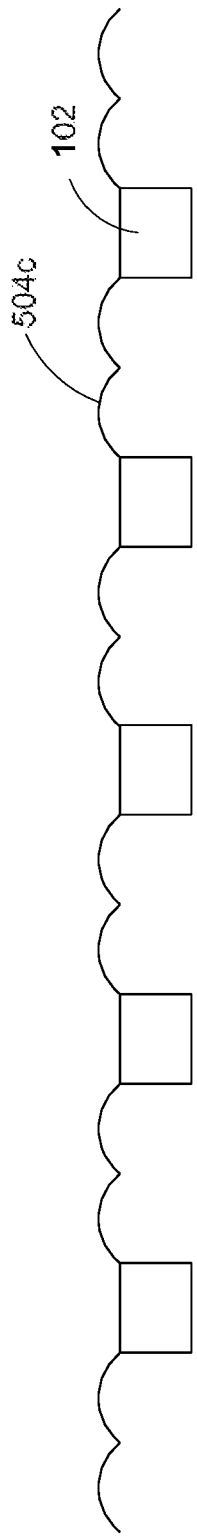
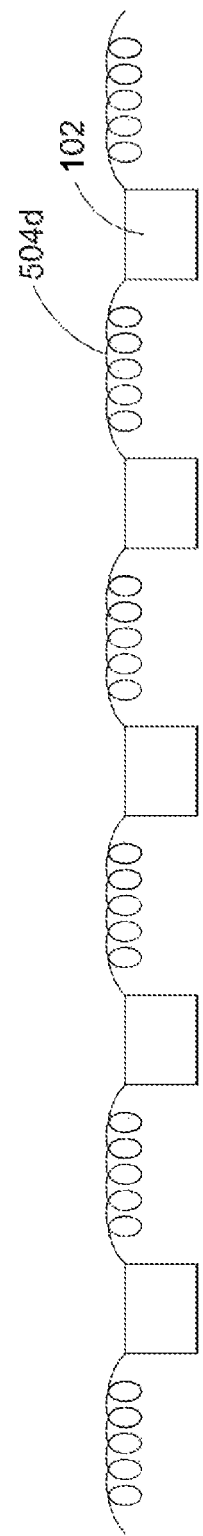

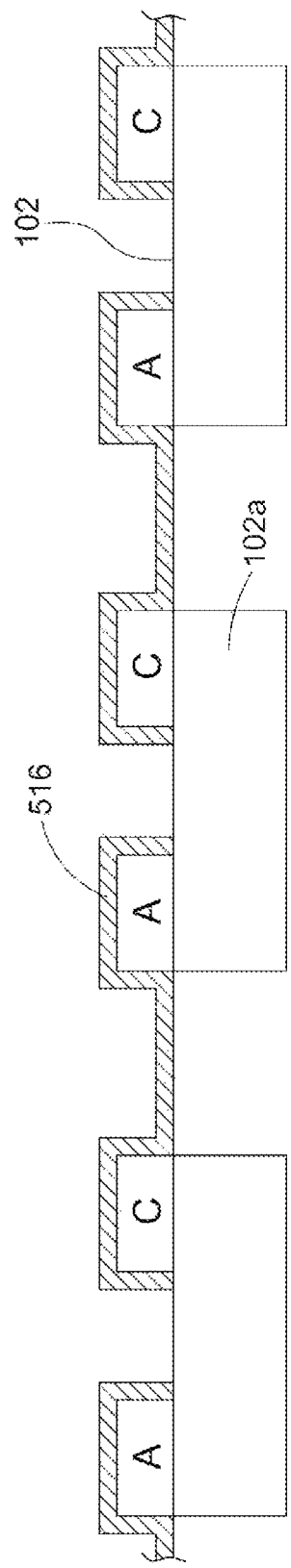
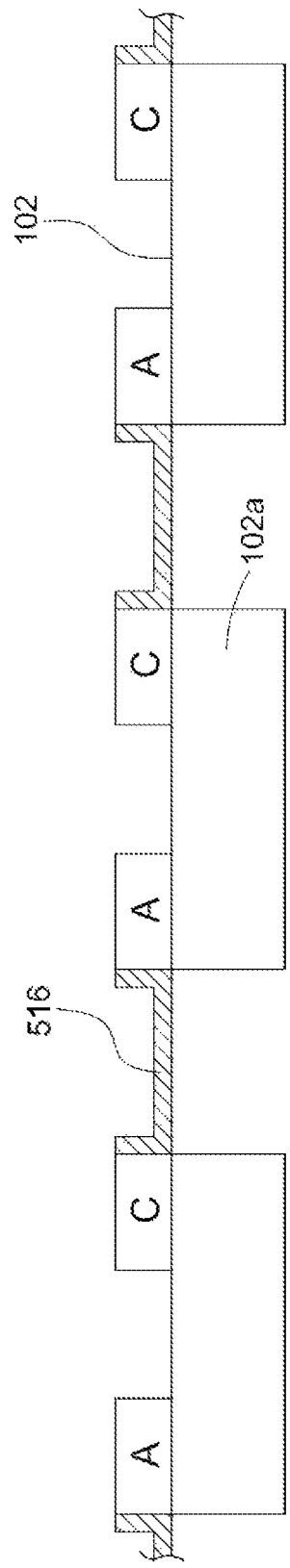
FIG.8A
FIG.8B

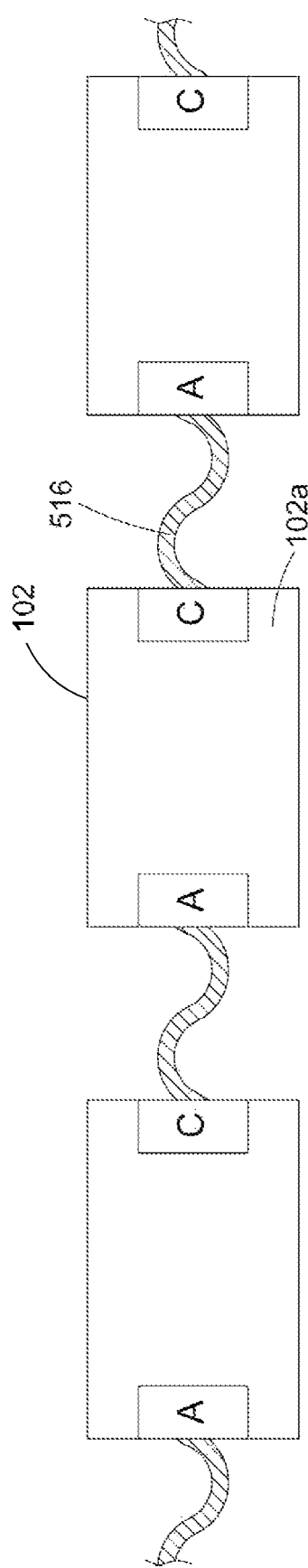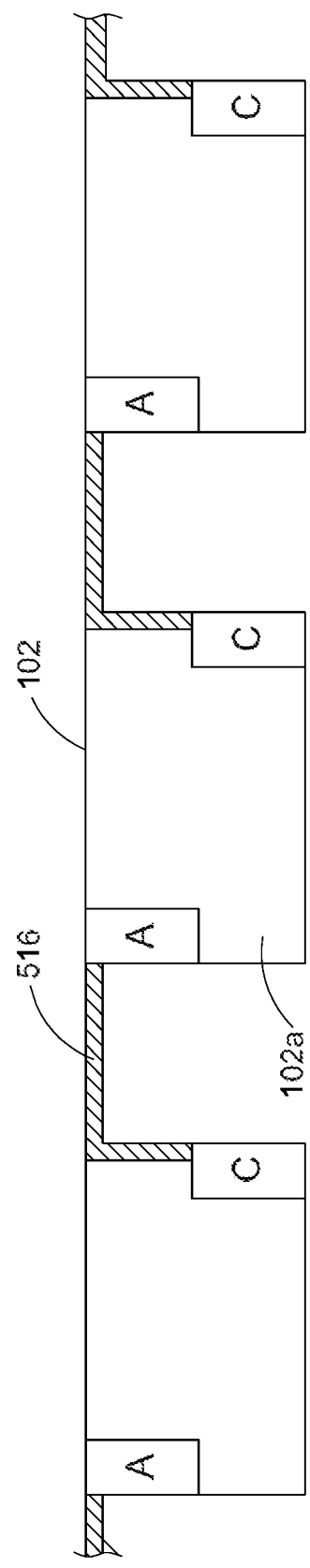

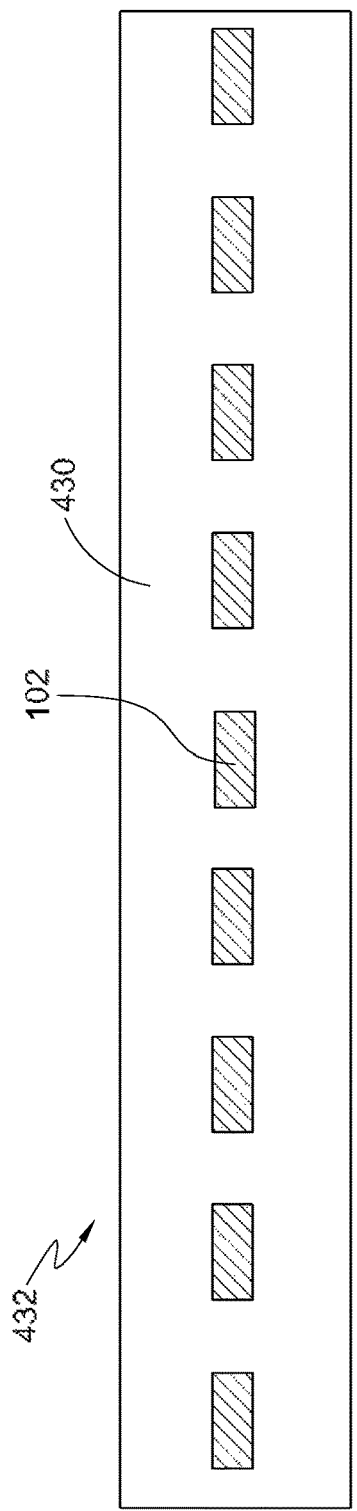
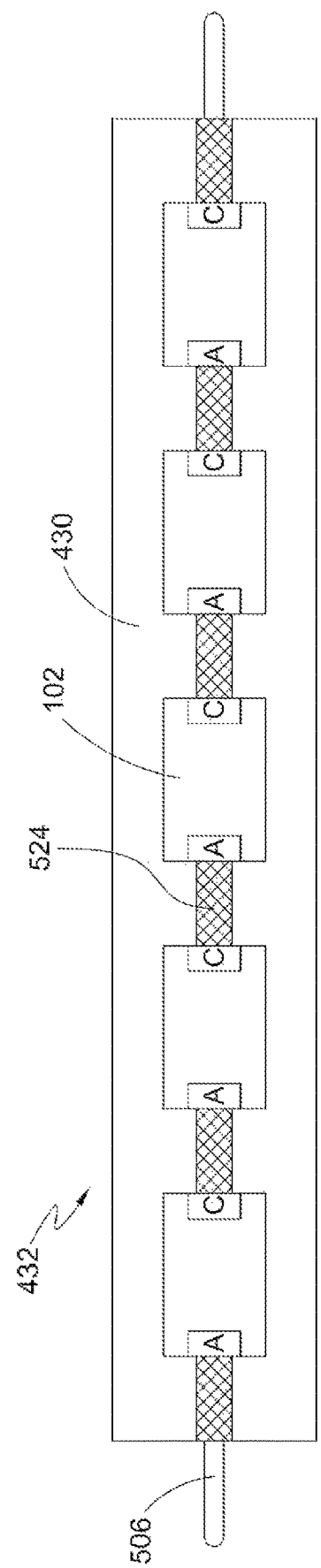
FIG.9A
FIG.9B

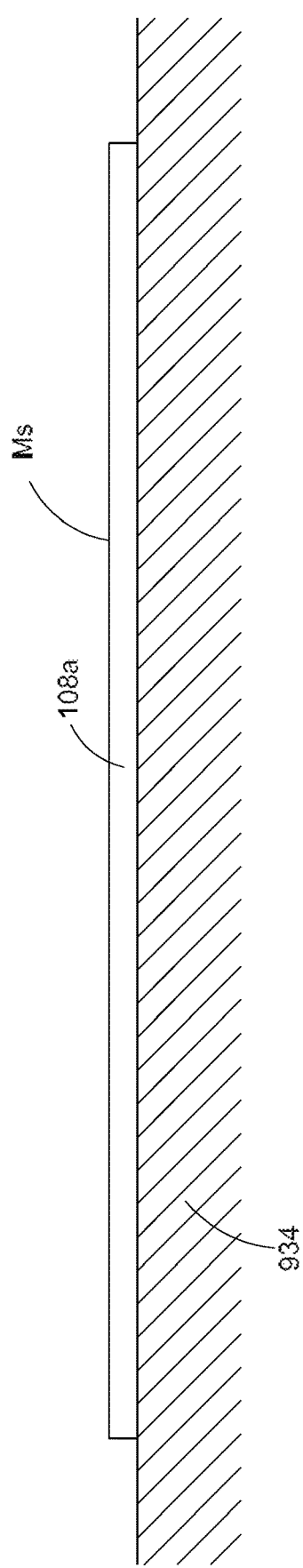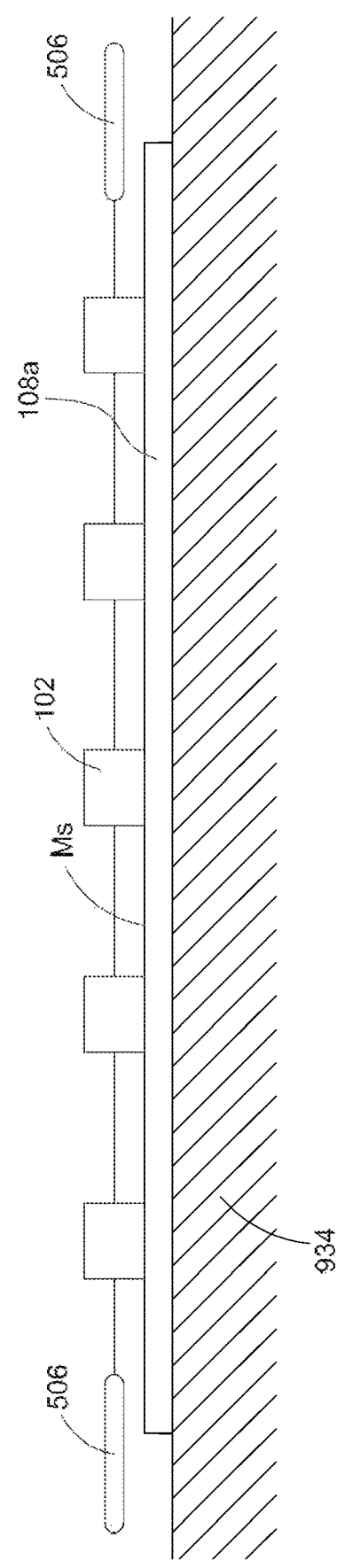

LED FILAMENT AND LED LIGHT BULB

RELATED APPLICATIONS

The present application claims priority to CN201510502630.3 filed Aug. 17, 2015, CN201510966906.3 filed Dec. 19, 2015, CN201610041667.5 filed Jan. 22, 2016, CN201610281600.9 filed Apr. 29, 2016, CN201610272153.0 filed Apr. 27, 2016, CN201610394610.3 filed Jun. 3, 2016, CN201610586388.7 filed Jul. 22, 2016, CN201610544049.2 filed Jul. 7, 2016, CN201610936171.4 filed Nov. 1, 2016, CN201611108722.4 filed Dec. 6, 2016, CN201710024877.8 filed Jan. 13, 2017, CN201710079423.0 filed Feb. 14, 2017, CN201710138009.2 filed Mar. 9, 2017, CN201710180574.5 filed Mar. 23, 2017, CN201710234618.8 filed Apr. 11, 2017 and CN201710316641.1 filed May 8, 2017, each of which is incorporated herein by reference in its entirety.

The present application is a continuation application of U.S. Ser. No. 15/590,295, which is a continuation-in-part application of U.S. Ser. No. 15/384,311 filed Dec. 19, 2016, which claims priority to CN201510502630.3 filed Aug. 17, 2015, CN201510966906.3 filed Dec. 19, 2015, CN201610041667.5 filed Jan. 22, 2016, CN201610281600.9 filed Apr. 29, 2016, CN201610272153.0 filed Apr. 27, 2016, CN201610394610.3 filed Jun. 3, 2016, CN201610586388.7 filed Jul. 22, 2016, CN201610544049.2 filed Jul. 7, 2016, CN201610936171.4 filed Nov. 1, 2016 and CN201611108722.4 filed Dec. 6, 2016, a continuation-in-part application of U.S. Ser. No. 15/366,535 filed Dec. 1, 2016, which claims priority to CN201510502630.3 filed Aug. 17, 2015, CN201510966906.3 filed Dec. 19, 2015, CN201610041667.5 filed Jan. 22, 2016, CN201610281600.9 filed Apr. 29, 2016, CN201610272153.0 filed Apr. 27, 2016, CN201610394610.3 filed Jun. 3, 2016, CN201610586388.7 filed Jul. 22, 2016, CN201610544049.2 filed Jul. 7, 2016 and CN201610936171.4 filed Nov. 1, 2016, a continuation-in-part application of U.S. Pat. No. 10,228,093 filed Aug. 16, 2016, which claims priority to CN201510502630.3 filed Aug. 17, 2015, CN201510966906.3 filed Dec. 19, 2015, CN201610041667.5 filed Jan. 22, 2016, CN201610272153.0 filed Apr. 27, 2016, CN201610281600.9 filed Apr. 29, 2016, CN201610394610.3 filed Jun. 3, 2016 and CN201610586388.7 filed Jul. 22, 2016, each of which is incorporated herein by reference in its entirety.

FIELD OF THE INVENTION

The present invention relates to LED luminaries. More particularly, this invention describes an LED filament and an LED light bulb.

BACKGROUND OF THE INVENTION

Incandescent light bulbs are a source of electric light that creates light by running electricity through a resistive filament, thereby heating the filament to a very high temperature, so that it glows and produces visible light. Incandescent bulbs are made in a wide range of sizes and voltages, from 1.5 volts to about 300 volts. The bulbs consist of a generally glass or plastic enclosure with a filament of tungsten wire inside the bulb through which an electrical current is passed. Incandescent lamps are designed as direct "plug-in" components that mate with a lamp holder via a threaded Edison base connector (sometimes referred to as an "Edison base" in the context of an incandescent light bulb), a bayonet-type base connector (i.e., bayonet base in the case of an incandescent light bulb), or other standard base connector to receive standard electrical power (e.g., 120 volts A.C., 60 Hz in the United States, or 230V A.C., 50 Hz in Europe, or 12 or 24 or other D.C. voltage). The base provides electrical connections to the filament. Usually a stem or glass mount anchors to the base, allowing the electrical contacts to run through the envelope without gas or air leaks.

Incandescent light bulbs are widely used in household and commercial lighting, for portable lighting, such as table lamps, car headlamps, flashlights, and for decorative and advertising lighting. However, incandescent light bulbs are generally inefficient in terms of energy use and are subject to frequent replacement due to their limited lifetime (about 1,000 hours). Approximately 90% of the energy input is emitted as heat. These lamps are gradually being replaced by other, more efficient types of electric light such as fluorescent lamps, high-intensity discharge lamps, light emitting diodes (LEDs), etc. For the same energy input, these technologies give more visible light and generate much less heat. Particularly, LEDs consume a fraction of the energy used to illuminate incandescent bulbs and have a much longer lifetime (e.g. 50,000 to 75,000 hours). Furthermore, LED light sources are a very clean "green" light source and also provide good color reproduction.

LED light bulbs are far more efficient than traditional incandescent lamps, most notably because they use only a small fraction of the electricity of an incandescent. As traditional incandescent bulbs continue to be phased out, LED has become the mainstream light sources used on a variety of indoor and outdoor lighting fixtures. However, traditional LED light bulbs are not without its disadvantages, for example, the complicated designs which incorporate the heavy aluminum heat sinks and an electronic circuit for power conversion. Consequently, the cost is high and the shape is somewhat strange compared with the elegant incandescent bulbs people are accustomed to.

An LED filament bulb is a light bulb that uses LEDs as its filaments. Accordingly, it is desirable to provide a novel LED filament light bulb with improved performance and aesthetics that may be used as a better replacement for a typical incandescent light bulb than traditional LED light bulbs.

OBJECTS AND SUMMARY OF THE INVENTION

It is an object of the present invention that light is emitted from one or more LED filaments uniformly and evenly in all directions, instead of beaming in a direction while leaving everywhere else dark the way that many traditional LED light bulbs do. Thus, the LED filament light bulb features a close resemblance with the traditional incandescent bulb. Desirably, the visually unpleasant aluminum die cast for heat dissipation in traditional LED light bulbs is no longer required in the LED filament light bulb. Thus, the LED filament light bulb is perfect for homes, hotels, restaurants, bars and places where classic style and appearance is critical. Desirably, all electronics of the LED filament light bulb is nestled inside the light bulb which is almost not visible. Desirably, light produced by the LED filament light bulb is similar to natural light. It does not have any infrared or ultraviolet radiation and it is uniform and soft on the eyes. After the regulations that banned the sale of the traditional light bulbs, many homeowners could not put in compact fluorescent bulbs or other bogus LED lights into most of these old fixtures and chandeliers. Desirably, the LED filament light bulb fits well into all the lighting fixtures that used the outdated incandescent light bulbs. Desirably, the LED filament light bulb makes it easy to reuse these old and attractive lighting fixtures. Desirably, the LED filament light bulb have remarkable energy efficiency. Desirably, the LED filament has a long service life. This extended lifespan is enhanced by a constant current source that ensures stability of parameters and prolongs the life of the light bulb. Hence, the cost of investing in these bulbs will provide cost savings for up to a few decades in some cases. Desirably, the LED filament light bulb can be placed in places where dimming of lights is necessary. The LED filament light bulb gives off a warm inviting golden soft glow when used in table lamps or as accent lights. The LED filament light bulb is perfect for creating a very pleasant atmosphere in sitting rooms or bedrooms.

Therefore, it is an object of the claimed invention to provide a significantly improved LED filament for using with an LED light bulb. In accordance with an embodiment with the present invention, the LED filament comprises an enclosure; a linear array of LED devices; and an electrical connector, wherein: the enclosure includes an optically transmissive binder; and the linear of LED devices is conformally wrapped around by the enclosure to be operable to emit light when energized through the electrical connector.

In accordance with an embodiment with the present invention, LED filament is capable of self-sustained plastic deformation for maintaining a suitable posture in an LED light bulb.

In accordance with an embodiment with the present invention, the LED filament maintains the suitable posture in the LED light bulb by physically attaching the electrical connector to a lead wire of the LED light bulb.

In accordance with an embodiment with the present invention, the enclosure includes a posture maintainer.

In accordance with an embodiment with the present invention, the posture maintainer includes a pre-determined concentration of particles harder than the optically transmissive binder in which the particles are embedded.

In accordance with an embodiment with the present invention, the posture maintainer includes a pre-determined concentration of phosphor particles.

In accordance with an embodiment with the present invention, the enclosure includes alternate coatings of the optically transmissive binder and the phosphor particles.

In accordance with an embodiment with the present invention, the posture maintainer includes a wire system embedded in the optically transmissive binder.

In accordance with an embodiment with the present invention, the posture maintainer includes an aperture system beneath a surface of the enclosure where tight turns are planned for the posture the LED filament is designed to maintain in the LED light bulb.

In accordance with an embodiment with the present invention, the enclosure is fabricated and tested independently of the linear array of LED devices; and the enclosure is adhesively bonded to the linear array of LED devices to form the LED filament in a unitary structure.

In accordance with an embodiment with the present invention, the enclosure has a texturized outer surface for improving light extraction.

In accordance with an embodiment with the present invention, the enclosure has a texturized inner surface for improving light extraction.

In accordance with an embodiment with the present invention, wherein the LED device has a texturized light emission surface for improving light extraction.

In accordance with an embodiment with the present invention, the LED die in the LED device has an elongated top view approximating a hypothetical rectangle having a longitudinal axis substantially parallel to a longitudinal axis of the linear array of LED devices.

In accordance with an embodiment with the present invention, the aspect ratio of the hypothetical rectangle is from 2:1 to 10:1.

In accordance with an embodiment with the present invention, the LED devices are interconnected with a bond wire; and a sinuosity of the bond wire is from 2 to 8.

In accordance with an embodiment with the present invention, the LED devices are interconnected with a glue wire; and the sinuosity of the glue wire is from 3 to 8.

In accordance with an embodiment with the present invention, the LED devices are interconnected with a flexible printed circuit film having a plurality of conductive tracks; and the ratio of a total area covered by the plurality of conductive tracks to an area of the flexible printed circuit film is from 0.1% to 20%.

In accordance with an embodiment with the present invention, the enclosure further includes a wavelength converter; the wavelength converter is formed by embedding a plurality of light conversion particles in the optically transmissive binder; and the plurality of light conversion particles is in a state of optimal conversion.

In accordance with an embodiment with the present invention, the enclosure further includes a wavelength converter; the wavelength converter is formed by embedding a plurality of light conversion particles in the optically transmissive binder; and the plurality of light conversion particles is in a state of thermal optimum for forming a plurality of heat transfer paths.

In accordance with an embodiment with the present invention, the plurality of heat transfer paths radiates like spokes of a wheel from the LED device like a hub of the wheel.

In accordance with an embodiment with the present invention, the ratio of a volume of the light conversion particles in the wavelength converter to a volume of the optically transmissive transparent binder in the wavelength converter is from 20:80 to 99:1.

In accordance with an embodiment with the present invention, the ratio of a weight of the light conversion particles in the wavelength converter to a weight of the optically transmissive binder in the wavelength converter is from 20% to 50%.

In accordance with an embodiment with the present invention, the LED filament, comprises an enclosure; a linear array of LED devices; and an electrical connector, wherein the entire enclosure is a monolithic structure made from a single piece of optically transmissive material.

In accordance with an embodiment with the present invention, the enclosure includes a first region and a second region having a different set of properties from that of the first region.

In accordance with an embodiment with the present invention, the regions of the enclosure are defined by a hypothetical plane perpendicular to a light illuminating direction of the linear array of LED devices.

In accordance with an embodiment with the present invention, the enclosure includes three regions defined by a pair of the hypothetical planes compartmentalizing the enclosure into an upper region, a lower region and a middle region sandwiched by the upper region and the lower region; the linear array of LED devices is disposed in the middle region; a cross section perpendicular to a longitudinal axis of the LED filament reveals the middle region and other regions of the enclosure; R1 is a ratio of an area of the middle region to an overall area of the cross section; and R1 is from 0.2 to 0.8.

In accordance with an embodiment with the present invention, the regions of the enclosure are defined by a hypothetical plane parallel to a light illuminating direction of the linear array of LED devices.

In accordance with an embodiment with the present invention, the enclosure includes three regions defined by a pair of the hypothetical planes compartmentalizing the enclosure into a right region, a left region and a middle region sandwiched by the right region and the left region; the linear array of LED devices is disposed in the middle region; a cross section perpendicular to a longitudinal axis of the LED filament reveals the middle region and other regions of the enclosure; R2 is a ratio of an area of the middle region to an overall area of the cross section; and R2 is from 0.2 to 0.8.

In accordance with an embodiment with the present invention, the regions of the enclosure are defined by a hypothetical cylindrical surface having a central axis of the LED filament as its central axis.

In accordance with an embodiment with the present invention, the enclosure includes three regions defined by a coaxial pair of the hypothetical cylindrical surfaces compartmentalizing the enclosure into a core region, an outer region and a middle region sandwiched by the core region and the outer region; and the linear array of LED devices is disposed in the core region.

In accordance with an embodiment with the present invention, the cross section perpendicular to a longitudinal axis of the LED filament reveals the core region and other regions of the enclosure; R3 is a ratio of an area of the core region to an overall area of the cross section; and R3 is from 0.1 to 0.8.

In accordance with an embodiment with the present invention, the cross section perpendicular to a longitudinal axis of the LED filament reveals the middle region and other regions of the enclosure; R4 is a ratio of an area of the middle region to an overall area of the cross section; and R4 is from 0.1 to 0.8.

In accordance with an embodiment with the present invention, the regions of the enclosure are defined by a hypothetical set of parallel planes intersecting the enclosure perpendicularly to a longitudinal axis of the enclosure.

In accordance with an embodiment with the present invention, the enclosure includes two alternating regions including a first region and a second region defined by the hypothetical set of parallel planes; the LED device is disposed in the first region; a means for electrically connecting the LED devices is disposed in the second region; an outer surface of the enclosure shows a combination of the first region and other regions; R5 is a ratio of a total area of the first region found on an outer surface of the enclosure to an overall area of the outer surface of the enclosure; and R5 is from 0.2 to 0.8.

In accordance with an embodiment with the present invention, the LED filament comprises an enclosure; a linear array of LED devices; and an electrical connector, wherein the enclosure is a modular structure assembled from modules.

In accordance with an embodiment with the present invention, the enclosure includes a first module and a second module having a different set of properties from that of the first module.

In accordance with an embodiment with the present invention, the modules of the enclosure are defined by a hypothetical plane perpendicular to a light illuminating direction of the linear array of LED devices.

In accordance with an embodiment with the present invention, the enclosure includes three modules defined by a pair of the hypothetical planes compartmentalizing the enclosure into an upper module, a lower module and a middle module sandwiched by the upper module and the lower module; the linear array of LED devices is disposed in the middle module; a cross section perpendicular to a longitudinal axis of the LED filament reveals the middle module and other modules of the enclosure; R6 is a ratio of an area of the middle module to an overall area of the cross section; and R6 is from 0.2 to 0.8.

In accordance with an embodiment with the present invention, the modules of the enclosure are defined by a hypothetical plane parallel to a light illuminating direction of the linear array of LED devices.

In accordance with an embodiment with the present invention, the enclosure includes three modules defined by a pair of the hypothetical planes compartmentalizing the enclosure into a right module, a left module and a middle module sandwiched by the right module and the left module; the linear array of LED devices is disposed in the middle module; a cross section perpendicular to a longitudinal axis of the LED filament reveals the middle module and other modules of the enclosure; R7 is a ratio of an area of the middle module to an overall area of the cross section; and R7 is from 0.2 to 0.8.

In accordance with an embodiment with the present invention, the modules of the enclosure are defined by a hypothetical cylindrical surface having a central axis of the LED filament as a central axis of the hypothetical cylindrical surface.

In accordance with an embodiment with the present invention, the enclosure includes three modules defined by a coaxial pair of the hypothetical cylindrical surfaces compartmentalizing the enclosure into a core module, an outer module and a middle module sandwiched by the core module and the outer module; and the linear array of LED devices is disposed in the core module.

In accordance with an embodiment with the present invention, the cross section perpendicular to a longitudinal axis of the LED filament reveals the core module and other modules of the enclosure; R8 is a ratio of an area of the core module to an overall area of the cross section; and R8 is from 0.1 to 0.8.

In accordance with an embodiment with the present invention, the cross section perpendicular to a longitudinal axis of the LED filament reveals the middle module and other modules of the enclosure; R9 is a ratio of an area of the middle module to an overall area of the cross section; and R9 is from 0.1 to 0.8.

In accordance with an embodiment with the present invention, the modules of the enclosure are defined by a hypothetical set of parallel planes intersecting the enclosure perpendicularly to a longitudinal axis of the enclosure.

In accordance with an embodiment with the present invention, the enclosure includes two alternating modules including a first module and a second module defined by the hypothetical set of parallel planes; the LED device is disposed in the first module; a means for electrically connecting the LED devices is disposed in the second module; an outer surface of the enclosure shows a combination of the first module and other modules; R10 is a ratio of a total area of the first module found on an outer surface of the enclosure to an overall area of the outer surface of the enclosure; and R10 is from 0.2 to 0.8.

In accordance with an embodiment with the present invention, the LED light bulb comprises a base; light transmissive envelope; a stem press; an LED filament; and a plurality of lead wires, wherein: at least part of the base is metal for receiving electrical power; the light transmissive envelope is mounted on the base; the stem press is mounted on the base within the light transmissive envelope for holding the lead wire and the LED filament in position; the lead wire electrically couples the base and the LED filament; the LED filament comprises an enclosure, a linear array of LED devices and an electrical connector; the enclosure includes an optically transmissive binder; the linear of LED devices is conformally wrapped around by the enclosure to be operable to emit light when energized through the electric connector; and a Cartesian coordinate system having an x-axis, a y-axis and a z-axis is oriented for the LED light bulb where: (1) an interface connecting the light transmissive envelope and base falls on the x-y plane; and (2) the z-axis, which is also a longitudinal axis of the LED light bulb, intersects the interface at point O.

In accordance with an embodiment with the present invention, the LED filament defines an arc extending substantially vertically in the light transmissive envelope; an endpoint of the arc reaches as high as point H1 on the z-axis; the distance on the y-axis between the endpoints of the LED filament is D; the length of the LED filament on the z-axis is A1; the posture of the LED filament in the LED light bulb is defined by all points in a set (0, Y, Z+H1), where Z goes up from 0 to A1 and then from A1 back to 0 as Y goes from −D/2 to 0 and then from 0 to D/2; M is a ratio of a length of the LED filament on the x-axis to a length of the light transmissive envelope on the x-axis; N is a ratio of a length of the LED filament on the y-axis to a length of the light transmissive envelope on the y-axis; P is a ratio of a length of the LED filament on the z-axis to a length of the light transmissive envelope on the z-axis; M is from 0 to 0.05; N is from 0.1 to 0.8; and P is from 0.1 to 0.8.

In accordance with an embodiment with the present invention, the LED light bulb further comprises a plurality of support wires, wherein: the stem press includes a basal portion for attaching the stem press to the base and an elongated post portion for elevating the LED filament to a desired position in the light transmissive envelope; the plurality of support wires radiates horizontally from the post portion to form a spoke-and-hub structure in the light transmissive envelope; the support wire is attached to the post portion at a first end and to the LED filament at a second end; the LED filament defines a sinuous curve along an arc meandering in the light transmissive envelope; the sinuous curve defined by the LED filament oscillates in a range from H2+A2 to H2−A2 on the z-axis, where H2 represents an average height of the LED filament along the z-axis in the LED light bulb and A2 represents an amplitude of the sinuous curve the LED filament defines; the plurality of support wires has a same length R; the posture of the LED filament in the LED light bulb is defined by all points in a set (X, Y, Z+H2), where −R=<X=<-R=<Y=<R; and −A2=<Z=<A2; M is a ratio of a length of the LED filament on the x-axis to a length of the light transmissive envelope on the x-axis; N is a ratio of a length of the LED filament on the y-axis to a length of the light transmissive envelope on the y-axis; P is a ratio of a length of the LED filament on the z-axis to a length of the light transmissive envelope on the z-axis; P is from 0.2 to 0.7; M is from 0.2 to 0.8; and N is from 0.2 to 0.8.

In accordance with an embodiment with the present invention, the LED light bulb further comprises an upper LED filament; a lower LED filament; an upper set of support wires; and a lower set of support wires, wherein: the stem press includes a basal portion for attaching the stem press to the base and an elongated post portion for elevating the LED filament to a desired position in the light transmissive envelope; the support wire radiates from the post portion to form a spoke-and-hub structure in the light transmissive envelope; the support wire is attached to the post portion at a first end and to the LED filament at a second end; the upper set of support wires is configured to hold the upper LED filament in position; the lower set of support wires is configured to hold the lower LED filament in position; the upper LED filament defines an upper sinuous curve oscillating in a range from H4+A4 to H4−A4 on the z-axis, where H4 represents an average height of the upper LED filament in the LED light bulb and A4 represents an amplitude of the upper sinuous curve the upper LED filament defines; the lower LED filament defines a lower sinuous curve oscillating in a range from H5+A5 to H5−A5 on the z-axis, where H5 represents an average height of the lower LED filament in the LED light bulb and A5 represents an amplitude of the lower sinuous curve the lower LED filament defines; H5 is less than H4; the plurality of support wires have a same length R; the posture of the upper LED filament in the LED light bulb is defined by all points in a set (X, Y, Z+H4), where −R=<X=<-R=<Y=<R; and −A4=<Z=<A4; the posture of the lower LED filament in the LED light bulb is defined by all points in a set (X, Y, Z+H5), where −R=<X=<-R=<Y=<R; and −A5=<Z=<A5; M is a ratio of an aggregate of lengths of the pair of LED filaments on the x-axis to a length of the light transmissive envelope on the x-axis; N is a ratio of an aggregate of lengths of the pair of LED filaments on the y-axis to a length of the light transmissive envelope on the y-axis; P is a ratio of an aggregate of lengths of the pair of the LED filaments on the z-axis to a length of the light transmissive envelope on the z-axis; P is from 0.4 to 1.7; M is from 0.4 to 1.6; and N is from 0.4 to 1.6.

In accordance with an embodiment with the present invention, the core region has greater thermal conductivity than the middle region, the outer region or both by doping in the core region a greater concentration of particles which are electrical insulators while having greater heat conductivity than phosphor particles; and the outer region has greater thermal radiation power than the middle region, the core region or both by doping in the outer region a greater concentration of particles having greater thermal radiation power than the optically transmissive binder and greater thermal conductivity than phosphor particles.

Various other objects, advantages and features of the present invention will become readily apparent from the ensuing detailed description, and the novel features will be particularly pointed out in the appended claims.

BRIEF DESCRIPTION OF FIGURES

The following detailed descriptions, given by way of example, and not intended to limit the present invention solely thereto, will be best be understood in conjunction with the accompanying figures:

FIGS. 5A to 5D are schematic views of the truncated LED filament in accordance with an exemplary embodiment of the present invention;

FIGS. 7A to 7D are schematic views of the linear array of LED devices in accordance with an exemplary embodiment of the present invention;

FIGS. 8A to 8F are schematic views of the linear array of LED devices in accordance with an exemplary embodiment of the present invention;

FIGS. 9A and 9B are schematic views of the LED filament in accordance with an exemplary embodiment of the present invention;

FIGS. 11A to 11C are schematic views of the LED filament in accordance with an exemplary embodiment of the present invention;

DETAILED DESCRIPTION OF THE EMBODIMENTS

Figure 1:
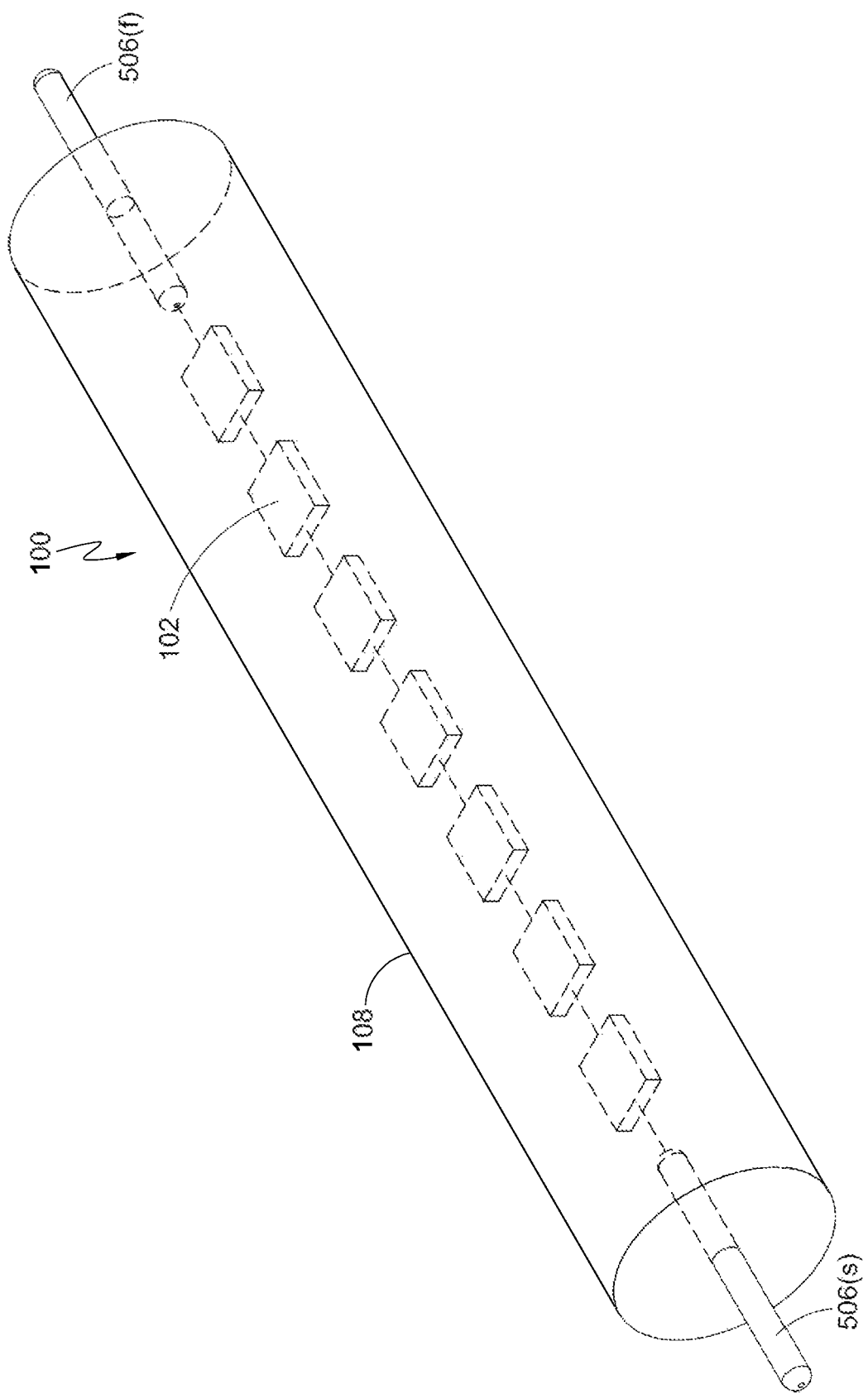
FIG. 1 is a see-through view of the LED filament in accordance with an exemplary embodiment of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element or layer is referred to as being "on," "connected to," "coupled to" or "responsive to" (and/or variants thereof) another element, it can be directly on or directly connected, coupled or responsive to the other element or intervening elements may be present. In contrast, when an element is referred to as being "directly on," "directly connected to," "directly coupled to" or "directly responsive to" (and/or variants thereof) another element, there are no intervening elements present. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for purposes of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

The present invention is described below with reference to block diagrams and/or flowchart illustrations of methods and/or apparatus (systems) according to embodiments of the invention. It is understood that a block of the block diagrams and/or flowchart illustrations, and combinations of blocks in the block diagrams and/or flowchart illustrations, can embody apparatus/systems (structure), means (function) and/or steps (methods) for implementing the functions/acts specified in the block diagrams and/or flowchart block or blocks. It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein. Documents incorporated by reference are meant to provide contexts for and should by no means be construed to contradict the disclosure in the present application. Particularly, the following terms are deemed interchangeable unless otherwise expressly distinguished: (1) light conversion coating and (2) enclosure. Unless otherwise expressly defined, a filament body includes a light conversion coating (i.e. an enclosure) and a plurality of LED devices.

Figure 2:
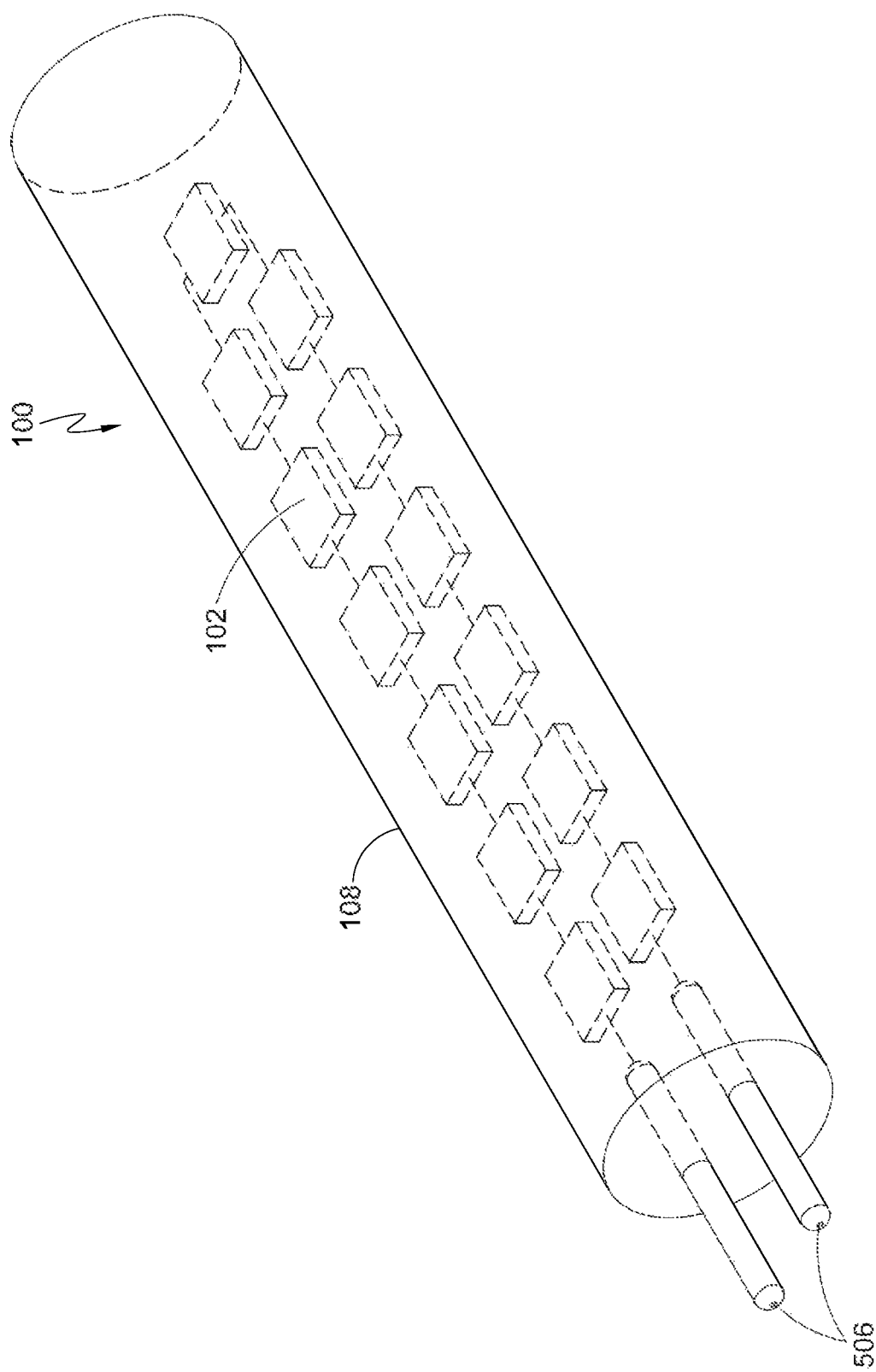
FIG. 2 is a see-through view of the LED filament in accordance with an exemplary embodiment of the present invention.
Figure 3:
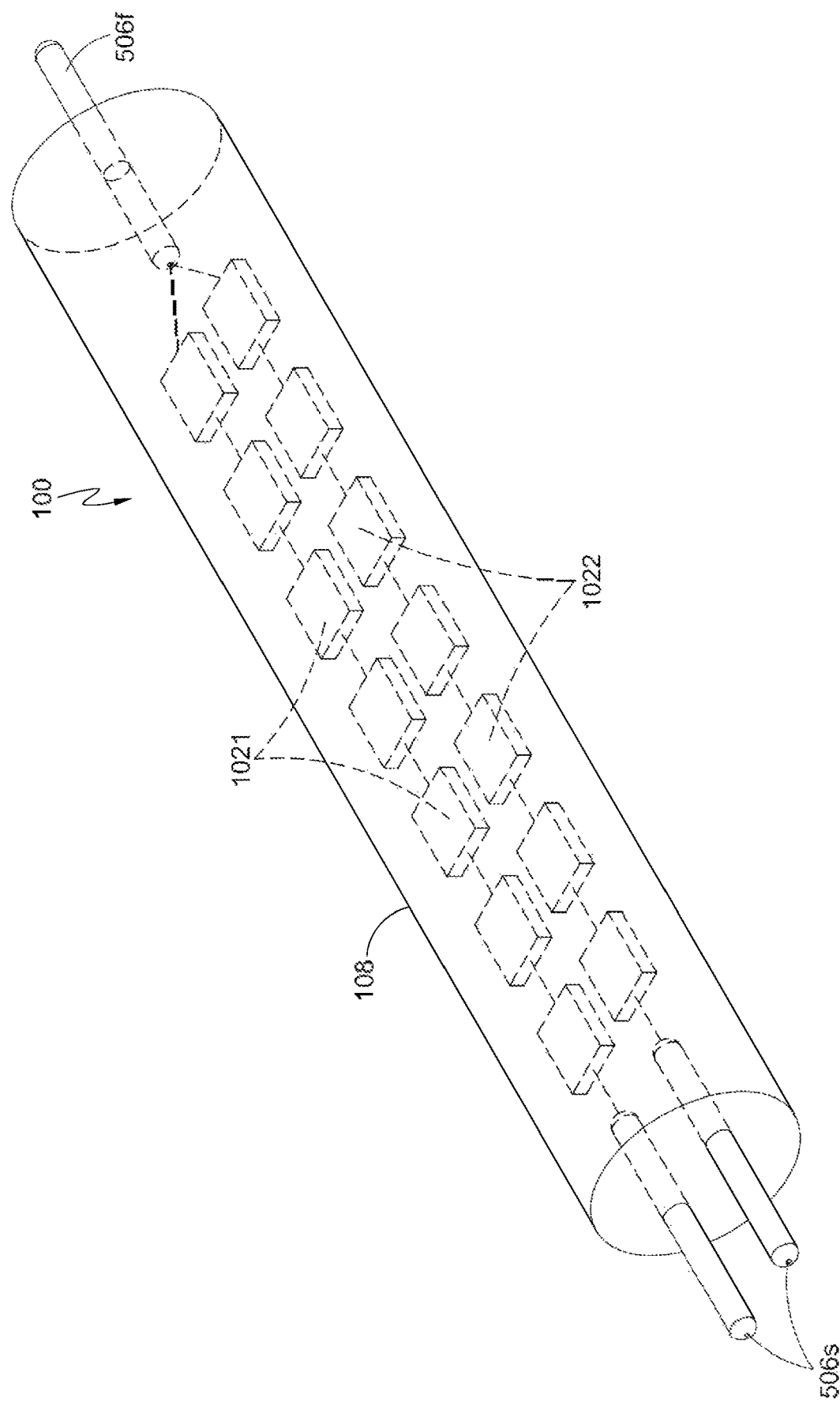
FIG. 3 is a see-through view of the LED filament in accordance with an exemplary embodiment of the present invention.

FIG. 1 is a see-through view of the LED filament 100 in accordance with an exemplary embodiment of the present invention. The LED filament 100 includes an enclosure 108, a linear array of LED devices 102 and an electrical connector 506. The linear array of LED devices 102 is disposed in the enclosure 108 to be operable to emit light when energized through the electrical connector 506. The enclosure 108 is an elongated structure preferably made of primarily flexible materials such as silicone. The enclosure 108 has either a fixed shape or, if made of a flexible material, a variable shape. The enclosure 108 is thus capable of maintaining either a straight posture or curvaceous posture (e.g. like a gift ribbon or helical spiral), with or without external support depending on applications, in an LED light bulb. The enclosure 108 has a cross section in any regular shapes (e.g. circle and polygon) or any irregular shapes (e.g. petal and star). The enclosure 108 includes a hollow space longitudinally extending inside the enclosure 108 for housing the linear array of LED devices 102 and the electrical connector 506. In an embodiment, exactly one LED filament—instead of an array of LED filaments assembled from a plurality of LED filaments in some embodiments—is used for generating omnidirectional light in an LED light bulb because the LED filament is configured to maintain a suitable a posture in the light bulb. The cost and reliability of an LED light bulb, when only one LED filament is used, will be improved because potential issues such as weak soldering points are reduced. In FIG. 1, the enclosure 108 is a straight cylinder having a circular cross section. The enclosure 108 is made of any optically transmissive materials through which optical radiation from the LED device 102 can pass without being totally absorbed or reflected, e.g. glass, plastic, resin and silicone. The linear array of LED devices 102 includes a plurality of LED devices 102 electrically coupled in parallel, in series or in a combination of both ways. In FIGS. 1 and 2, the linear array of LED devices 102 is formed by serially coupling a plurality of LED devices 102. In FIG. 1, the linear array of LED devices 102 defines a straight line in the enclosure 108 along the longitudinal axis of the enclosure 108. In FIG. 2, the linear array of LED devices 102 defines a U-shaped curve extending axially in the enclosure 108. In FIG. 3, the linear array of LED devise 1021, 1022 includes a first set of serially coupled LED devices 1021 and a second set of serially coupled LED devices 1022. The first set of LED devices 1021 is in parallel connection with the second set of LED devices 1022. The linear array of LED devices 1021, 1022 defines a straight pair of parallel lines extending axially in the enclosure 108. Because there is only one path in which the current can flow in a series circuit, opening or breaking the circuit at any point causes the entire array of LED devices 1021, 1022 in the series to stop operating. By contrast, the same voltage is applicable to all components connected in parallel. The total current is the sum of the currents through individual components. Other things equal including luminary output, lower current in an individual LED device 102 results in better thermal performance.

The linear array of LED devices 102 includes a liner array of single-die devices, multi-die devices or both to enable the LED filament to glow across a broad field of angle. Going back to FIG. 1, in some embodiments, the linear array of LED devices 102 includes a plurality of individual LED dies connected by conductive glue, solder or welds. LED devices 102 having different colors can be mixed together to create white light. In other embodiments, the linear array of LED devices 102 includes a plurality of multi-die LED devices coupled together by a wire frame structure or in some other manner. The linear array of LED devices 102 emits light in a substantially omnidirectional or 360-degree pattern from the LED filament 100. Light is given off around the enclosure 108 roughly perpendicular to the envelope of the enclosure 108 in all directions. While the desired light intensity distribution may comprise any light intensity distribution, in one embodiment, the desired light intensity distribution conforms to the JEL801 standards or ENERGY STAR® Partnership Agreement Requirements for Luminous Intensity Distribution, each of which is incorporated herein by reference. Under ENERGY STAR® standards, an omnidirectional lamp is one configured to emit "an even distribution of luminous intensity (candelas) within the 0° to 135° zone (vertically axially symmetrical). Luminous intensity at any angle within this zone shall not differ from the mean luminous intensity for the entire 0° to 135° zone by more than 20%. At least 5% of total flux (lumens) must be emitted in the 135° to 180° zone. Distribution shall be vertically symmetrical as measures in three vertical planes at 0°, 45° and 90°." The Japanese standard JEL 801 stipulates that the luminary flux within 120 degrees from the beaming axis must be equal to or greater than 70% of the total flux of the light bulb.

Staying on FIG. 1, the linear array of LED devices 102 is made to be enclosed by the enclosure 108 in a variety of ways. In some embodiments, the enclosure 108 is formed directly on the linear array of LED devices 102 by dispensing a binder material such as liquid polymer coating containing various particles on the LED device 102. Simple as this may seem, the coating formed this way could be unduly thick or undesirably nonuniform. In other embodiments, the enclosure 108 is fabricated and tested independently of the linear array of LED devices 102. Subsequently, the enclosure 108 is adhesively bonded to the linear array of LED devices 102. Bonding may be direct via a single adhesive layer or via one or more intermediate adhesive layers to form the LED filament 100 in a unitary structure comprising the linear array of LED devices 102 and the enclosure 108. In an embodiment, the enclosure 108 is combined with the LED device 102 at wafer level. Alternatively, the enclosure 108 is mounted onto an individual LED dice. The cost for making the LED filament 100 decreases when we form the enclosure 108 separately because defective enclosures 102 can be identified and discarded before packaging. Optionally, the enclosure 108 is sized to fit the lighting surface of the LED device 102.

Figure 4:
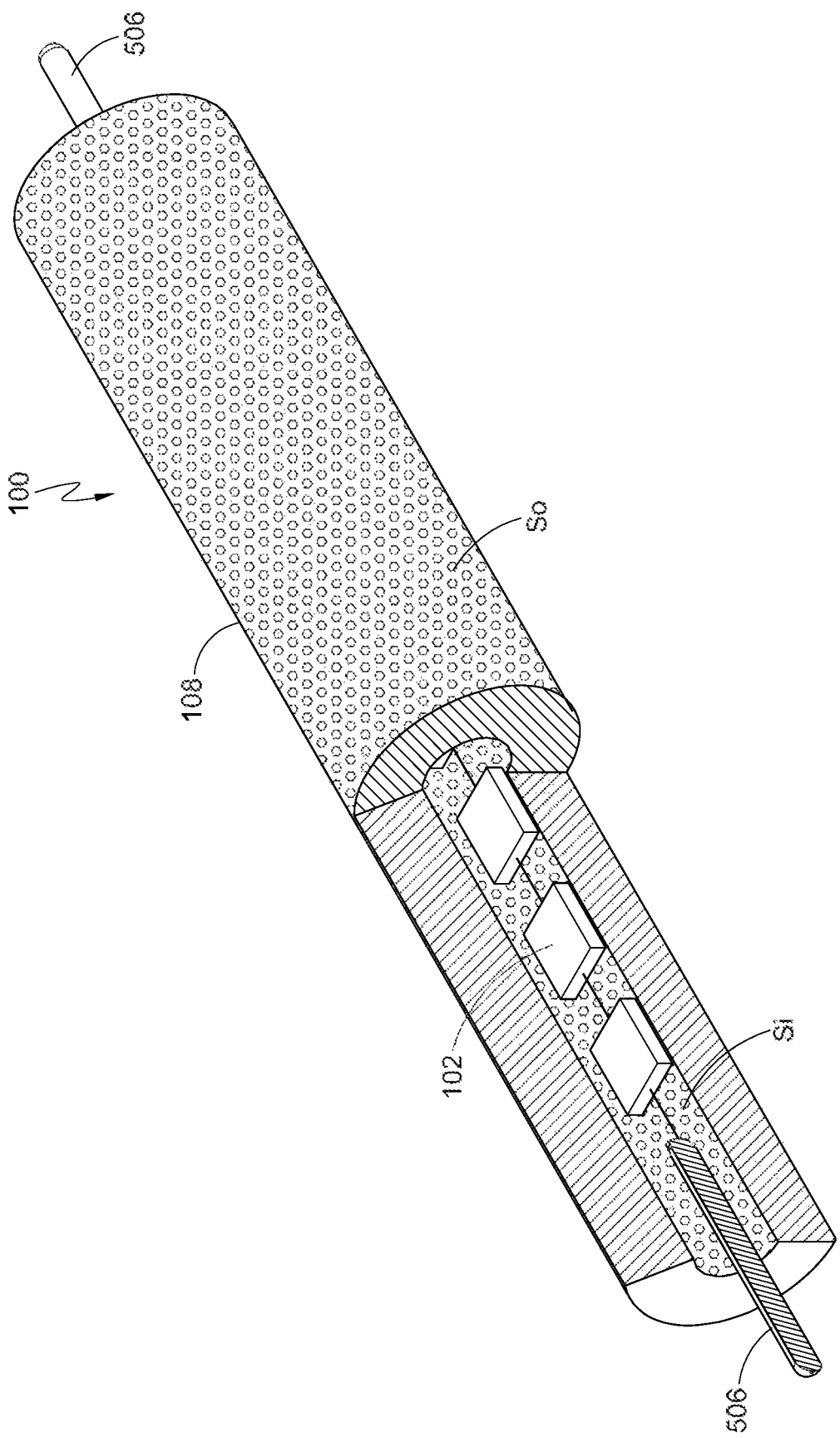
FIG. 4 is a cut-open view of the LED filament in accordance with an exemplary embodiment of the present invention.

FIG. 4 is a cut-open view of the LED filament in accordance of an exemplary embodiment of the present invention. In FIG. 4, a portion of the LED filament 100 is axially sliced and disemboweled to show the inner surface Si of the enclosure 108. In the embodiment, the enclosure 108 includes an outer surface So and an inner surface Si. The outer surface So interfaces the air and the enclosure 108. When the linear array of LED devices 102 is conformally wrapped around by the enclosure 108, the inner surface Si interfaces the enclosure 108 and the linear array of LED devices 102. When the linear array of LED devices 102 is spaced apart from the enclosure 108, the inner surface Si interfaces the enclosure 108 and the filler in the space between the linear array of LED devices 102 and the enclosure 108 such as the air. In an embodiment, the enclosure 108 includes a texturized or patterned surface for improving light extraction. In some embodiments, the enclosure 108 includes an outer surface So texturized to interface the air and the enclosure 108. In other embodiments, the enclosure 108 includes an inner surface Si texturized to interface the enclosure 108 and the adjacent medium such as the LED device 102 or the air.

Figure 5B:
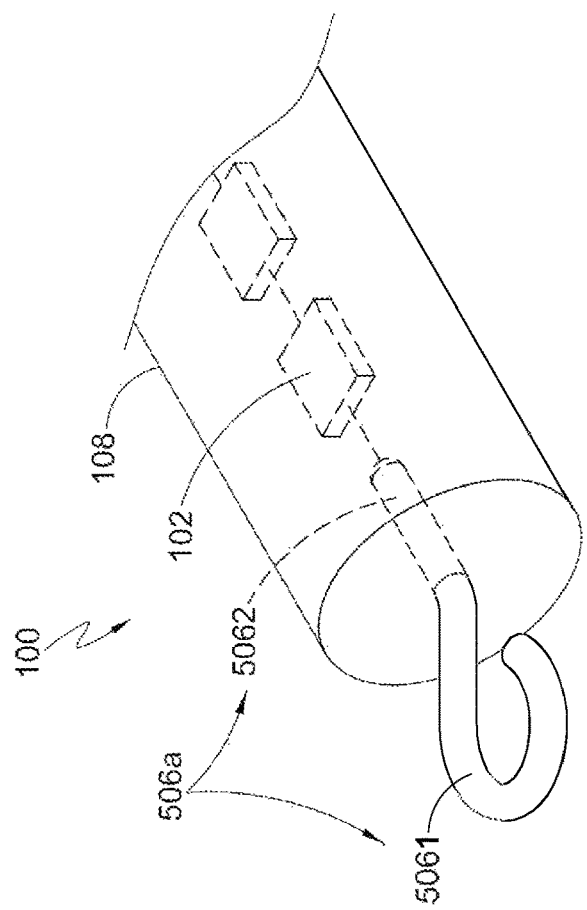
Figure 5A:
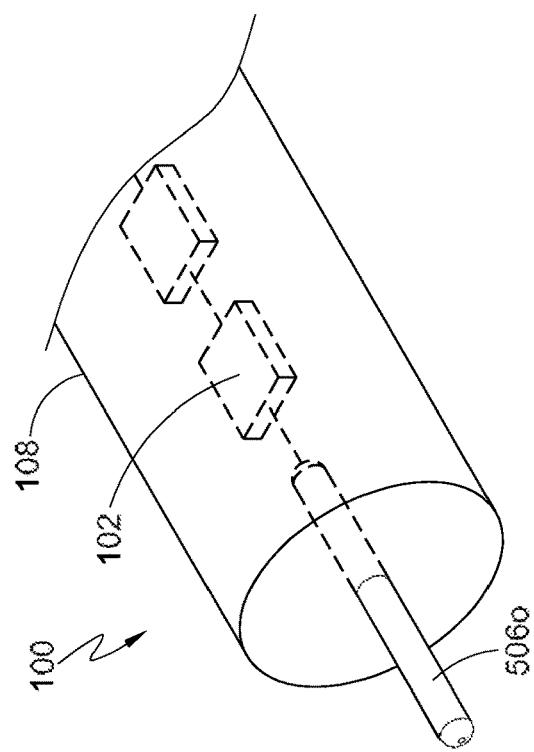

Going back to FIG. 1, the electrical connector 506, which is electrically connected to the linear array of LED devices 102, is configured to receive electrical power for energizing the linear array of LED devices 102. The number, shape and position of the electrical connector 506 depends on intended purposes of an application. FIGS. 5A to 5D show a truncated LED filament 100 to highlight the electrical connector 106. In FIG. 5A, the electrical connector 506o includes a metallic pin electrically connected to the linear array of LED devices 102. A portion of the pin is rooted in the enclosure 108 in electrical connection with the linear array of LED devices 102. The other portion of the pin sticks out from the enclosure 108 for receiving electrical power. Alternatively, in FIG. 5B, the electrical connector 506a includes a metallic hook. The shank 5062 of the hook is rooted in the enclosure 108 in electrical connection with the linear array of LED devices 102. The throat 5061 of the hook sticks out from the enclosure 108 for receiving electrical power. Alternatively, in FIG. 5C, the electrical connector 506b includes a metallic fastener such as binder or clip for physically and electrically attaching to the power source. Alternatively, in FIG. 5D, the electrical connector 506c includes a metallic receptacle. The well 5064 of the receptacle is embedded in the enclosure 108 in electrical connection with the linear array of LED devices 102. The opening 5066 of the receptacle is pluggable by a male element of the power source for receiving electrical power. In some embodiments, the electrical connector 506 includes an aperture as a female element for receiving a male element of the power source. Related features are described in FIGS. 5A to 5J in U.S. Ser. No. 15/499,143 filed Apr. 27, 2017, which is incorporated herein by reference in its entirety.

The number of electrical connectors and their positions on the LED filament depend on applications. In FIG. 1, the LED filament 100 includes exactly two electrical connectors 106. A first electrical connector 506, which is attached to a first end of the enclosure 108, is positive. A second electrical connector 506, which is attached to a second end of the enclosure 108, is negative. In FIG. 2, the enclosure 108 includes exactly two electrical connectors 106. A first electrical connector 506 is positive and a second electrical connector 506 is negative. However, both electrical connectors 106 are attached to a same end of the enclosure 108. In FIG. 3, the enclosure 108 includes exactly three electrical connectors 506f, 506s. A first electrical connector 506f, which is attached to a first end of the enclosure 108, is the common ground. A second electrical connector 506s, which is attached to a second end of the enclosure 108, is positive. A third electrical connector 506s, which is also attached to the second end of the enclosure 108, is also positive. In some embodiments, the LED filament 100 is configured to maintain a desired posture in the LED light bulb by and only by physically attaching the electrical connector 506 of the LED filament 100 to the lead wire of the LED light bulb. The LED filament 100 is like an arch bridge and the lead wire abutment. The LED filament 100 maintains its posture in the LED light bulb by pressing its compression forces against the lead wire.

Figure 6B:
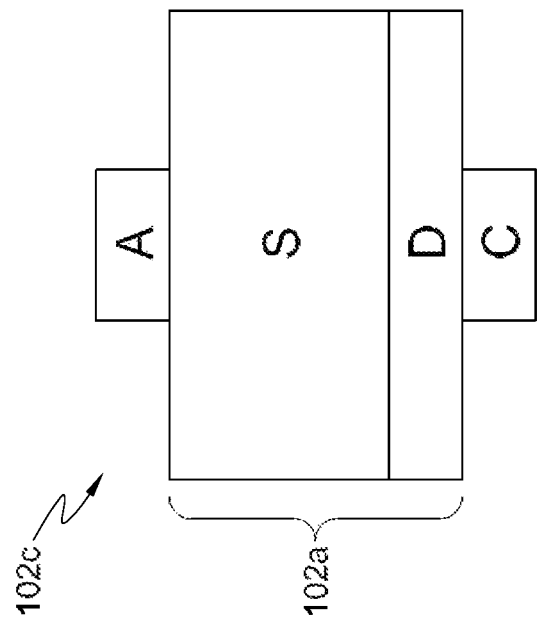
FIGS. 6A to 6H are schematic views of the LED device in accordance with an exemplary embodiment of the present invention.
Figure 6A:
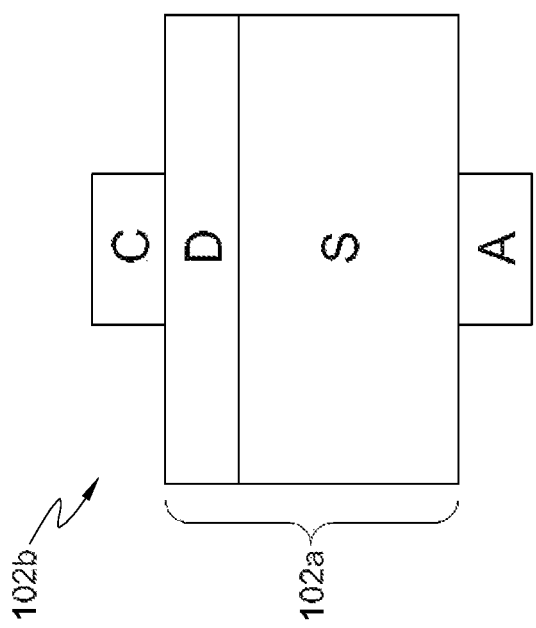
Figure 6D:
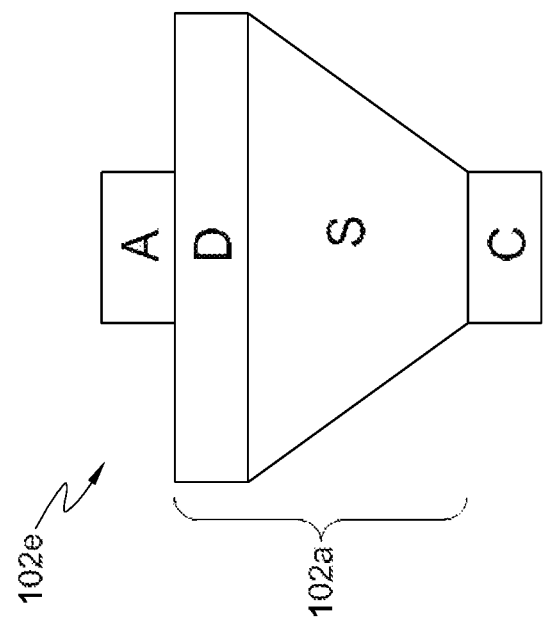
Figure 6C:
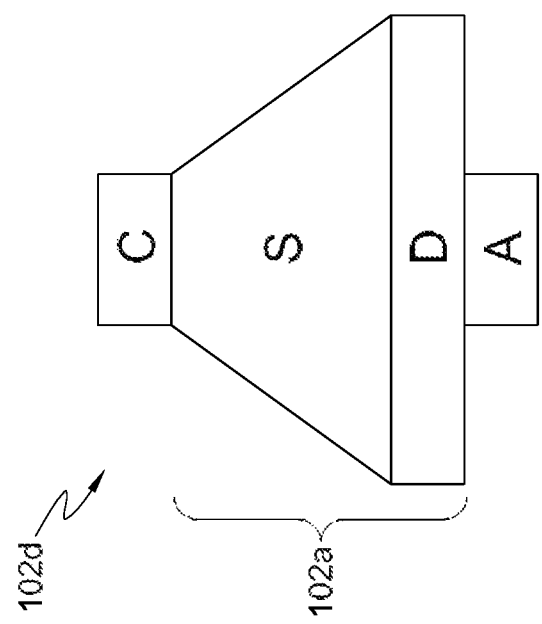
Figure 6E:
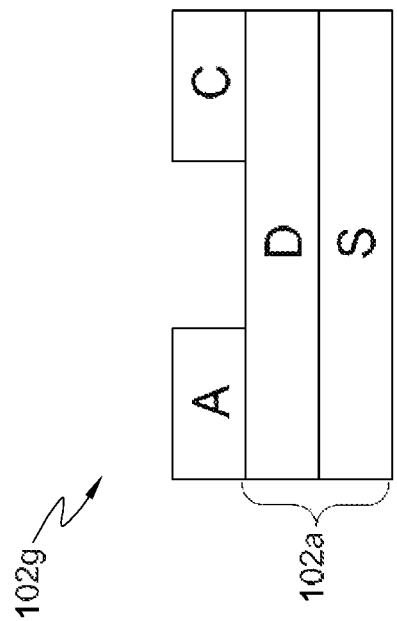
Figure 6F:
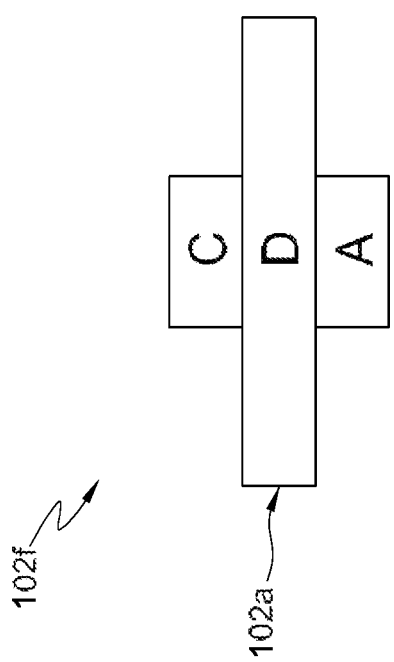
Figure 6H:
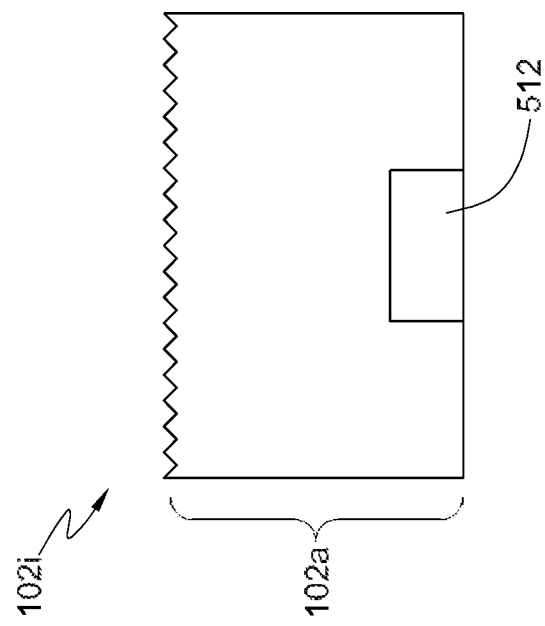
Figure 6G:
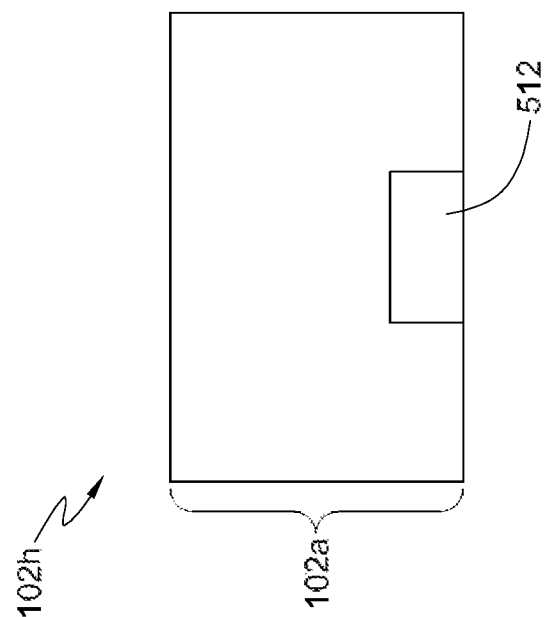

FIGS. 6A to 6E are diagrams of the LED device 102 configured to glow in the LED filament 100 in, for example, FIG. 1. The LED device 102 includes an LED die 102a that comprises a diode layer D and a substrate S. The diode layer D is configured to emit light upon energization, by applying a voltage between an anode contact A and a cathode contact C through the electrical connector 506 in FIG. 1. The diode layer D comprises organic or inorganic materials. In inorganic devices, the substrate S is made of silicon carbide, sapphire or any other single element or compound semiconductor material. The diode layer D comprises silicon carbide, gallium nitride, gallium arsenide, zinc oxide or any other single element or compound semiconductor material, which may be the same as or different from the substrate S. The thickness of the substrate S is between about 100 μm and about 250 μm. Thinner and thicker substrates may be used or the substrate may not be used at all. The cathode C and anode A contacts are formed of metal or other conductors, and may be at least partially transparent, reflective or both. In FIG. 6A, light emission takes place directly from the diode layer D. Alternatively, in FIG. 6B, light emission takes place from diode layer D through the substrate S. In FIGS. 6C and 6D, the substrate S is shaped to enhance emission from sidewalls of the substrate S to provide other desirable effects. In FIG. 6E, the substrate itself may be thinned considerably or eliminated entirely, so that only a diode layer D is present. In FIGS. 6A to 6E, the anode A and the cathode C are provided on opposite sides of the LED die 102a. In FIG. 6F, however, the anode A and the cathode C are provided on the same side of the LED die 102a. In each of the above embodiments, the anode A and cathode C contacts may be of various configurations. Multiple contacts of a given type also may be provided. The linear array of LED devices 102 are electrically connected by electrically connecting the anode and cathode contacts of each of the LED devices 102 in proper sequence. In some embodiments, the anode and cathode contacts are totally absent from the LED device 102, which includes a p-junction and an n-junction. The linear array of LED devices 102 are electrically connected by electrically connecting the p-junction and the n-junction of each of the LED device 102 in proper sequence. FIG. 6G is a generalization of FIGS. 6A to 6F. The LED device 102 comprises an LED die 102a that includes a diode layer D of FIGS. 6A to 6F and may also include a substrate S of FIGS. 6A to 6D. The LED device 102 is configured to emit light upon energization through one or more electrical contacts 1044, which may include the anode A and the cathode C of FIGS. 6A to 6F. The LED device 102 can emit light of different colors and can also emit radiation outside the visible spectrum such as infrared or ultraviolet. The color of the emitted light is determined by the material properties of the semiconductor used in the LED die 102a. The LED die 102a can be made from many different materials, e.g. gallium nitride (GaN). Referring to FIG. 6H, in an embodiment, the LED die 102a includes a texturized surface. Roughening the surface of the LED die 102a increases light extraction of the nitride-based LED device 102. Texturization is obtainable by using plasma etching directly on the top epilayer. However, the etching process destroys a large portion of the junction, reducing the amount of area in which the light is supposed to be generated. To avoid damaging the thin p-GaN layer, an indiumtin-oxide layer (ITO) can be used as the roughened layer. After completing the traditional planar GaN LED device 102, the surface of the LED die 102a is texturized using natural lithography, in which the randomly deposited polystyrene spheres (PSs) were distributed as a natural mask for dry etching. After the surface-texturing process, the output power of the GaN LED device 102 is significantly increased as compared to that of the conventional LED devices.

Going back to FIG. 6G, most of the electricity in the LED device 102 becomes heat rather than light (about 70% heat and 30% light). Thus, it is necessary to limit the junction temperature to a value that guarantees a desired lifetime. In some embodiments, the LED device 102 comprises a high-power LED die 102a capable of being loaded at a high voltage but at a lower current. Other things equal, the LED device 102 maintains an acceptable luminary output without comprising thermal performance.

Staying on FIG. 6G, in some embodiments, the linear array of LED devices 102 includes a plurality of LED devices 102 in which an individual LED die 102a has an elongated top view approximating a hypothetical rectangle having a longitudinal axis substantially parallel to the longitudinal axis of the linear array of LED devices 102. Other things equal, the greater the aspect ratio of the hypothetical rectangle, the less likely light gets blocked by opaque components in an LED filament 100 such as the electrical contact 512 and metallic wirings for connecting the electrical contact 512. Preferably, the aspect ratio is from 2:1 to 10:1. Examples are 28×14 and 20×10.

The LED filament is configured to emit white light in a variety of ways. Although illustrated as having exactly one LED die 102a in FIGS. 6A to 6H, the LED device 102 may be provided to have a plurality of LED dies 102a as well, each of which may be configured to emit the same or different colors of light, mounted on a common substrate S. The multi-die device may be grouped on the substrate S in clusters or other arrangements such that the linear array of LED devices 102 outputs a desired pattern of light. In some embodiments, the multi-die LED devices is configured to provide white light based on the combination of the colors of light emitted by each of its component LED dies. For example, a multi-die LED device is configured to emit light having a spectral distribution including at least four different color peaks (i.e., having local peak wavelengths in wavelength ranges corresponding to at least four different colors of light) to provide the white light. Alternatively, to produce white light, a plurality of LED devices emitting light of different colors may be used. The light emitted by the plurality of LED device is combined to produce white light of a desired intensity, color or both. For example, when red-, green- and blue-emitting LED devices are energized simultaneously, the resulting combined light appears white, or nearly white, depending on the relative intensities of the component red, green and blue sources. Alternatively, the light from a single-color LED device may be converted into white light by surrounding the LED device with a wavelength conversion material, such as phosphor particles. The term "phosphor" may be used herein to refer to any materials that absorb light at one wavelength and re-emit light at a different wavelength, regardless of the delay between absorption and re-emission and regardless of the wavelengths involved. Accordingly, the term "phosphor" is used herein to refer to materials that are sometimes called fluorescent or phosphorescent. In general, phosphors absorb light having shorter wavelengths and re-emit light having longer wavelengths. As such, some or all of the light emitted by the LED device at a first wavelength may be absorbed by the phosphor particles, which may responsively emit light at a second wavelength. For example, a single blue emitting LED device may be surrounded with a yellow phosphor, such as cerium-doped yttrium aluminum garnet (YAG). The resulting light, which is a combination of blue light and yellow light, may appear white to an observer. In an embodiment, the LED die emits blue light. The white light many applications require may be achieved by converting a portion of the blue light into yellow light. When emitted, the combination of blue and yellow light appears white.

Going back to FIG. 1, the linear array of LED devices 102 is electrically connected to emit light upon energization by applying a voltage through the electrical connector 506. Electrical connection between the LED devices 102 and the electrical connector 506 is made in a variety of ways depending on the advantages an LED filament 100 is expected to pursue. Examples include wire bonding, conductive glue, flexible printed circuit (FPC) film and any combination of the above. FIGS. 7A to 7D are side views of the linear array of LED devices 102 in the LED filament 100 in FIG. 1. In FIG. 7A, interconnections between the LED devices 102 are made by wire bonding. Wire bonding is a method known in the art for making interconnections between electronic components. The bonding wire 1044 is made of copper, gold or any suitable alloy. In some embodiments, the bonding wire 1044 includes a spring between the LED devices 102 it connects. When the linear array of LED devices 102 is stretched or compressed in the LED filament, the bonding wire 504a, when functioning like a spring, absorbs the mechanical energy that could otherwise open the circuit or damage the structure of the linear array of LED devices 102. Generally, the greater the sinuosity of the bond wire 504a, the more mechanical energy the bond wire 504a is capable of storing. The sinuosity is the ratio of the curvilinear length along the bond wire 504a to the Euclidean distance between the end points of the bond wire 504a. Preferably, the sinuosity is from 2 to 8. Most preferably, the sinuosity is from 3 to 6. In FIGS. 7B and 7C, the bonding wire 504b, 504c includes a bow-shaped spring between the LED devices 102 it connects. In FIG. 7D, the bonding wire 504d includes a helical spring between the LED devices 102 it connects.

Staying on FIGS. 7A to 7D, when the enclosure is formed directly on the linear array of LED devices 102 by dispensing a liquid binder such as polymer coating on the LED device 102, a variety of incidents may negatively impact the quality of the LED filament produced through wire bonding. During wire bonding, the bonding wire is attached at both ends to the ohmic contacts of the LED device 102 using a combination of downward pressure, ultrasonic energy, and in some cases heat, to make a weld. The LED device 102 could be inadvertently shattered or burned during wire bonding. Moreover, ohmic contacts of the LED device 102, if having a tarnished or uneven surface, will compromise bond strength and potentially subject the LED filament to failures. Furthermore, the bonding could be dislocated when the liquid polymer is being dispensed on the bonding wire 1044 attaching, otherwise properly or improperly, to the adjacent LED devices 102. To mitigate such problems, in some embodiments, interconnections between the LED devices 102 are made with glue wires made from electrically conductive glue continuously applied between the anode and cathode contacts of adjacent LED devices 102. Electrically conductive glue is formed by doping electrically conductive particles in an elastic binder. The electrically conductive particle can be gold or silver. Preferably, the electrically conductive particle is made from optically transmissive materials such as nano-silver, nano-carbon tubes and graphene. In some embodiments, wavelength conversion particles are blended in the electrically conductive glue for enhanced light conversion. The elastic binder can be silicone, epoxy or polyimide. Preferably, the elastic binder for the electrically conductive glue is made from the same material from which the enclosure is made. The glue wire is thus seamlessly integrated into the enclosure and is made capable of stretching or compressing in perfect sync with enclosure. The glue wire can be fabricated with the aid of glue dispenser capable of 3-D maneuvers.

Figure 8E:
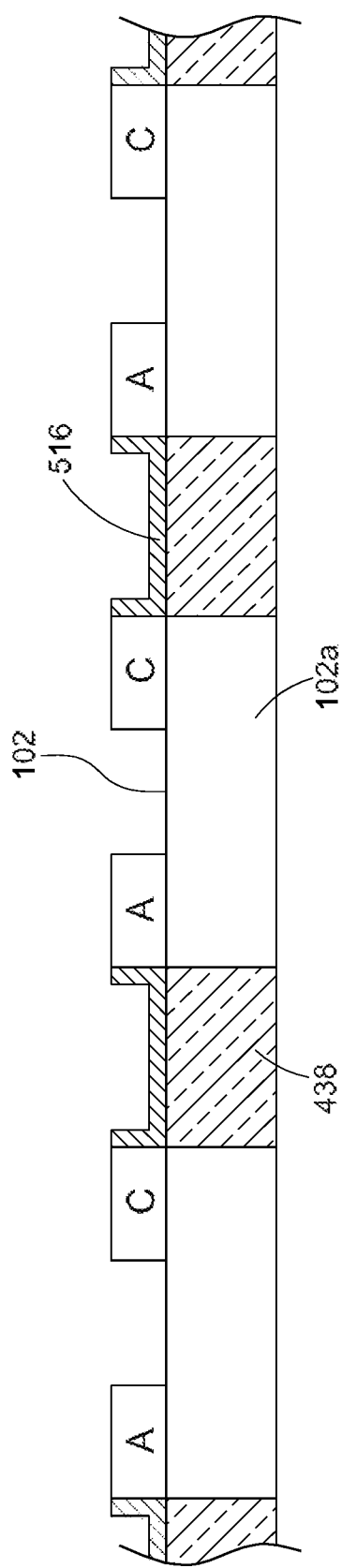
Figure 8F:
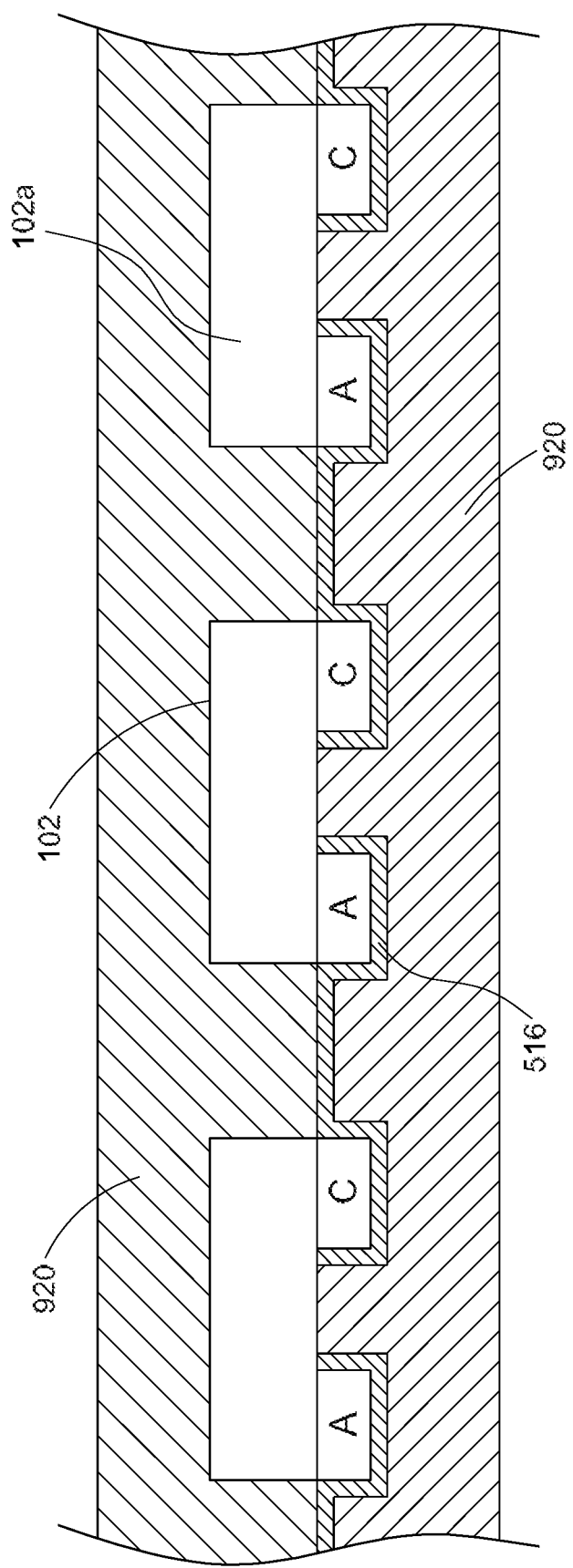

FIGS. 8A and 8B are side views of the linear array of the LED devices 102 in the LED filament in FIG. 1 where, for example, the anode A and cathode C contacts are provided on the same side of the LED die 102a. In FIG. 8A, the glue wire 516 connecting the adjacent LED devices 102 covers substantially the entire surface of the anode A and cathode C contacts. In FIG. 8B, the glue wire 516 connecting the adjacent LED devices 102 covers a portion of the surfaces of the anode A and cathode C contacts while leaving the other portion of the surfaces uncovered. FIGS. 8C and 8D are top views of the linear array of LED devices 102 in the LED filament in FIG. 1 where the anode A and cathode C contacts are provided on the same side of the LED die 102a. In FIGS. 8A and 8B, the glue wire 516 follows a substantially straight line to connect the adjacent LED devices 102. In some embodiments, the glue wire 516 includes a curve of any kind for absorbing potentially destructive mechanical energy. Preferably, the sinuosity of the curve is from 3 to 8. Most preferably, the sinuosity of the curve is from 2 to 6. In FIG. 8C, the glue wire 516 is drawn to define an S-shaped curve between the LED devices 102 it connects in anticipation of deformation resulting from the LED filament being stretched or compressed. In FIG. 8D, when the anode A and cathode C contacts are not exactly aligned along the longitudinal axis of the linear array of the LED devices 102, the glue wire 516 makes a turn—for example—at the corner of the LED device 102 to complete the electrical connection for the adjacent LED devices 102. FIGS. 8E and 8F are side views of the linear array of LED devices 102 in the LED filament in FIG. 1 where the anode A and cathode C contacts are provided on the same side of the LED die 102a. In FIG. 8E, the linear array of LED devices 102 includes a plurality of platforms 438 to fill the gap between the adjacent LED devices 102. Preferably, the platform 438 is made from the same material from which the enclosure is made. The upper surface of the platform 438 provides a continuous path for the glue wire 516 to run from the anode A contact of the LED device 102 to the cathode C contact of the adjacent LED devices 102. In FIG. 8F, alternatively, a mold 920 is made to follow the contour of the anode A and cathode C contacts of the linear array of LED devices 102. The mold 920, when properly deployed, defines a gap between the mold 920 and the linear array of LED devices 102. The glue wire 516 is formed by filling the gap with electrically conductive glue. In some embodiments, the anode A and cathode C contacts—potentially blocking light where they are disposed over the diode region—are eliminated from the LED die 102a. The glue wire 516 is thus configured to connect the p-junction of an LED device 102 and the n-junction of an adjacent LED devices 102.

In yet another embodiment, interconnections between the LED devices is made with a strip of flexible printed circuit (FPC) film. FIG. 9A is a top view of the FPC film 432 prior to connecting with the linear array of LED devices and the electrical connector. FIG. 9B is a top view of the FPC film 432 after connecting with the linear array of LED devices 102 and the electrical connector 506. The strip of FPC film 432 includes a plurality of conductive tracks 524 laminated onto a strip of thin and nonconductive substrate 430. The strip of FPC film 432 mechanically supports the linear array of LED devices 102 with the strip of nonconductive substrate 430. The conductive track 524 electrically connects the linear array of LED devices 102 by connecting the anode A contact of the LED device 102 to the cathode contact C of the adjacent LED device 102. In an embodiment, the nonconductive substrate 430 is an optically transmissive film, preferably having optical transmittance of 92% or more. For example, the nonconductive substrate 430 is a thin film made from Polyimide. The conductive track 524 is made from electrical conductors such as copper, copper alloy, indium tin oxide (ITO), silver nanoparticles or carbon nanotubes (CNTs). In an embodiment, the conductive track 524 is made from silver nanoparticles doped with gold for reliable connection with the ohmic contacts of the LED device 102. The conductive track 524 comes in many patterns when observed from the top. For example, in FIG. 9A the conductive track 524 defines a set of slanted parallel lines. In FIG. 9B, the conductive track 524 defines a slanted grid. Preferably, the conductive track 524 has a thickness of from 1 nm to 1 mm. Preferably, the line in the set of the parallel lines and in the grid has a width of from 1 μm to 1 mm. Some light is blocked by the conductive track 524 even when the conductive track 524 is made from transparent materials such as ITO. In some embodiments, the plurality of conductive tracks 524 cover less than 100% of the nonconductive substrate 430 to maximize the light traveling both ways through the nonconductive substrate 430. Preferably, the ratio of the total area covered by the plurality of conductive tracks 524 to the area of the FPC film 432 is from 0.1% to 20%. The strip of FPC film 432 is suitable for the LED filament designed to be bendable or flexible. When the conductive track 524 is properly patterned, e.g. a set of slanted parallel lines, a reliable electrical connection for the linear array of LED devices 102 is assured because a broken line in the set of slanted parallel lines would not open the electrical connection. Related features are described in FIGS. 33 to 43E in U.S. Ser. No. 15/499,143 filed Apr. 27, 2017.

Figure 10A:
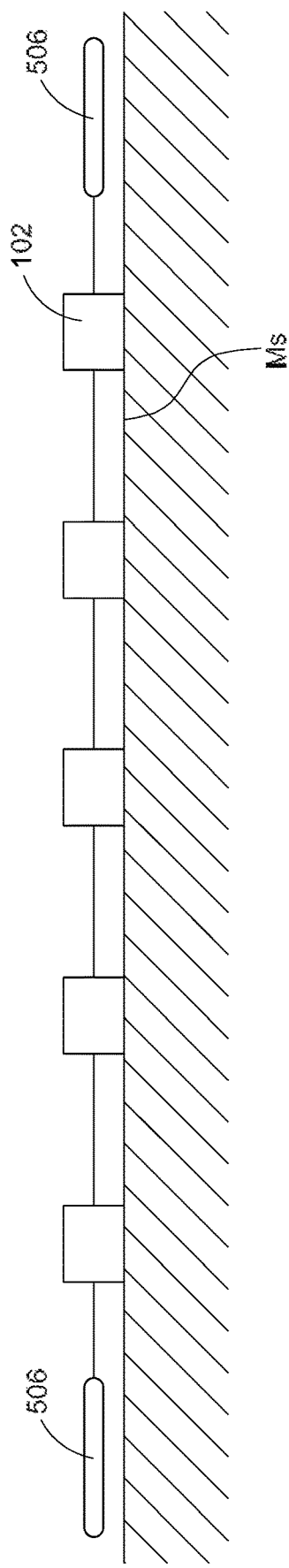
FIGS. 10A to 10C are schematic views of the LED filament in accordance with an exemplary embodiment of the present invention.
Figure 10B:
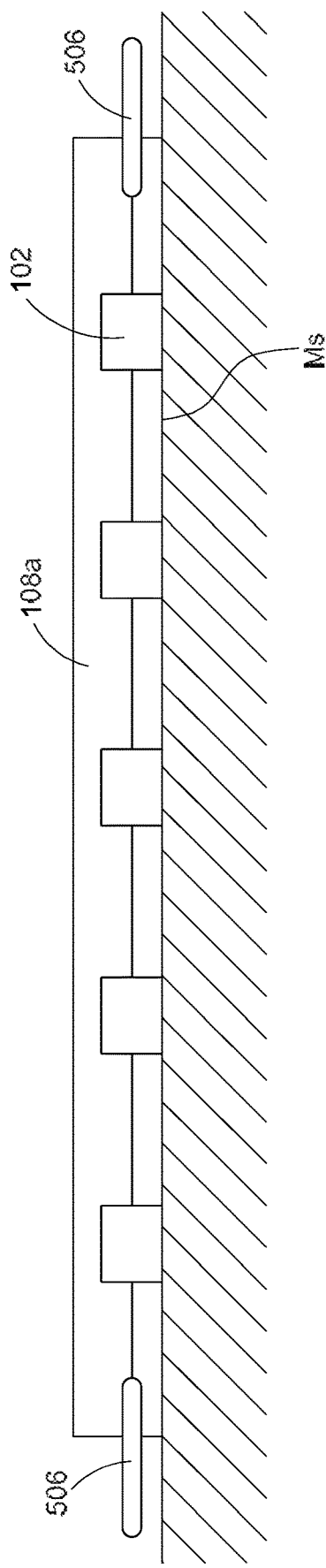
Figure 10C:
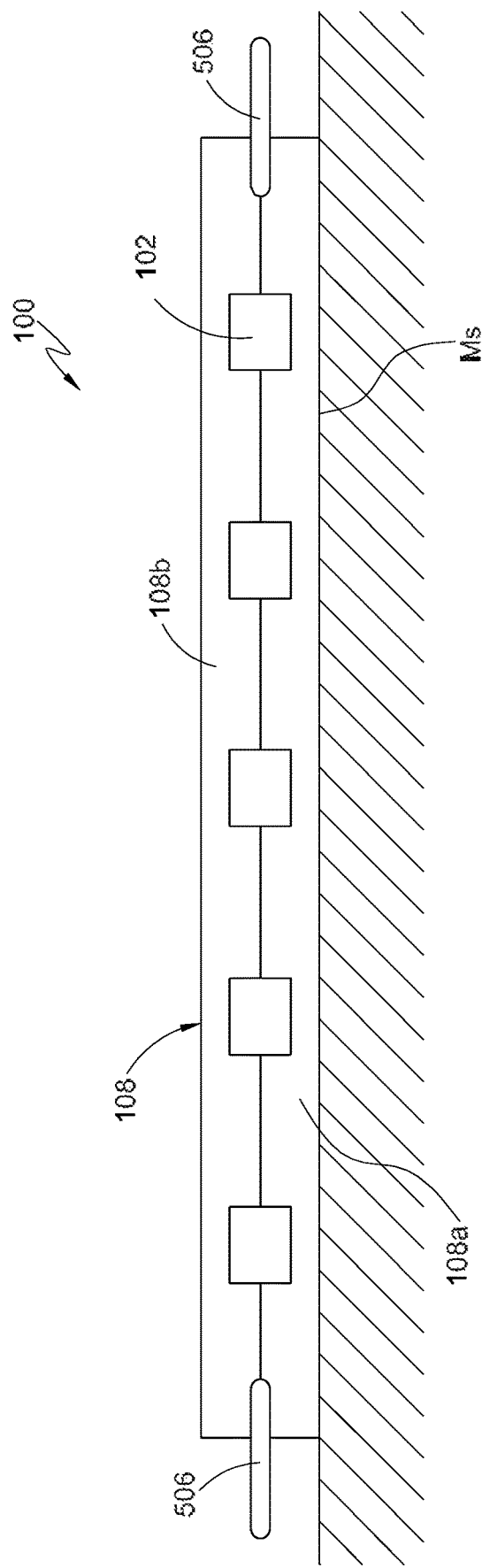

FIGS. 10A to 10C are side views of an LED filament in accordance with an exemplary embodiment of the present invention. Referring to FIGS. 10A to 10C, the method of making the LED filament 100 includes the following steps:

S20: Arrange a linear array of LED devices 102 spaced apart from one another and an electrical connector 506 on a mount surface Ms;

S22: Electrically and physically connect the linear array of LED devices 102 and the electrical connector 506; and S24: Dispose the linear array of LED devices 102 in an enclosure 108.

S20 and S22 have been performed in FIG. 10A. S24 is being performed in FIG. 10B. In FIG. 10C, S20, S22 and S24 have all been performed. The mount surface Ms is any surface capable of supporting the linear array of LED devices 102 and the electrical connector 506 throughout the steps of the method. Usually, the mount surface Ms is a substantially planar surface. In some embodiments, the mount surface Ms is a three dimensional surface whose shape depends on a desired totality of considerations such as: the posture the LED filament 100 is expected to maintain in the LED light bulb; the posture each individual LED device 102 is expected to maintain in relation to the rest of the linear array of LED devices 102; the shape of the enclosure 108; the texture of the outer surface of the enclosure 108; and the position of the linear array of LED devices 102 in the enclosure 108. Each one of the linear array of LED devices 102 is properly aligned with the adjacent LED device 102 on the mount surface Ms depending on the location of the anode and cathode contacts on the LED device 102 and depending on the type of electrical connection (in parallel or in series) to be made for the linear array of LED devices 102 in S22. In S22, the electrical connection is made with bond wire, conductive glue, FPC film or a combination of the above. The linear array of LED devices 102 is electrically connected in parallel, in series or in a combination of both ways.

In some embodiments where a cluster of LED filaments 100 is assembled on a large mount surface Ms, the method of making an LED filament 100 further includes the following step:

S26: Depanel the cluster of LED filaments 100.

In S26, an LED filament 100 depaneled from the cluster includes a linear array of LED devices 102 or a plurality of linear arrays of LED devices 102 depending on the application.

Staying on FIGS. 10A, 10B and 100, in an embodiment, the enclosure 108 is made from a cured transparent binder (i.e. adhesive) such as a cured transparent polymer. The enclosure 108 includes a first portion 108a, which is made first; and a second portion 108b, which is made later. The first portion 108a of the enclosure 108 may or may not be structurally or otherwise distinguishable from the second portion 108b of the enclosure 108. The mount surface Ms in S20 is provided by a panel separable from the linear array of LED devices 102. The panel is made of suitable solid materials such as glass or metal. In some embodiments, the panel further includes a side wall for containing and sometimes shaping the enclosure 108 on the panel especially when, for example, a pre-curing liquid polymer is dispensed on the panel during manufacturing. In an embodiment, S24 includes the following steps:

S240: Dispense a first strip of transparent polymer over the linear array of LED devices 102;

S242: Reverse the linear array of LED devices 102 on the panel; and

S244: Dispense a second strip of transparent polymer over the linear array of LED devices 102.

Staying on FIGS. 10A, 10B and 100, in S240, the first strip of liquid polymer is dispensed over the linear array of LED devices 102 to form the first portion 108a of the enclosure 108. Surface tension, which at the size of an LED device 102 is large in relation to gravitational forces, in combination with viscosity allows the strip of liquid polymer to conformally cover all corners of the linear array of LED devices 102, including the gaps between the LED devices 102. It is desirable to do a fast cure, such as a UV cure, because the normal drop in viscosity during a thermal cure would cause most liquid polymers to flow away from the linear array of LED devices 102. In S242, the linear array of LED devices 102, which is now at least partially enclosed by the first portion 108a of the enclosure 108, is flipped over on the panel and remains unharmed without additional care if the linear array of LED devices 102 was not adhesively attached to the panel in S20. In some embodiments, the linear array of LED devices 102 was adhesively attached on the panel with adhesive materials such as photoresist for semiconductor fabrication and die bond glue. The linear array of LED devices 102 can be separated from the panel after dissolving the adhesive material with proper solvents such as acetone. Residuals of adhesive material remaining on the linear array of LED devices 102 are flushed away before moving on to S244. In S244, like in S240, the second strip of liquid polymer is dispensed over the linear array of LED devices 102, which has been enclosed, at least partially, by the first portion 108a of the enclosure 108. The second strip of liquid polymer is then cured and forms the second portion 108b of the enclosure 108. We now have an LED filament 100 comprising the linear array of LED devices 102 disposed in the enclosure 108 operable to emit light when energized through the electrical connector 506.

Figure 11C:
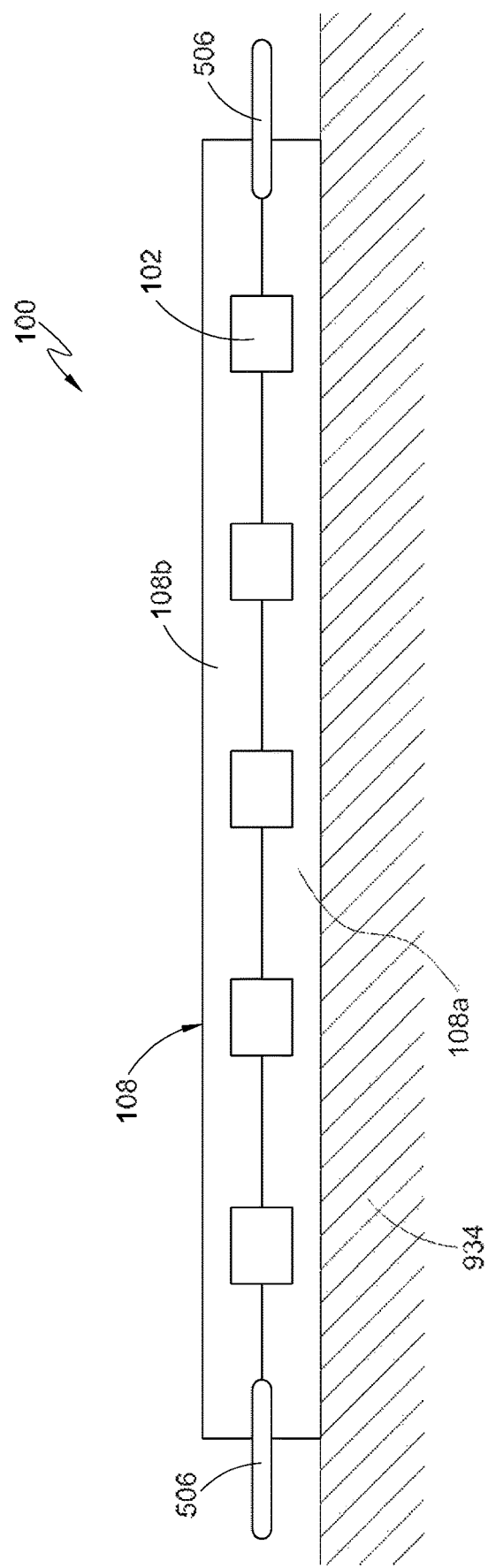

Shifting to FIGS. 11A, 11B and 11C, in another embodiment, the enclosure 108 is made from, for example, cured transparent polymer. However, the mount surface Ms in S20 for the linear array of LED devices 102 and the electrical connector 506 is provided by a strip of cured transparent polymer that will form the first portion 108a of the enclosure 108. S20 includes the following steps:

S200: Dispense a first strip of transparent polymer on a panel 934; and

S202: Arrange a linear array of LED devices 102 spaced apart from one another and an electrical connector 506 on the first strip of transparent polymer.

In the embodiment, S24 includes the following step:

S244: Dispense a second strip of transparent polymer over the linear array of LED devices 102.

S200 has been performed in FIG. 11A. S202 has been performed in FIG. 11B. S244 has been performed in FIG. 11C. In S200, the first strip of liquid polymer is dispensed on a panel 934. The first strip of liquid polymer is then cured on the panel 934 to form the first portion 108a of the enclosure 108. The mount surface Ms in S20 is provided by the first strip of cured polymer to separable from the panel 934. The first portion 108a of the enclosure 108 provides a surface capable of supporting the linear array of LED devices 102 and the electrical connector 506 throughout the steps of the method. The panel 934 is made of suitable solid materials such as glass or metal. In some embodiments, the panel 934 further includes a side wall for containing and sometimes shaping the enclosure 108 on the panel 934 especially when, for example, pre-curing liquid polymer is dispensed on the panel 934 during manufacturing. In S202, to strengthen the combination when the linear array of LED devices 102 and the electrical connector 506 are disposed on the first portion 108a of the enclosure 108, optionally, an upper surface of the first portion 108a of the enclosure 108 is melted before the linear array of LED devices 102 and the electrical connector 506 are disposed on the first portion 108a of the enclosure 108. The linear array of LED devices 102 and the electrical connector 506 are thus at least partially immersed into the first portion 108a of the enclosure 108 before the upper surface of the first portion 108a of the enclosure 108 cools down and hardens. In S244, like in S200, the second strip of liquid polymer is dispensed over the linear array of LED devices 102, which has been disposed on or at least partially enclosed by the first portion 108a of the enclosure 108. The second strip of liquid polymer is then cured and forms the second portion 108b of the enclosure 108. The linear array of LED devices 102, which is now enclosed by the unitary structure of the first portion 108a of the enclosure 108 and the second portion 108b of the enclosure 108, can be removed from the panel 934 and remains unharmed without additional care if the first portion 108a of the enclosure 108 was not adhesively attached to the panel 934. In some embodiments, the first portion 108a of the enclosure 108 was adhesively attached to the panel 934 with adhesive materials such as photoresist for semiconductor fabrication and die bond glue. The first portion 108a of the enclosure 108 can be separated from the panel 934 after dissolving the adhesive material with proper solvents such as acetone. Residuals of adhesive material remaining on first portion 108a of the enclosure 108 are then flushed away. We now have an LED filament 100 comprising the linear array of LED devices 102 disposed in the enclosure 108 operable to emit light when energized through the electrical connector 506.

Staying on FIGS. 11A, 11B and 11C, to serve as the mount surface Ms in S20 for the linear array of LED devices 102 and the electrical connector 506, the first portion 108a of the enclosure 108 in S200 is configured to be capable of withstanding potential impact resulting from manufacturing procedures such as wire bonding. In an embodiment, the first portion 108a of the enclosure 108 comprises a hardener having a pre-determined concentration of particles harder than the liquid polymer in which the particles are embedded. For example, light conversion particles such as phosphor particles are harder than the binder materials such as silicone and resin. Thus, the first portion 108a of the enclosure 108 can be made harder by increasing the concentration of the light conversion particles embedded in the transparent binder. For example, the first portion 108a of the enclosure 108 is configured to have a Shore hardness of from D20 to D70 when the ratio of the volume of the light conversion particles in the first portion 108a of the enclosure 108 to the volume of the transparent binder in the first portion 108a of the enclosure 108 is from 20% to 80%. Alternatively, the ratio of the weight of the light conversion particles in the first portion 108a of the enclosure 108 to the weight of the transparent binder in the first portion 108a of the enclosure 108 is from 20:80 to 99:1. In yet another embodiment, the first portion 108a of the enclosure 108 is thickened such that the thickness enables the first portion 108a of the enclosure 108 to withstand potential impact resulting from manufacturing procedures such as wire bonding. Preferably, the thickness of the first portion 108a of the enclosure 108 is from 0.01 to 2 mm. Most preferably, the thickness of the first portion 108a of the enclosure 108 is from 0.1 to 0.5 mm.

Shifting to FIGS. 12A, 12B, 12C and 12D, in yet another embodiment, the enclosure 108 is made from, for example, cured transparent polymer. However, the mount surface Ms in S20 for the linear array of LED device 102 and the electrical connector 506 is provided by a strip of cured transparent polymer that will form a first portion 108a of the enclosure 108. S20 includes the following steps:

S210: Dispense a first strip of transparent polymer on a panel 934;

S212: Dispose a strip of FPC film 432 on the first strip of transparent polymer; and S214: Arrange a linear array of LED devices 102 spaced apart from one another and an electrical connector 506 on the strip of FPC film 432.

In the embodiment, S24 includes the following step:

S244: Dispense a second strip of transparent polymer over the linear array of LED devices 102.

Figure 12A:
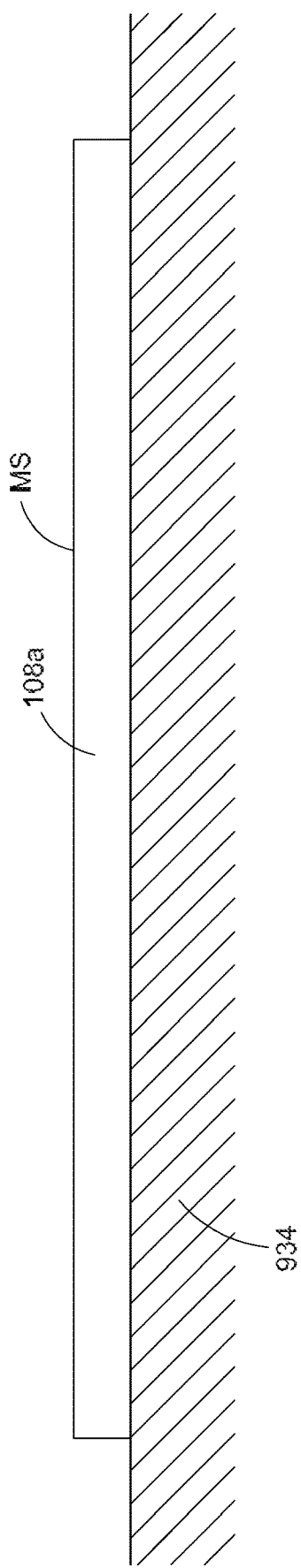
FIGS. 12A to 12D are schematic views of the LED filament in accordance with an exemplary embodiment of the present invention.
Figure 12B:
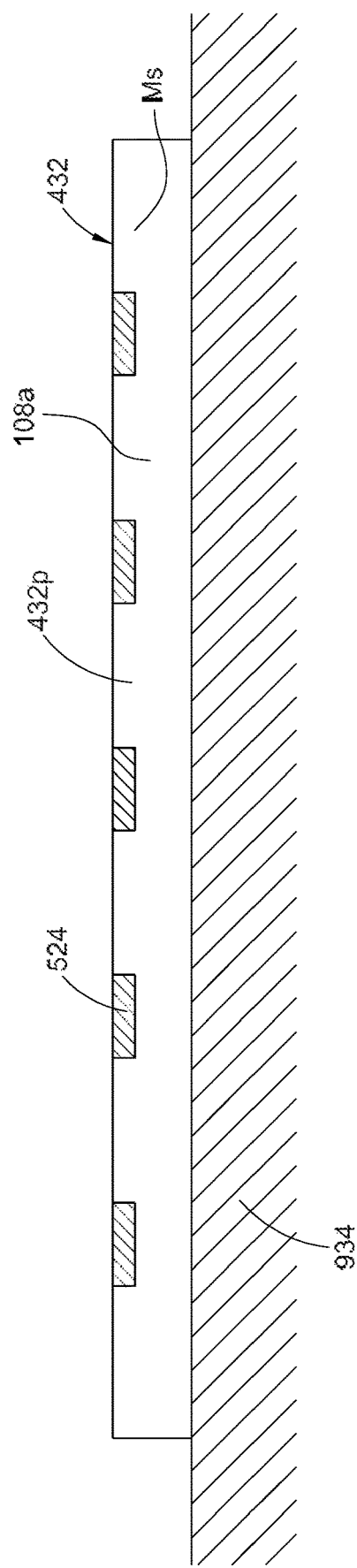
Figure 12C:
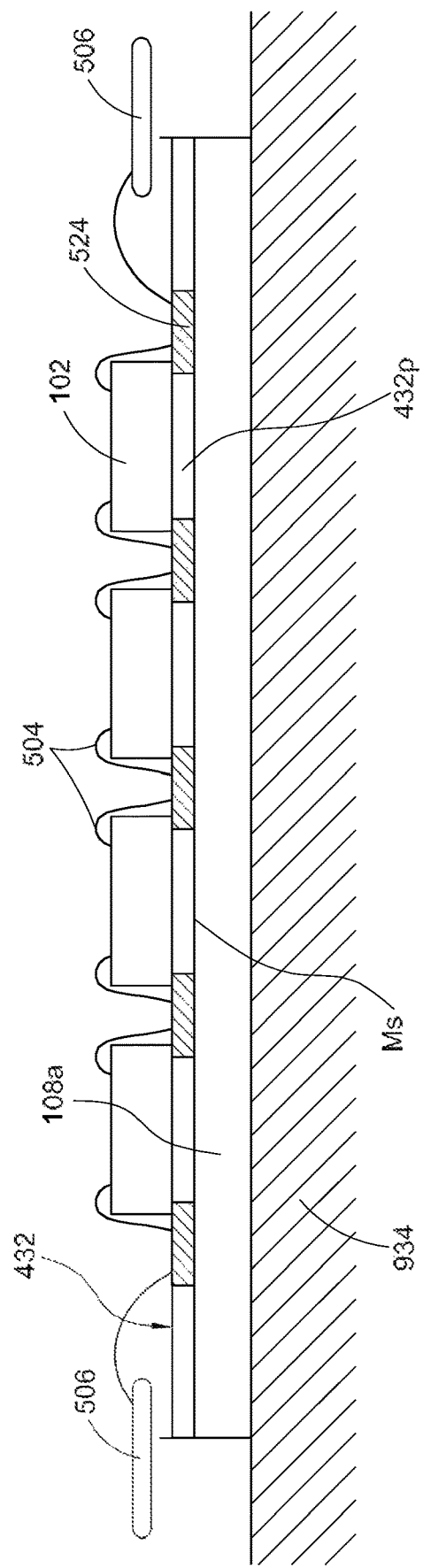
Figure 12D:
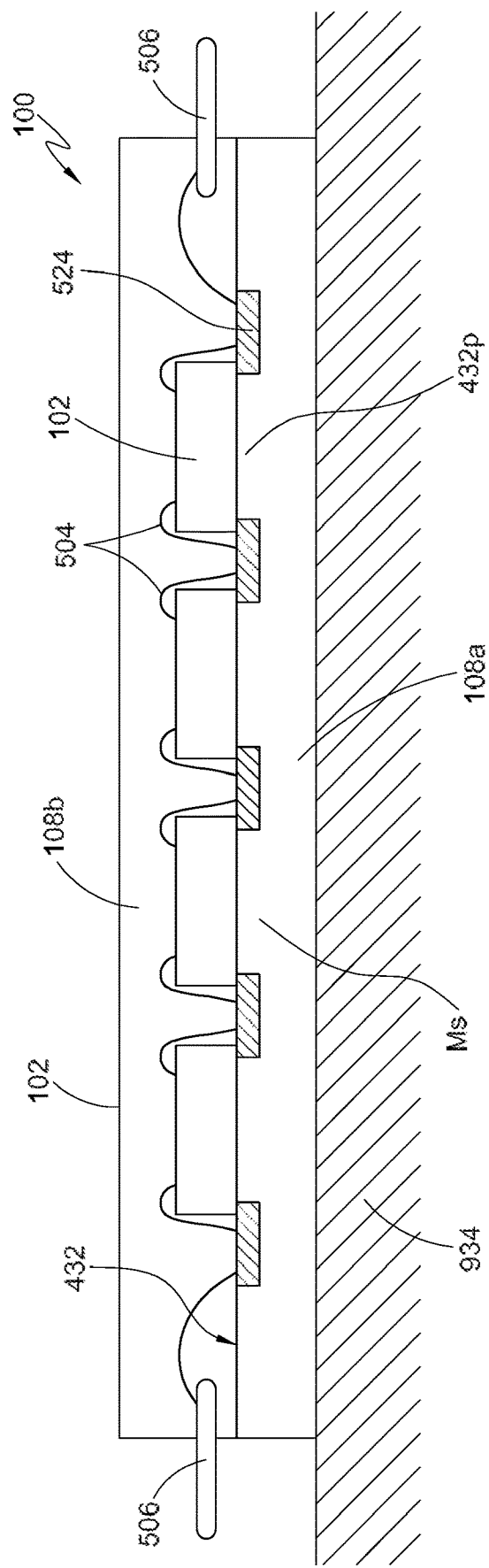

S210 has been performed in FIG. 12A. S212 has been performed in FIG. 12B. S214 has been performed in FIG. 12C. S244 has been performed in FIG. 12D. In S210, the first strip of liquid polymer is dispensed on a panel 934. The panel 934 is made of suitable solid materials such as glass or metal. In some embodiments, the panel 934 further includes a side wall for containing and sometimes shaping the enclosure 108 on the panel 934 especially when, for example, pre-curing liquid polymer is dispensed on the panel 934 during manufacturing. The first strip of liquid polymer is then cured on the panel 934 to form the first portion 108a of the enclosure 108. The mount surface Ms in S20 is provided by the first strip of cured polymer separable from the panel 934. The first portion 108a of the enclosure 108 provides a surface capable of supporting the linear array of LED devices 102 and the electrical connector 506 throughout the steps of the method. In S212, to strengthen the combination when the strip of FPC film 432 is disposed on the first portion 108a of the enclosure 108, optionally, an upper surface of the first portion 108a of the enclosure 108 is melted. The strip of FPC film 432 is then at least partially immersed into the first portion 108a of the enclosure 108 before the upper surface cools down and hardens. In some embodiments, the strip of FPC film 432 includes a linear array of apertures 432p punched by, for example, a stamping press. Optionally, the aperture 432p is dimensionally smaller than the LED device 102. In these embodiments, each of the linear array of LED devices 102 straddles exactly one of the linear array of the apertures 432p. Thus, light coming from the linear array of LED devices 102 will not be blocked by the strip of FPC film 432. In S22, a combination of wire bonding and FPC film 432 is employed to electrically and physically connect the linear array of LED devices 102. The bonding wire 504 is attached to a conductive track 524 of the strip of FPC film 432 at its first end and is attached to an ohmic contact of the LED device 102 at its second end. In S244, like in S210, the second strip of liquid polymer is dispensed over the linear array of LED devices 102, which has been disposed on or at least partially enclosed by the first portion 108a of the enclosure 108. The second strip of liquid polymer is then cured and forms the second portion 108b of enclosure 108. The linear array of LED devices 102, which is now enclosed by the unitary structure of the first portion 108a of the enclosure 108 and the second portion 108b of the enclosure 108, can be removed from the panel 934 and remains unharmed without additional care if the first portion 108a of the enclosure 108 was not adhesively attached to the panel 934. In some embodiments, the first portion 108a of the enclosure 108 is adhesively attached to the panel 934 with adhesive materials such as photoresist for semiconductor fabrication and die bond glue. The first portion 108a of the enclosure 108 can be separated from the panel 934 after dissolving the adhesive material with proper solvents such as acetone. Residuals of adhesive material remaining on the first portion 108a of the enclosure 108 are flushed away. We now have an LED filament 100 comprising the linear array of LED devices 102 disposed in the enclosure 108 operable to emit light when energized through the electrical connector 506.

Figure 13:
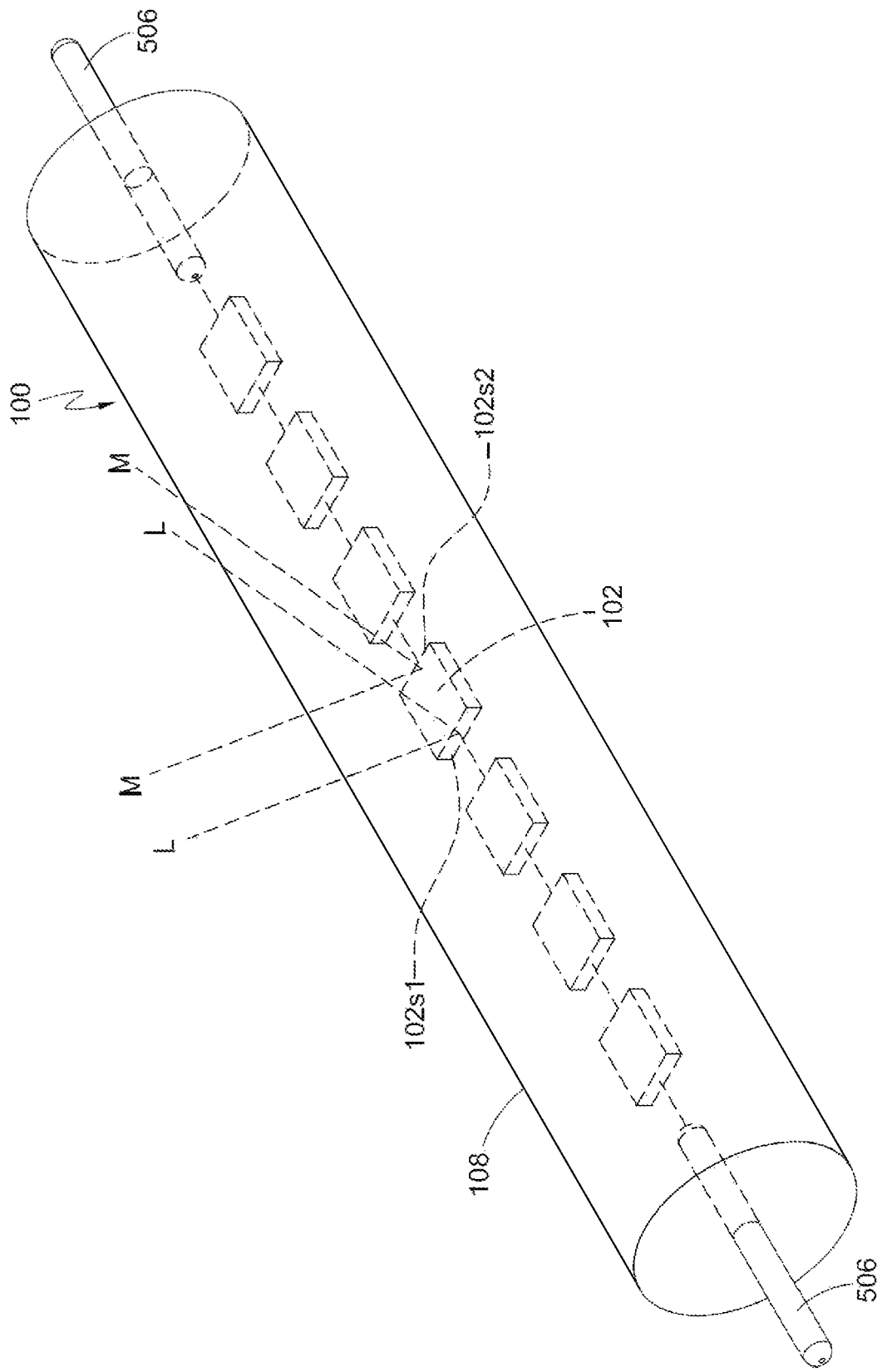
FIG. 13 is a see-through view of the LED filament in accordance with an exemplary embodiment of the present invention.
Figure 14:
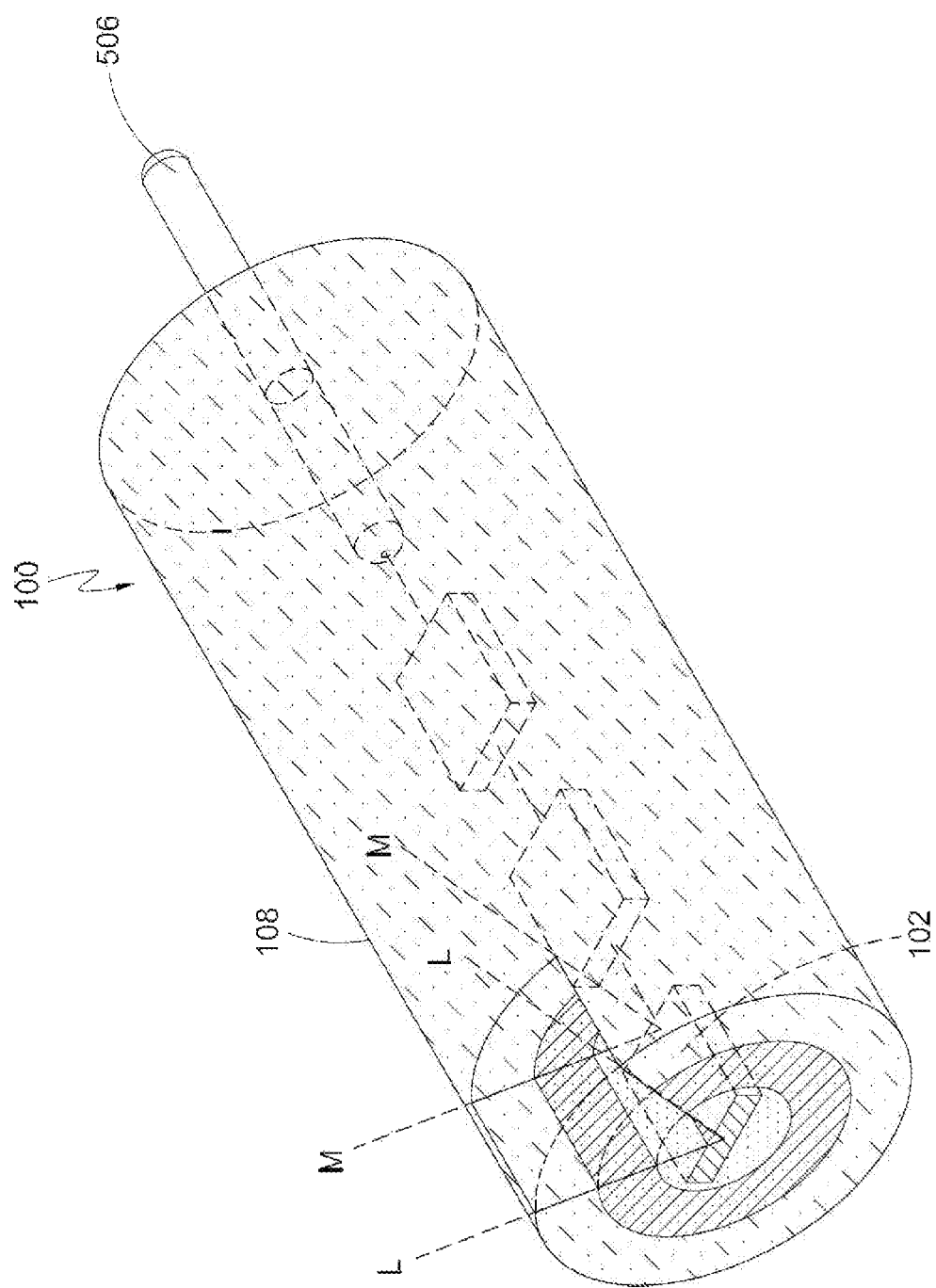
FIG. 14 shows the truncated LED filament in FIG. 13 in accordance with an exemplary embodiment of the present invention.
Figure 15:
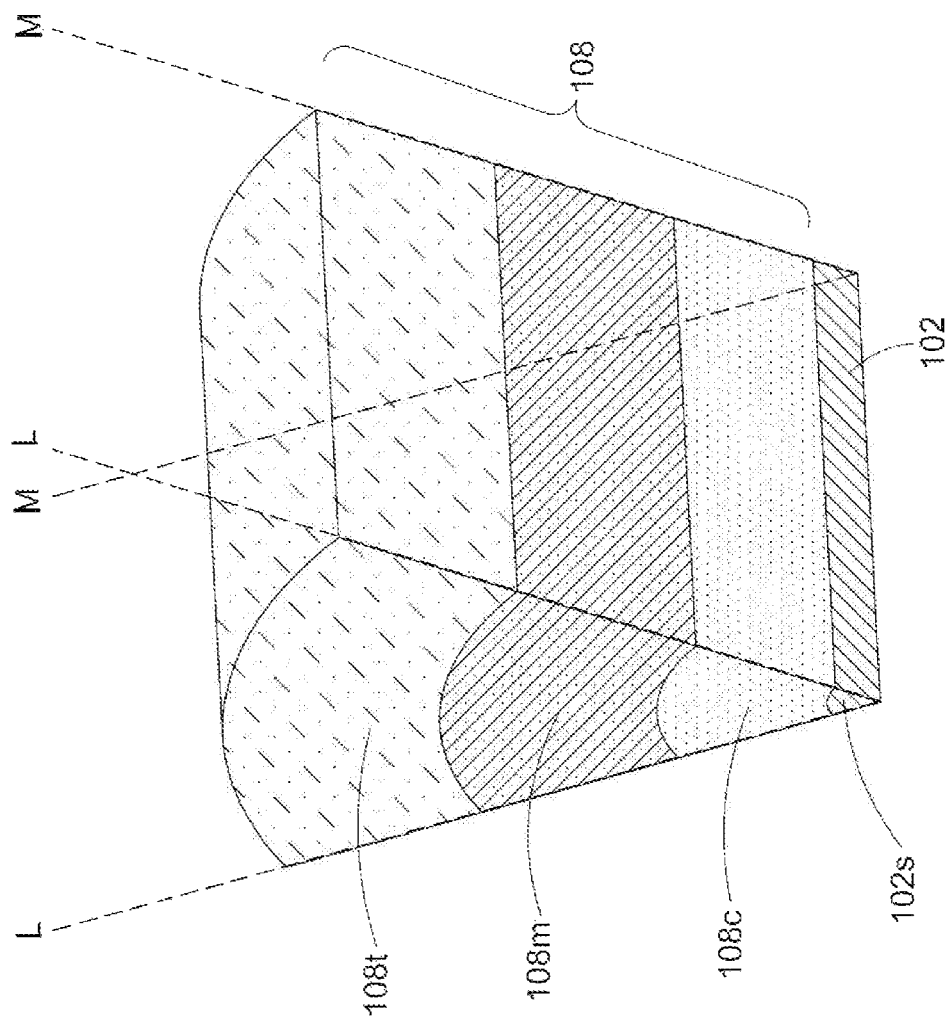
FIG. 15 shows a cutaway from the LED filament in FIG. 13 in accordance with an exemplary embodiment of the present invention.

FIG. 13 is a perspective view of the LED filament in accordance with an exemplary embodiment of the present invention. In FIG. 13, the line L-L cuts the LED filament 100 radially right along a lateral surface 102s1 of the LED device 102. Likewise, the line M-M cuts the LED filament 100 radially right along the other lateral surface 102s2 of the LED device 102. FIG. 14 is a perspective view showing the cross section of the LED filament 100 cut by the line L-L and the line M-M. Carved out along the cross section in FIG. 14, FIGS. 15 to 17 show a cutaway from the LED filament 100 defined by the line L-L and the line M-M. In some embodiments, the enclosure 108 is a tubular structure having exactly one layer or a plurality of distinct layers. In the embodiment in FIG. 16, the enclosure 108 has exactly one layer over the LED device 102. In the embodiment in FIG. 15, the enclosure 108 is a multi-layered structure over the LED device 102. Each layer of the enclosure 108 is configured to add a distinctive function to the LED filament 100 in FIG. 14. For example, the enclosure 108 in FIG. 15 includes three layers 108c, 108m and 108t.

Figure 16:
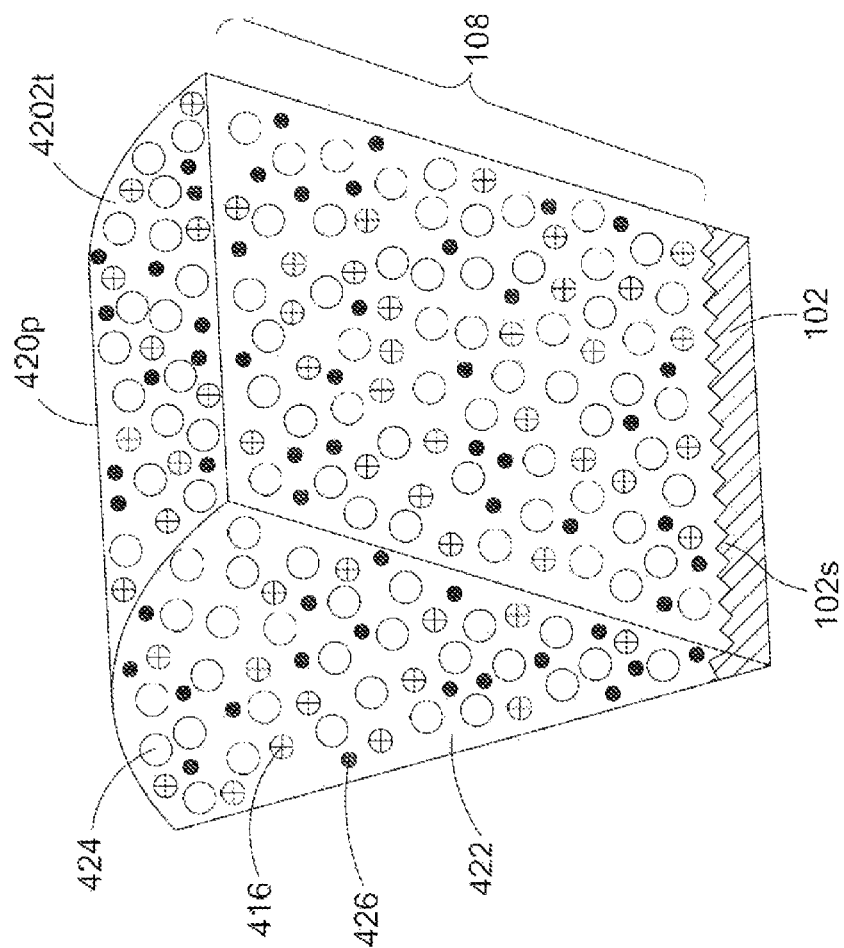
FIG. 16 shows a cutaway from the LED filament in FIG. 13 in accordance with an exemplary embodiment of the present invention.

FIG. 16 shows a cutaway of the LED filament 100 in FIG. 14 in which the enclosure 108 has exactly one unitary layer over the LED device 102. In an embodiment, the LED device 102 has a texturized light emission surface 102s to increase light extraction from the diode layer of the LED device 102 by reducing total internal reflection. The light emission surface 102s includes the surface of the diode layer D of the LED device 102, the surface of the substrate S of the LED device 102 or both. The light emission surface 102s is treated with subtractive processes such as etching, cutting and grinding wherein material is removed from the light emission surface 102s to create the desired texture.

Staying on FIG. 16, the enclosure 108 further includes a wavelength converter. The wavelength converter 420p includes a transparent binder 422 in which a plurality of light conversion particles 424, such as phosphor particles, are embedded. The phosphor particles may be formed from any suitable phosphor capable of converting light of one wavelength into another wavelength. Cerium(III)-doped YAG is often used for absorbing the light from the blue LED device 102 and emits in a broad range from greenish to reddish, with most of output in yellow. This yellow emission combined with the remaining blue emission gives the white light, which can be adjusted to color temperature as warm (yellowish) or cold (blueish) white. The pale yellow emission of the Ce3+:YAG can be tuned by substituting the cerium with other rare earth elements such as terbium and gadolinium and can even be further adjusted by substituting some or all of the aluminium in the YAG with gallium. Alternatively, some rare-earth doped Sialons are photoluminescent and can serve as phosphors. Europium(II)-doped β-SiAlON absorbs in ultraviolet and visible light spectrum and emits intense broadband visible emission. Its luminance and color does not change significantly with temperature, due to the temperature-stable crystal structure. Thus, it is suitable for using as green down-conversion phosphor for white-light LED filaments; a yellow variant is also available. To generate white light, a blue LED device is used with a yellow phosphor, or with a green and yellow SiAlON phosphor and a red CaAlSiN3-based (CASN) phosphor. In an embodiment, the wavelength conversion layer is configured to convert light emitting from the LED device into light having a color temperature from 2400 to 2600 K by, for example, embedding in the transparent binder an appropriate combination of yellow-and-green phosphor and red phosphor.

Staying on FIG. 16, the amount of light absorbed and re-emitted by the light conversion particles is generally proportional to the amount of light conversion particles 424 that the light passes through before egressing the LED filament. However, if the light passes through too much light conversion particles 424, part of the re-emitted light can be blocked from emitting from the LED filament, by the excess light conversion particles 424. This reduces the overall light emitting efficiency of the LED filament. The amount of light conversion particles 424 that the LED light passes through can be varied by varying the concentration of light conversion particles 424, the thickness of the wavelength converter 420p, or both. In an embodiment, light from the linear array of LED devices 102 passes through sufficient light conversion particles 424 so that substantially all of the light is absorbed by the light conversion particles and re-emitted at a different wavelength of light. At the same time, the re-emitted light does not pass through an excess light conversion material so that the re-emitted light is not blocked from emitting from LED filament. By providing sufficient light conversion particles 424 to provide full conversion without blocking, the light conversion particles are in state of optimal conversion. The amount of light conversion particles 424 for optimal conversion depends on the size and luminous flux of the LED filament. The greater the size and luminous flux, the greater the amount of light conversion particles 424 needed. Under optimal conversion, the light emitted from the LED filament is composed primarily of photons produced by the light conversion particles 424. Preferably, the ratio of the volume of the light conversion particles 424 in the wavelength converter 420p to the volume of the transparent binder 422 in the wavelength converter 420p is from 20:80 to 99:1. Preferably, the ratio of the weight of the light conversion particles 424 in the wavelength converter 420p to the weight of the transparent binder 422 in the wavelength converter 420p is from 20% to 50%. In some embodiments, however, it may be desirable to allow a small portion of the light to be transmitted through the light conversion particles 424 without absorption for purposes of modifying the chromaticity of the resulting radiation of the LED filament. For example, the LED filament emits less than 10% of the emission power of primary radiation in the absence of the light conversion particles 424. In other words, the light conversion particles 424 absorb 90% or more of the light from the linear array of LED devices 102.

Figure 19C:
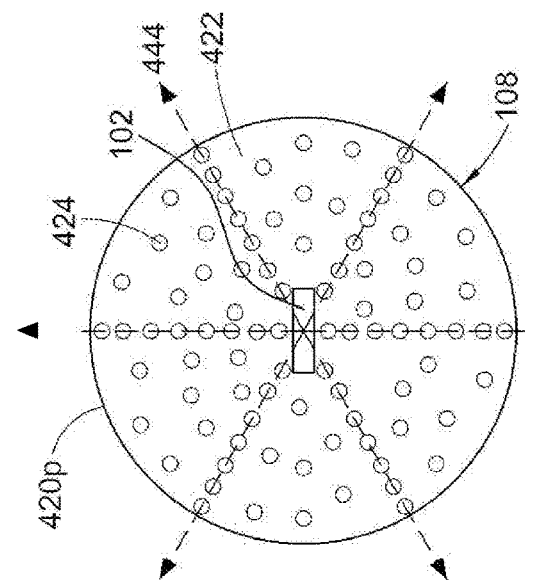
FIGS. 19A to 19C show a cross section of the LED filament in accordance with an exemplary embodiment of the present invention.
Figure 19B:
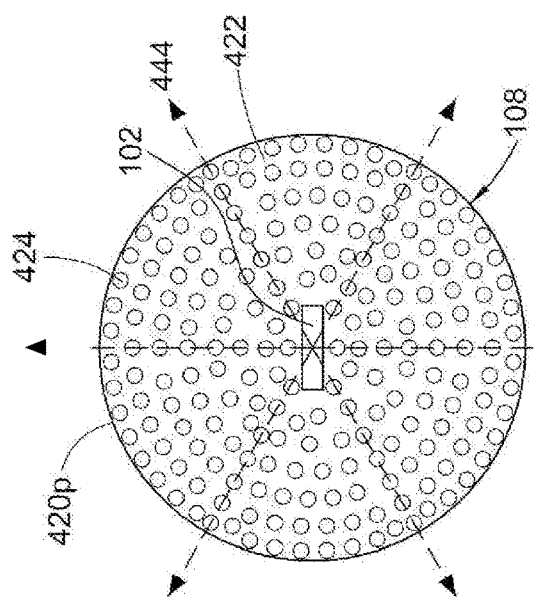
Figure 19A:
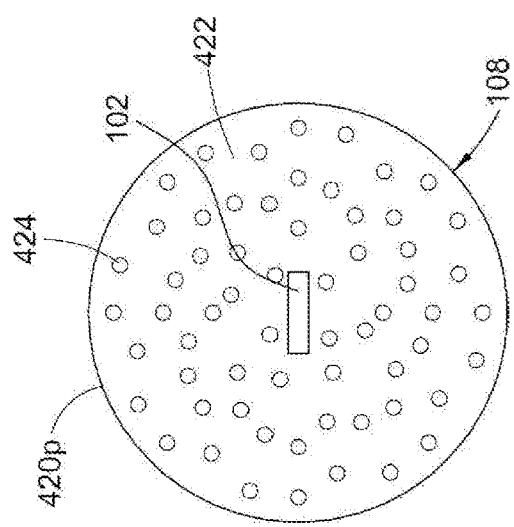

FIGS. 19A, 19B and 19C show a cross section of the LED filament in accordance with an exemplary embodiment of the present invention. Referring to FIG. 19A, suitable materials for the transparent binder 422 include silicone, resin and epoxy. However, these materials, having a thermal conductivity from 0.01 to 2 W/(m·K), are poor thermal conductors in relation to the light conversion particles 424 like phosphor, which has a thermal conductivity of from 1 to 20 W/(m·K). Excess heat trapped inside the enclosure 108 compromises the performance of the heat-sensitive LED devices 102. Moreover, the transparent binder 422, when bathed in excess heat, becomes brittle and unpleasantly yellow over time. Thus, it is desirable to configure the wavelength converter 420p in a way heat from the LED device 102 is efficiently transferred away from the wavelength converter 420p. In an embodiment, the wavelength converter 420p further includes a plurality of heat transfer paths 444 extending in a substantially radial direction for transferring heat from the LED device 102 away from the wavelength converter 420p. In FIG. 19A, the concentration of light conversion particles 424 in the transparent binder 422 is so low that the heat transfer paths are mostly broken because the majority of light conversion particles 424, sealed by the transparent binder 422, are far apart from one another. By contrast, in FIG. 19B, the concentration of the light conversion particles 424 is high enough for the light conversion particles 424 to form a plurality of heat transfer paths 444 by lining up the light conversion particles 424 successively along a substantially radial direction because the majority of the light conversion particles 424, not being completely sealed by the transparent binder 422, are at least partially in direct contact with neighboring light conversion particles 424 on a same light transfer path 444. Preferably, the ratio of the volume of the light conversion particles 424 in the wavelength converter 420p to the volume of the transparent binder 422 in the wavelength converter is from 20:80 to 99:1. Preferably, the ratio of the weight of the light conversion particles 424 in the wavelength converter 420p to the weight of the transparent binder 422 in the wavelength converter 420p is from 20% to 50%. As previously discussed, if the light passes through too much light conversion particles 424, part of the re-emitted light can be blocked from emitting through the wavelength converter 420p by the excess light conversion particles 424. By providing a sufficient concentration of light conversion particles 424 for sufficient heat transfer paths 444 without blocking, the light conversion particles 424 are in state of thermal optimum. Preferably, under the thermal optimum, the ratio of the volume of the light conversion particles 424 in the wavelength converter 420p to the volume of the transparent binder 422 in the wavelength converter 420p is from 20:80 to 99:1. Preferably, the ratio of the weight of the light conversion particles 424 in the wavelength converter 420p to the weight of the transparent binder 422 in the wavelength converter 420p is from 20% to 50%. Given the same concentration, the plurality of heat transfer paths 444 that otherwise would not exist if the light conversion particles 424 are evenly dispersed throughout the transparent binder 422 can be formed by maneuvering the distribution of the light conversion particles 424 in the transparent binder 422 where the plurality of heat transfer paths 444 are planned. The concentration of the light conversion particles 424 in FIG. 19C is comparable to the concentration of the light conversion particles 424 in FIG. 19A. As previously stated, the heat transfer paths 444 in FIG. 19A are mostly broken. By contrast, in FIG. 19C, the wavelength converter 420p includes the plurality of heat transfer paths 444 similar in shape to a spoke having the LED device 102 as a hub. The concentration of the light conversion particles 424 along the planned paths is high enough for the light conversion particles 424 to form a plurality of heat transfer paths 444, e.g. like a spoke, by lining up the light conversion particles 424 successively along a substantially radial direction because most light conversion particles 424 are at least partially in direct contact with neighboring light conversion particles 424 in the que. The heat transfer path 444 passes through the wavelength converter 420p in which the concentration of the light conversion particles 424 is appreciably lower than the concentration of the light conversion particles 424 that lays out the heat transfer path 444. By elevating the concentration of the light conversion particles 424 only where the heat transfer path 444 is planned in the transparent binder 422, the heat transfer paths 444 can be obtained while mitigating the problem of light blocking resulting from excessive concentration of the light conversion particles 424. In some embodiments, the heat transfer path 444 further includes a gap filler for tightening up the contact between the light conversion particles 424 on the heat transfer path 444. For example, the heat transfer path 444 further includes a plurality of nanoparticles such as $TiO_2$, $Al2O_3$, $SiO_3$, $ZrO_2$, CaO, SrO, BaO, silicon carbide and silicon nanoparticles. These nanoparticles, having a thermal conductivity from 10 to 50 W/(m·K), are dimensionally much smaller than the light conversion particles 424 that constitute the primary ingredient of the heat transfer path 444. For example, the nanoparticle is from 10 to 300 nm. Preferably, the nanoparticle is from 20 to 100 nm. The nanoparticles help close the gaps between the light conversion particles 424 on the heat transfer path 444. Other things equal, the heat transfer path 444, when further including nanoparticles, becomes a more efficient heat conduit because the light conversion particles 424 on the heat transfer path 444 are in a tighter contact with one another than in the absence of nanoparticles.

Soft materials such as silicone and resin are suitable materials for the transparent binder. A bendable LED filament is made possible with these highly elasto-plastic materials. However, sometimes it is desirable to use these inherently soft materials to provide an LED filament capable of self-sustained plastic deformation such that external support structures can be minimized or even eliminated when the LED filament is expected to maintain a particular posture when it is connected to a lighting fixture such as LED light bulb. The posture could be a straight line extending vertically, horizontally or in any other direction. The posture could be curves of any kind, including simple curves such as arc and polygon and complex curves such as helix, petal and gift ribbon. In an embodiment, the enclosure includes a posture maintainer such that the LED filament is capable of self-sustained plastic deformation with minimal or even no external support such as support wires usually found in an LED light bulb. For example, the posture maintainer includes a pre-determined concentration of particles harder than the transparent binder in which the particles are embedded. Alternatively, the posture maintainer includes a wire system, which serve as an auxiliary piece embedded in the transparent binder. Moreover, the posture maintainer includes an aperture system embedded in the transparent binder. Light conversion particles such as phosphor participles are harder than the binder materials such as silicone and resin. Thus, the enclosure can be made harder by increasing the concentration of the light conversion particles in the transparent binder. In an embodiment, the hardened enclosure includes alternate coatings of the transparent binder and the phosphor particles. The enclosure is thus configured to exhibit an even concentration of the phosphor particles throughout the structure. In some embodiments, the enclosure is configured to have a Young's modulus from $0.1 \times 10^{10}$ to $0.3 \times 10^{10}$ Pa. In other embodiments to be used with LED light bulbs, the wavelength converter is configured to have a Young's modulus from $0.15 \times 10^{10}$ to $0.25 \times 10^{10}$ Pa.

Figure 20A:
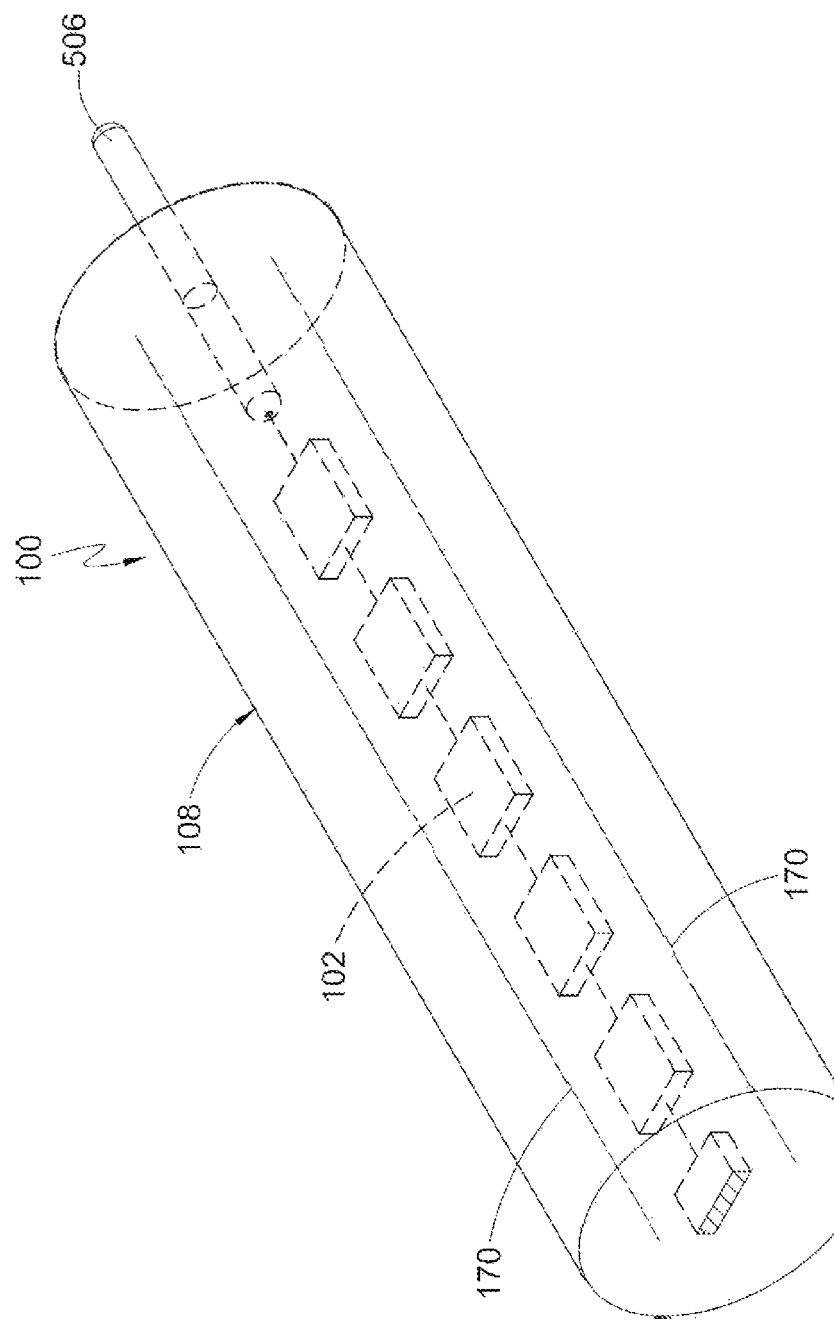
FIGS. 20A to 20E show a truncated LED filament in accordance with an exemplary embodiment of the present invention.
Figure 20B:
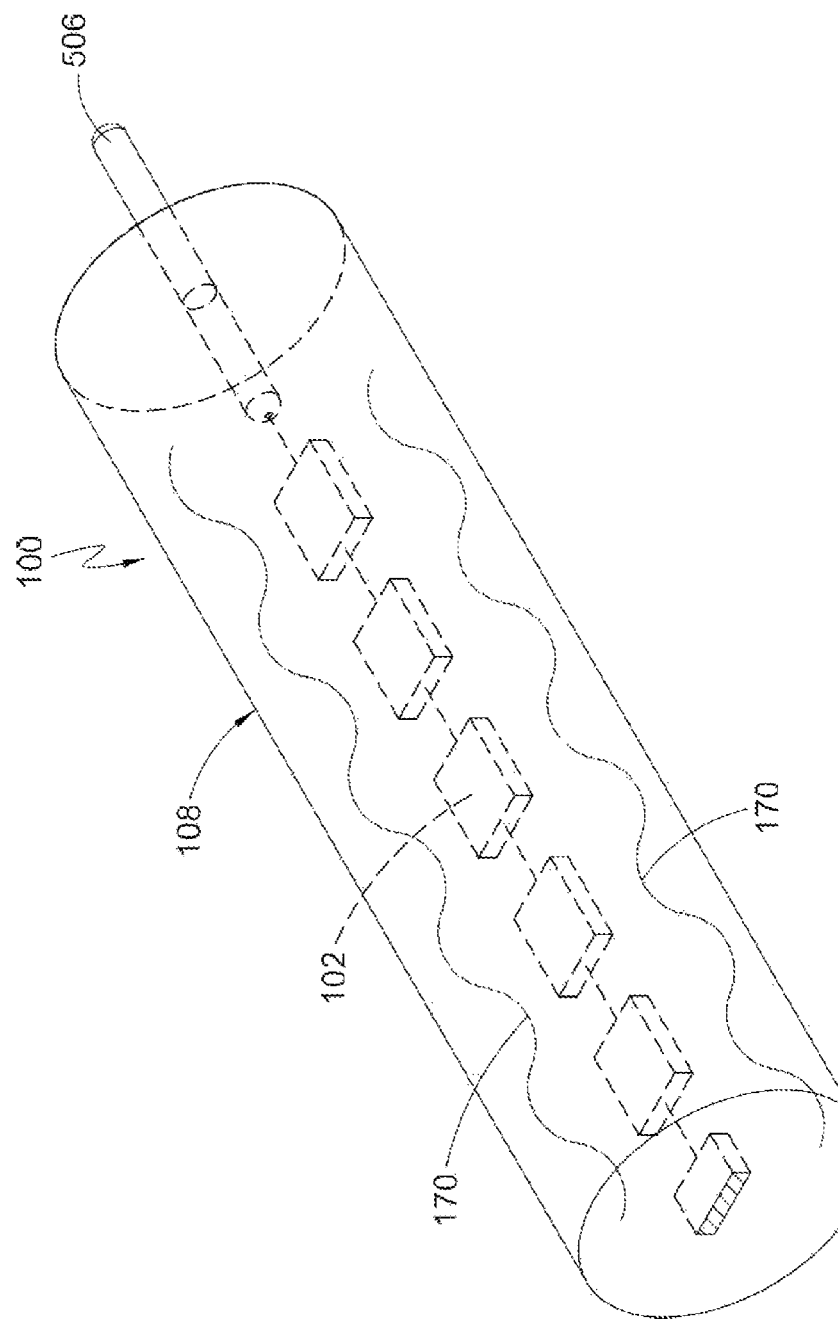
Figure 20C:
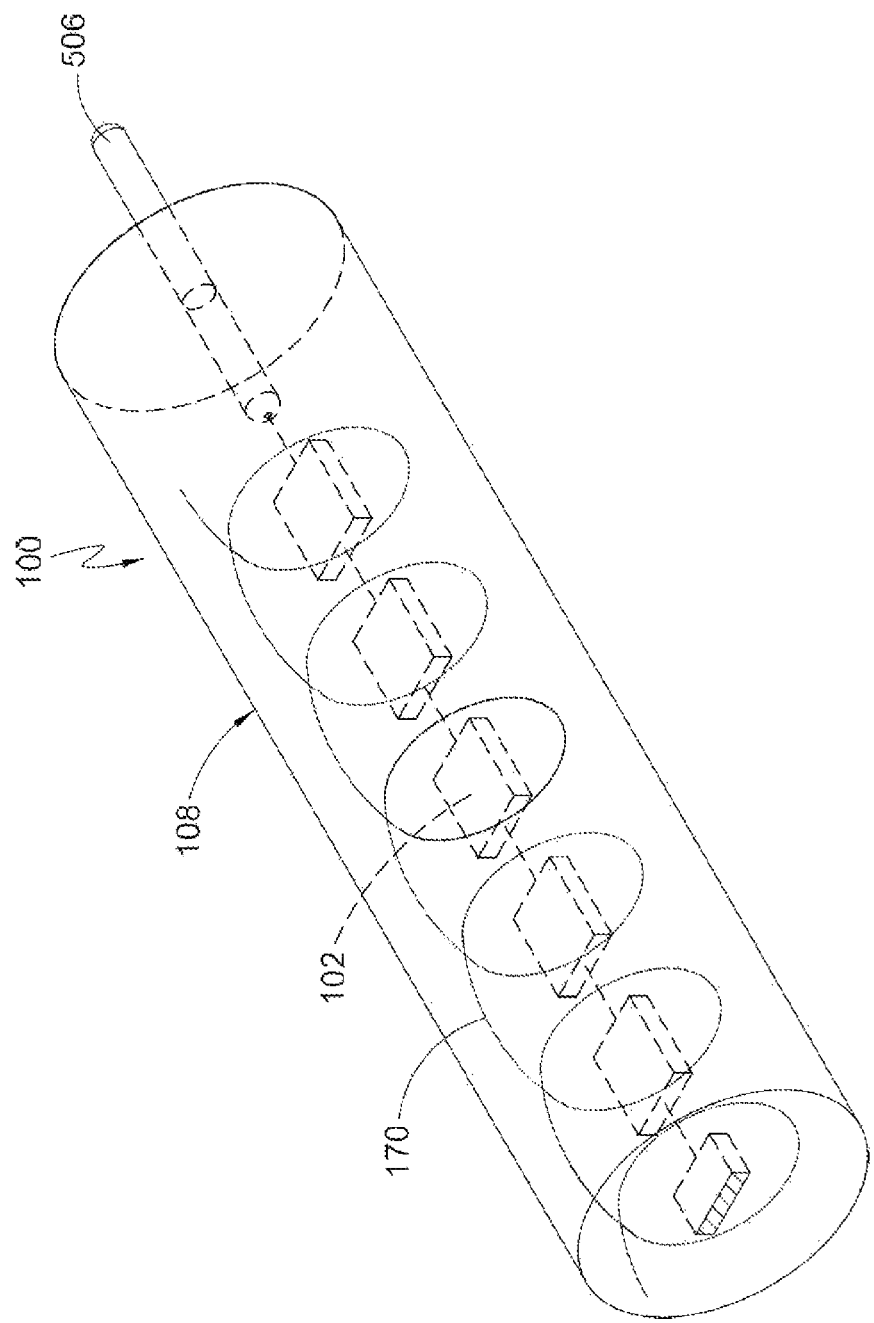
Figure 20D:
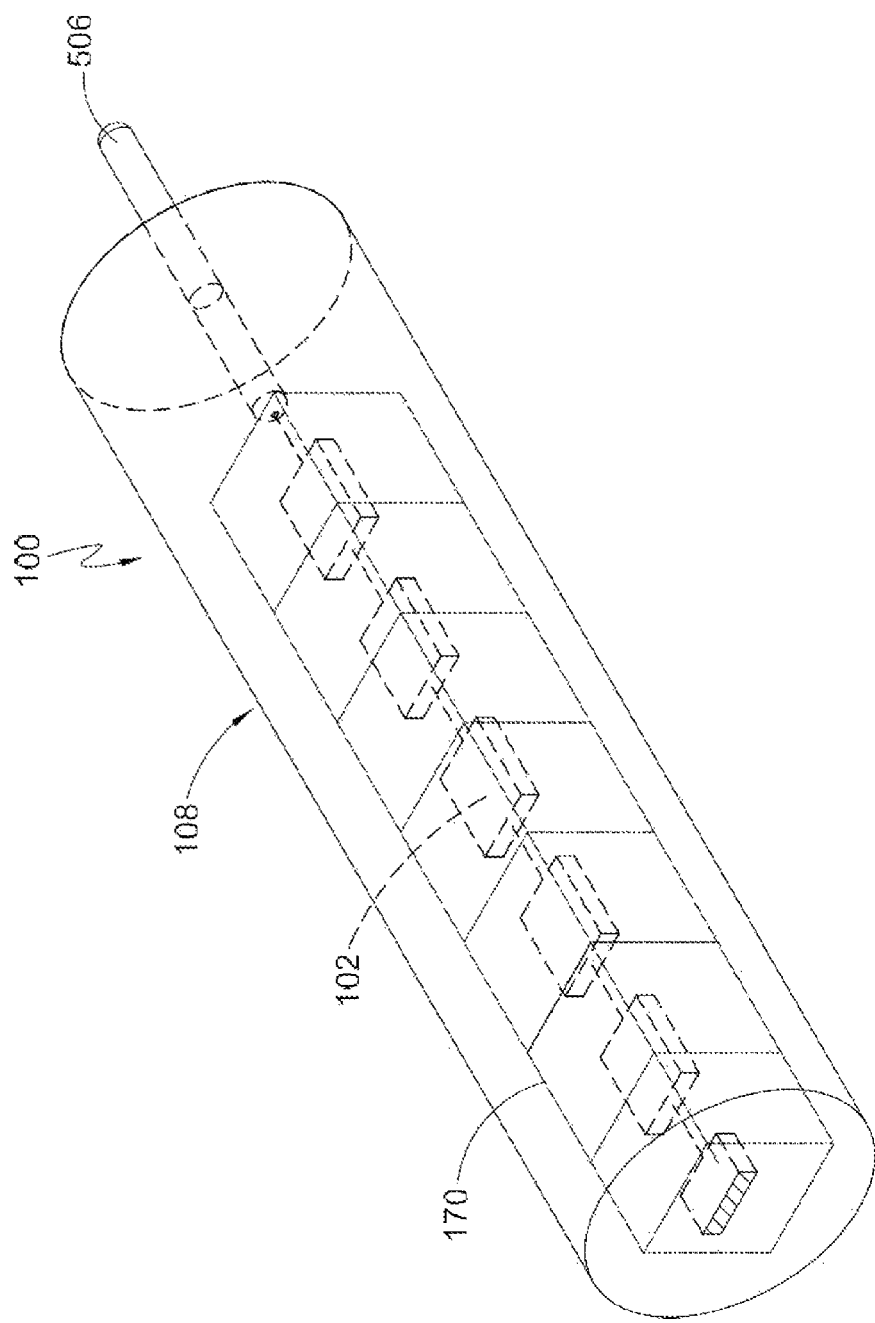
Figure 20E:
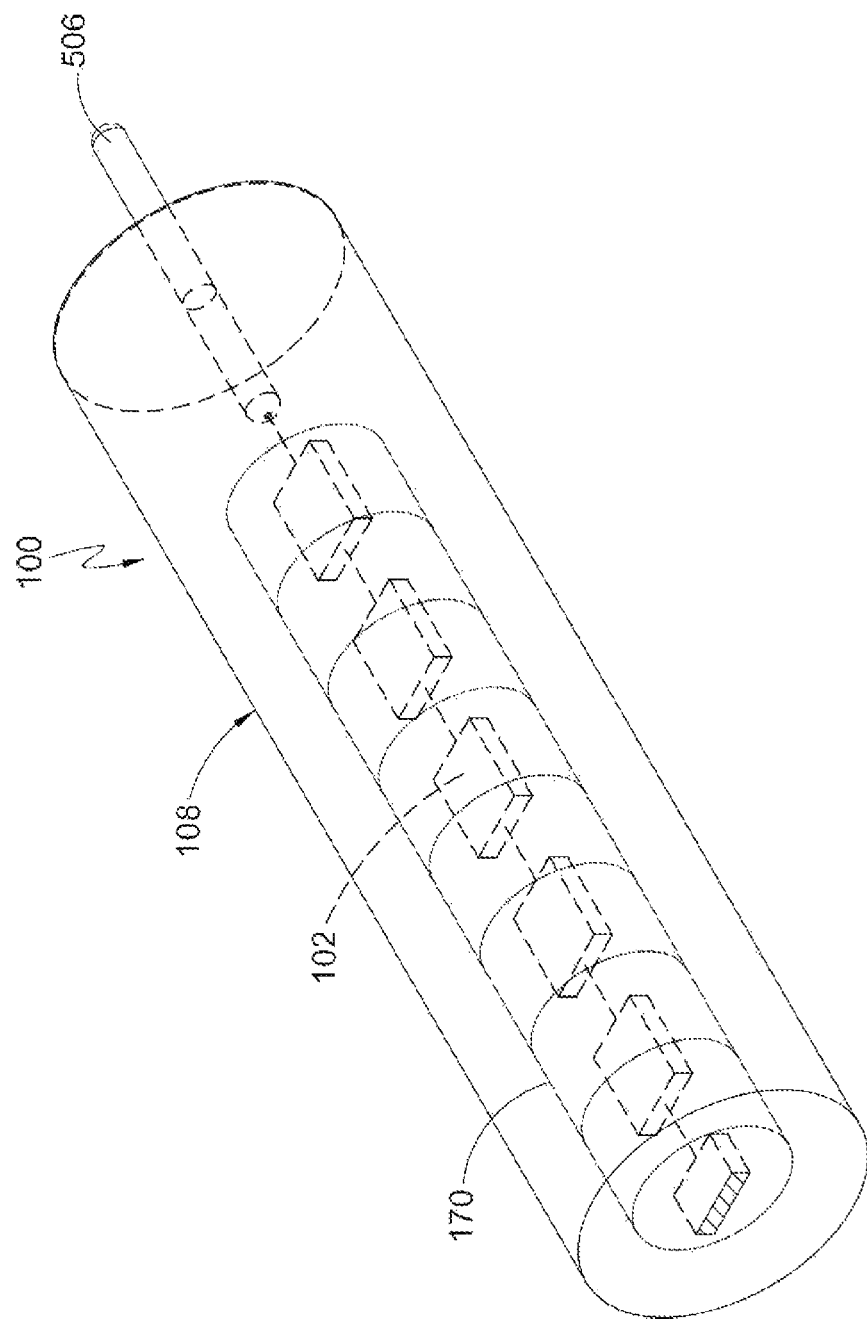

In another embodiment, the posture maintainer includes a wire system embedded in the transparent binder to reinforce the enclosure comprising primarily elastic binder materials such as silicone or resin. The wire is made from resilient materials such as copper and glass fiber and preferably light transmissive materials such as nanotubes. FIGS. 20A to 20E are perspective views of a truncated LED filament 100 in accordance with an exemplary embodiment of the present invention. The wire system 170 comes in many structures of 2-D (e.g. FIGS. 20A to 20B) or 3-D (e.g. FIGS. 20C to 20E) depending on the application. In FIG. 20A, the wire system 170 includes a simple set of straight wires extending longitudinally in the enclosure 108 of the LED filament 100. In FIG. 20B, the wire system 170 includes a set of sinuous springs extending longitudinally in the enclosure 108. In FIG. 20C, the wire system 170 includes a helical spring extending longitudinally in the enclosure 108 of the LED filament 100. In FIGS. 20D and 20E, the wire system 170 includes a grid structure extending in the enclosure 108 along the longitudinally axis of the LED filament 100. In FIG. 20D, the wire system 170 includes a rectilinear grid extending in the enclosure 108 along the longitudinally axis of the LED filament 100. In FIG. 20E, the wire system 170 includes a curvilinear grid extending in the enclosure 108 along the longitudinally axis of the LED filament 100. Related features may be referred to FIG. 55 to FIG. 55F in application of U.S. Ser. No. 15/499,143 filed Apr. 27, 2017.

Figure 20F:
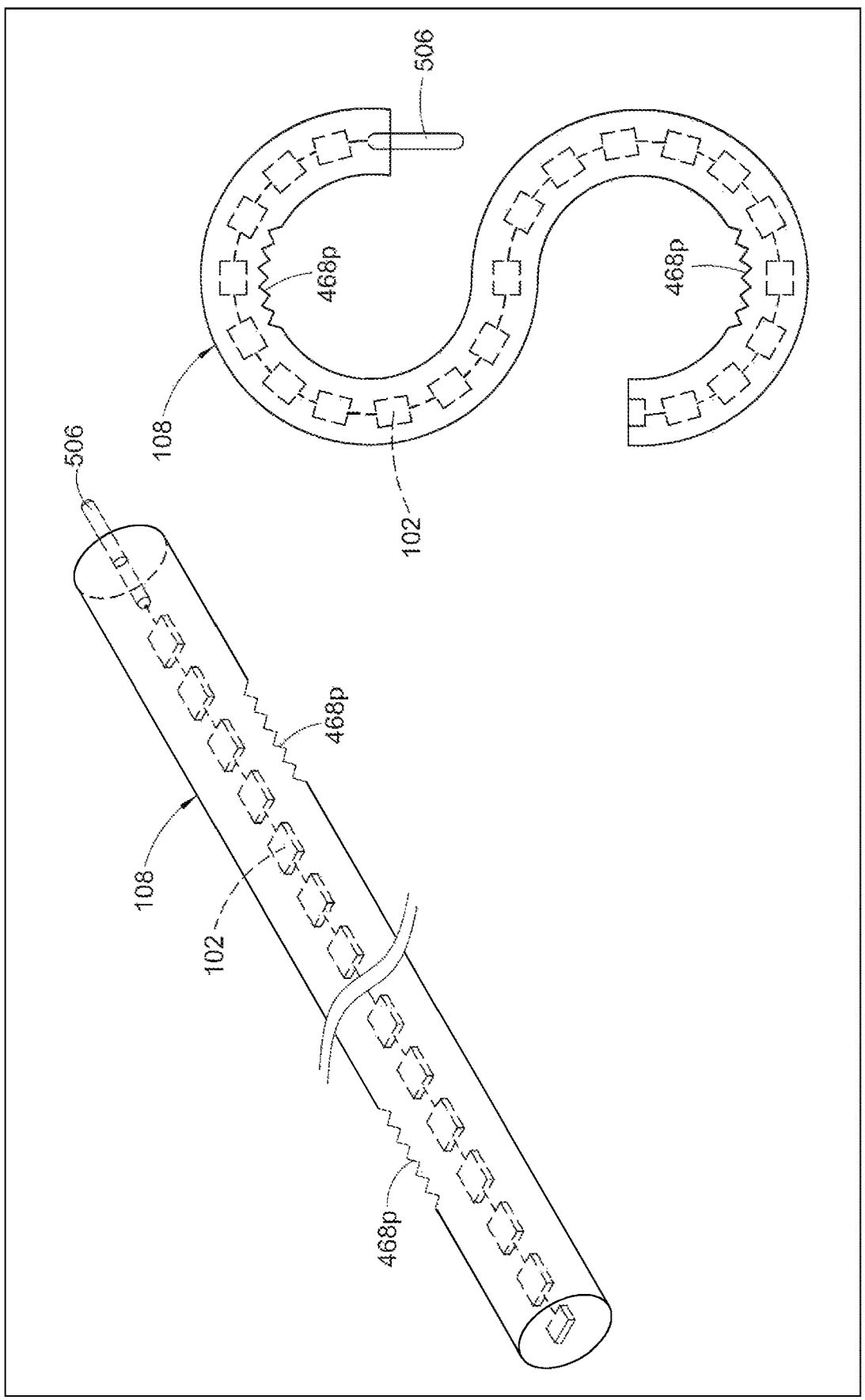
FIGS. 20F and 20G show schematic views of the LED filament when it is straight and when it is bent in accordance with an exemplary embodiment of the present invention.
Figure 20G:
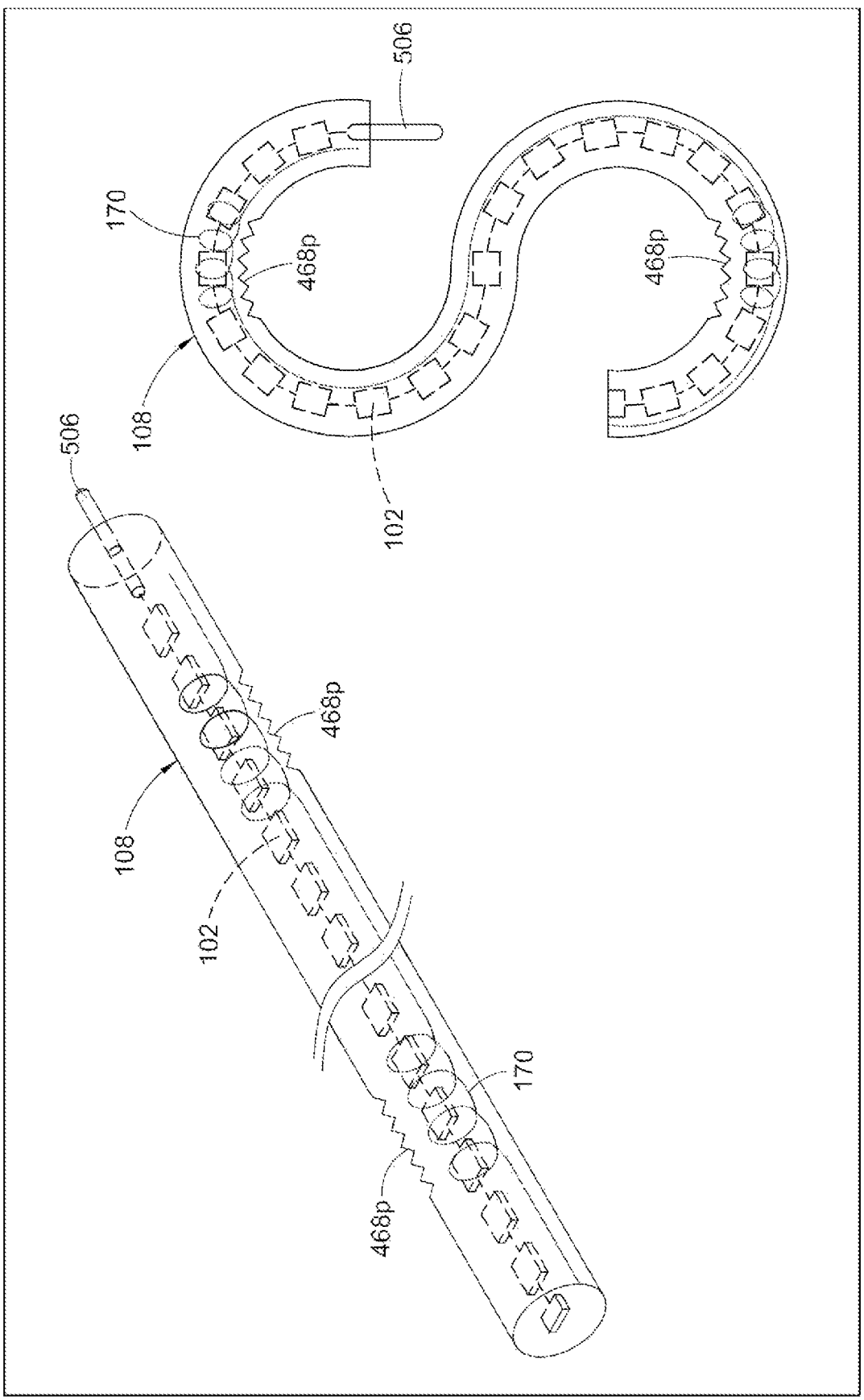

In yet another embodiment, the posture maintainer includes an aperture system beneath the surface of the enclosure where tight turns are planned for the posture the LED filament is expected to maintain in an application. FIGS. 20G and 20F show a truncated LED filament, when it is left straight and when it is bent to maintain a posture in the LED light bulb, in accordance with an exemplary embodiment of the present invention. In FIG. 20F, for example, the LED filament 100 is expected to maintain an S-shaped posture. A set of apertures 468p is deployed at the inner part of the enclosure 108 where the tight turn is planned. The set of apertures 468p makes it easier for the LED filament 100 to maintain the S-shaped posture by accommodating compression at the inner part of the tight turn. In some embodiments, the posture maintainer includes a combination of the structures illustrated above. In FIG. 20G, the posture maintainer includes a combination of wire system 170 and aperture 468p. The wire system includes a straight wire and a helical spring. The helical spring is deployed in the wire system 170 only where tight turns are planned for the posture the LED filament 100 is expected to maintain in an application. Otherwise, only the straight wire is deployed. A set of apertures 468p is deployed at the inner part of the enclosure 108 where a tight turn is planned. Related features may be referred to FIG. 57A, 57B in application of U.S. Ser. No. 15/499,143 filed Apr. 27, 2017.

Figure 21C:
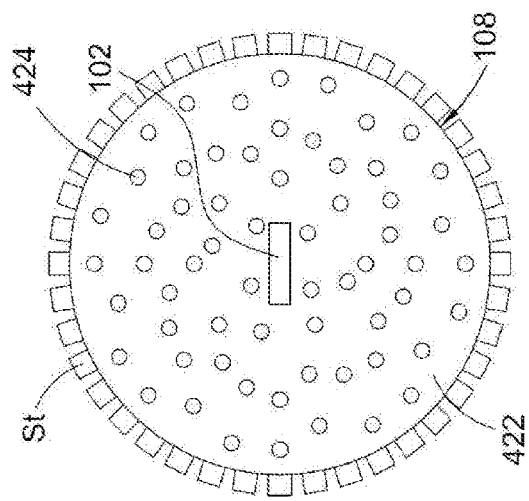
FIGS. 21A to 21C show a cross section of the LED filament in accordance with an exemplary embodiment of the present invention.
Figure 21B:
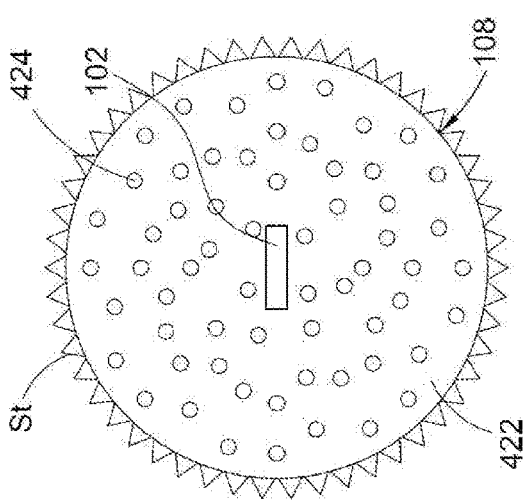
Figure 21A:
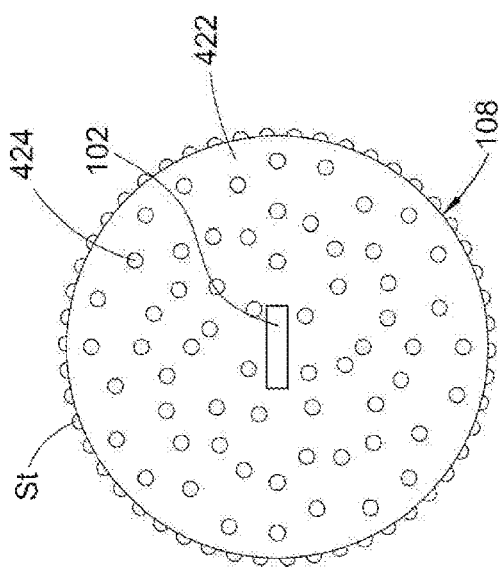

In an embodiment, the outer surface of the enclosure is provided by a polished layer. An LED filament having a glossy finish may be aesthetically appealing to some people. However, the LED filament may suffer from total internal reflection or poor heat dissipation. In another embodiment, the outer surface of the enclosure is provided by a texturized layer. The texturized layer improves light extraction by reducing total internal reflection. The texturized layer enhances heat dissipation by providing the enclosure with a greater surface area than a polished layer does. FIGS. 21A, 21B and 21C show a cross section of the LED filament in accordance with an exemplary embodiment of the present invention. In FIG. 21A, for example, the textured layer St is formed by a sufficient concentration of the light conversion particles 424 found close to but bulging from the outer surface of the enclosure 108. By contrast, in FIGS. 21B and 21C, the enclosure 108 includes a dedicated texturized layer St having different patterns such as wedge (FIG. 21B) and cube (FIG. 21C).

Figure 17:
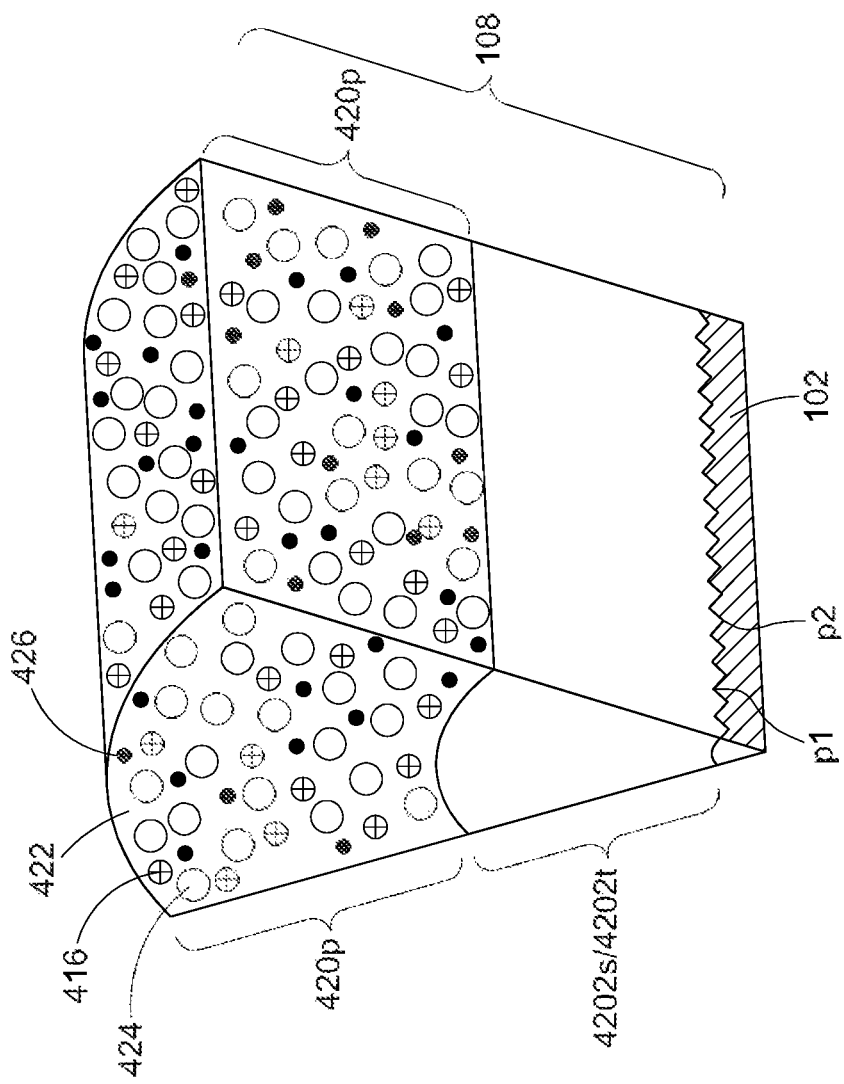
FIG. 17 shows a cutaway from the LED filament in FIG. 13 in accordance with an exemplary embodiment of the present invention.

Yttrium aluminum garnet (YAG), typically having a refractive index (RI) of about 1.8, is an example of a common phosphor that may be used. The RI of the phosphor particles and the RI of the binder material can be the same or different. In an embodiment, the binder material includes a transparent material having an RI that is substantially matched to that of the wavelength conversion particles embedded therein. For example, the binder material includes a high-index silicone having an RI of about 1.6 or greater. By providing the wavelength conversion particles in a substantially index-matched binder material, light scattering losses due to differences in the RI of the binder material and the wavelength conversion particles can be reduced or eliminated. FIG. 17 shows a cutaway from the LED filament in FIG. 13. In some embodiments, a plurality of nanoparticles 426 is embedded in the transparent binder 422 that formed the wavelength converter 420p. The nanoparticles 426 are dispersed throughout the transparent binder 422 of the wavelength converter 420p. By including nanoparticles 426 with a RI higher than that of the host medium—the transparent binder 422—the effective RI of the host medium is increased. The presence of nanoparticles 426 in the transparent binder 422 brings the RI of the transparent binder 422 (e.g., regular silicone with an RI of about 1.5) closer to the RI of the phosphor particles 424 (with an RI of about 1.8). When these two elements are not closely index-matched, the difference in RI results in light scattering because typical phosphor particles 424 are substantially larger (about 5.5 μm) than the wavelength of light emitted from the LED device 102 (450 nm for a blue LED). Light extraction efficiency increases when the difference in RI between the phosphor particle 424 and the transparent binder 422 is reduced. However, the efficiency only increases up to a point. If the effective RI of the transparent binder 422 gets too high, the light extraction efficiency will decrease due to total internal reflection at the flat interface of the wavelength converter 420p and any surrounding medium having a lower RI (e.g., silicone or air). An acceptable effective RI for the wavelength converter 420p is approximately 1.7, providing optimal index-matching with manageable levels of total internal reflection. The nanoparticles 426 may comprise several different materials such as $TiO_2$, $Al_2O_3$, $SiO_3$, $ZrO_2$, CaO, SrO, BaO, diamond, silicon carbide and silicon nanoparticles. The RI of both $TiO_2$ and diamond is approximately 2.5. The volume of nanoparticles 426 that is needed to adjust the effective RI of the wavelength converter 420p by a certain amount can be easily calculated using Vegard's Law which states that the relationship between volume and RI is linear. For example, if the wavelength converter 1604 material has a RI of 1.5 and the target effective RI is 1.7, then the wavelength converter 420p should comprise approximately 20% $TiO_2$ nanoparticles by volume. Other material combinations and compositions may also be used. For example, some embodiments may have greater than 5% nanoparticles 426 by volume. Other embodiments may have greater than 10% nanoparticles 426 by volume. Still other embodiments may include 20-40% by volume. The concentration of the nanoparticles 426 depends on such factors as the material being used and the desired RI adjustment.

Staying on FIG. 17, sometimes it is desirable to load the wavelength converter 420p with a high volume of light conversion particles 424. There would be less space in the wavelength converter 420p for nanoparticles 426. As discussed above, the nanoparticles 426 are used to adjust the effective RI of the wavelength converter 420p. When the nanoparticles 426 do not produce a large enough RI shift in the wavelength converter 420p, the spacer 4202s can compensate for those cases. In addition to shifting RI, the spacer 4202s, when interposed between the LED device 102 and the wavelength converter 420p, enables a uniform thickness of the wavelength converter 420p to produce uniform white light, which entails a proper combination of blue light and the phosphor light. However, a variety of factors cause the thickness of the wavelength converter 420p to be uneven when the wavelength converter 420p is disposed directly over the LED device 102. The surface of the LED device might be, intentionally or unintentionally, uneven. For example, in FIG. 17, the wavelength converter 420p, if disposed directly over the LED device 102, would be thinner at the point p1 than at the point p2 when the surface of the LED device 102 is texturized. Moreover, the array of LED devices 102 does not define a perfectly even interface for the wavelength converter 420p to sit on. Related features may be referred to FIG. 59A to FIG. 59C in application of U.S. Ser. No. 15/499,143 filed Apr. 27, 2017.

Figure 18:
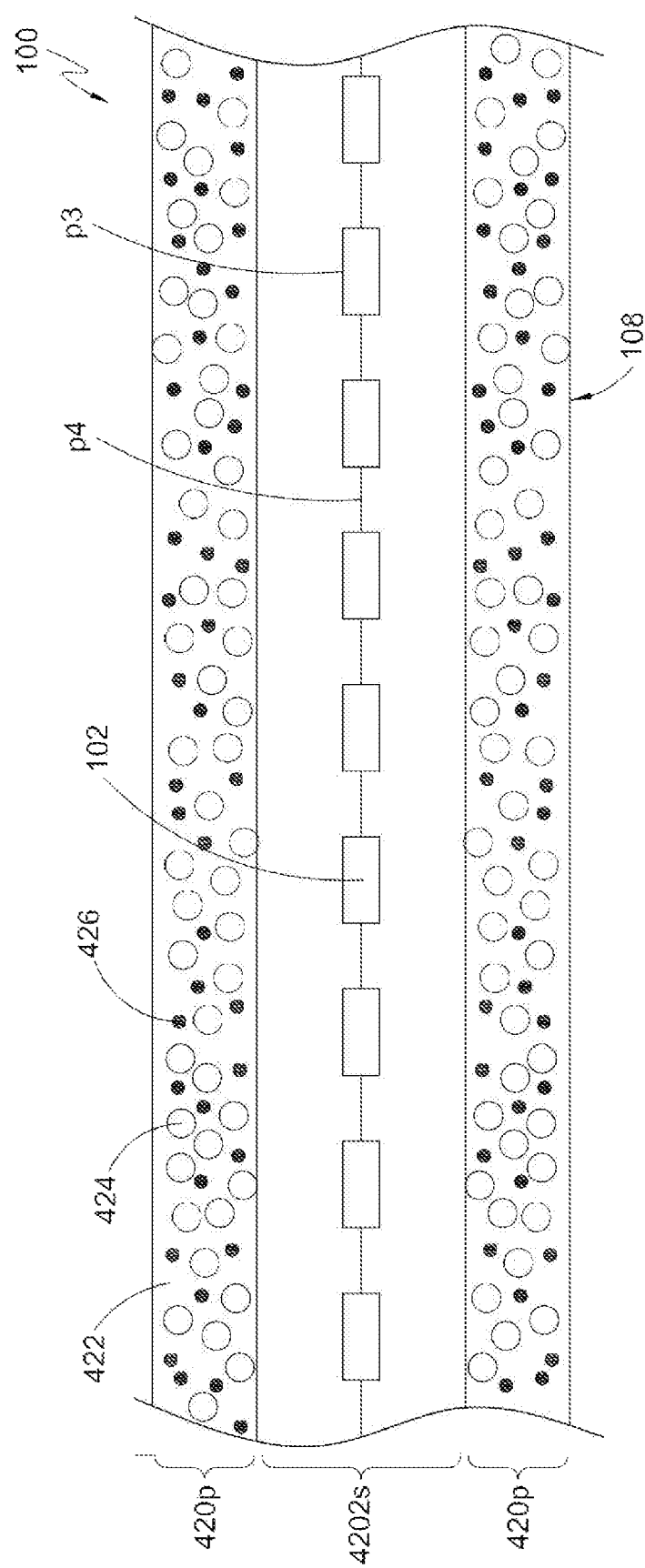
FIG. 18 shows a radial section of the truncated LED filament in accordance with an exemplary embodiment of the present invention.

FIG. 18 is a cross section of a truncated LED filament 100 cut along its longitudinal axis. In FIG. 18, for example, the wavelength converter 420p, if directly disposed over the linear array of LED devices 102, would be thinner at the point p3 than at the point p4. Where the wavelength converter 420p is relatively thin, blue light would dominate because there would be insufficient contribution of light from the phosphors. The spacer 4202s in FIGS. 17 and 18 eliminates the problem by forming a level interface for the wavelength converter 420p to sit on. The spacer 4202s can be made of many different materials such as silicone, epoxy, oil, dielectrics, and other materials. The material should be chosen such that the RI of the spacer 4202s is smaller than the RI of the LED device 102 and the RI of the wave length converter 1604. A portion of the light that enters the spacer 4202s is then incident on the interface between the spacer 4202s and the wavelength converter 420p. At the interface the light sees a step-up in RI and passes into wavelength converter 420p with minimal reflection. If the light is reflected or backscattered in the wavelength converter 420p, it will see the RI step-down at the spacer 4202s interface and has a finite chance of being reflected back into the wavelength converter 420p because of the TIR phenomenon.

Referring to FIGS. 16 and 17, index-matching the transparent binder 422 with the phosphor particles 424 reduces scattering within the wavelength converter 420p. However, such reduction in scattering adversely affects the uniformity of the color temperature distribution in the LED filament. To mitigate the negative effect, a light scatterer 4202t, e.g. light scattering particles (LSPs) 416, is disposed proximate to the LED device 102. The LSPs 416 are distributed around the LED device 102 so that the individual photons are redirected before they are emitted to randomize the point where they exit the enclosure 108. This has the effect of evening out the color temperature distribution such that an outside observer sees roughly the same color over a broad range of viewing angles. The LSPs 416 should have a high RI relative to the surrounding medium, creating a large RI differential between the materials. Because the RI differential causes refraction, it would also be possible to use an LSP material that has a low RI relative to the surrounding medium. The LSPs 416 create localized non-uniformities in the medium that force the light to deviate from a straight path. When the light strikes one or more of the light scattering particles 416 the RI differential between the medium and the particles causes the light to refract and travel in a different direction. A large RI differential yields a more drastic direction change for an incident photon. For this reason, materials with a high RI work well in mediums such as silicone or epoxy. Another consideration when choosing a light scattering material is the optical absorbance of the material. Large particles backscatter more of the light inside the package before it can escape the device, decreasing the total luminous output of the device. Thus, preferred scattering particle 416 materials have a high RI relative to the medium and a particle size comparable to the wavelength of the light propagating through the host medium. Ideally, LSPs 416 ensure maximum forward or sideways scattering effect for a given spectrum while minimizing light loss due to backscattering and absorption. The LSPs 416 can comprise many different materials, e.g., silica gel, silicon nanoparticles and zinc oxide (ZnO). Various combinations of materials or combinations of different forms of the same material may be used to achieve a desired scattering effect. Various percentages of composition of the LSPs 416 can be used as dictated by the application. Depending on the materials used, the LSPs 416 will typically be found in concentrations ranging from 0.01% to 5% by volume. Other concentrations can be used; however, the loss due to absorption increases with the concentration of the scattering particles. Thus, the concentrations of the LSPs 416 should be chosen to maintain an acceptable loss figure. In some embodiments, the light scattering particles 416 have diameters that range from 0.1 µm to 2 µm. In some cases, it may be desirable to use LSPs 416 of different sizes. For example, in one embodiment a first plurality of LSPs 416 may comprise titania, silica and diamond, and a second plurality of LSPs 416 may comprise fused silica, titania and diamond. Many other combinations are possible to achieve a desired color temperature distribution.

Figure 22:
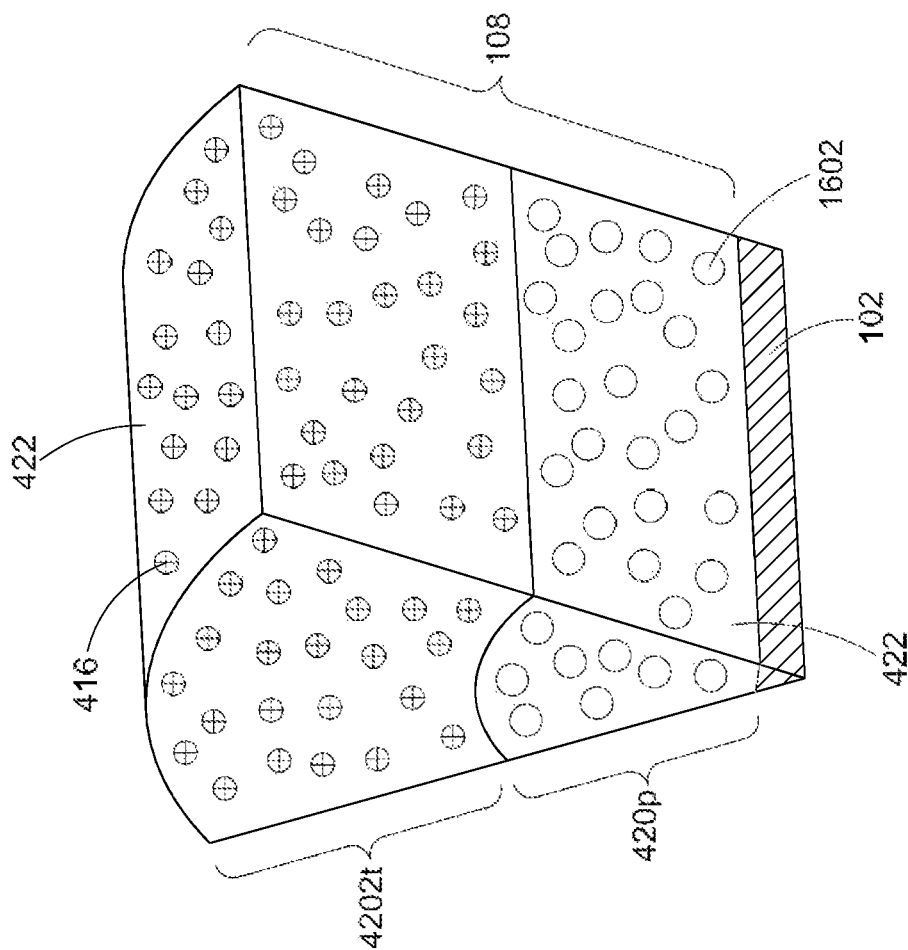
FIG. 22 shows a cutaway from the LED filament in FIG. 13 in accordance with an exemplary embodiment of the present invention.

The light scatterer, i.e. the LSPs, can be disposed anywhere in the LED filament so long as they are proximate to the LED device such that substantially all of the emitted light has a good probability of interacting with the LSPs. In FIGS. 16 and 17, the light scatterer 4202t and the wavelength converter 420p merge into one layer in the enclosure 108. The LSPs 416 are dispersed throughout the binder material 1600 along with the nanoparticles 426 and the phosphor particles 424. Because the light scatterer 4202t is disposed over the LED device 102, substantially all of the light travels through the wavelength light scatterer 4202t where the LSPs 416 are dispersed before egressing the enclosure 108. In other embodiments, the LSPs are dispersed throughout a binder material in a dedicated light scatterer disposed over the LED device. In FIG. 22, the wavelength converter 420p is sandwiched by the light scatterer 4202t and LED device 102. The LSPs 416 are dispersed in the light scatterer 4202t throughout the binder material (i.e. transparent binder) 422. Because the light scatterer 4202t is disposed all over the LED device 102, all of the light, converted by wavelength converter 420p, must subsequently travel through the light scatterer 4202t before egressing the enclosure 108.

In accordance with an exemplary embodiment of the claimed invention, the entire enclosure is a monolithic structure made from a single piece of light transmissive material. Other things equal, the enclosure is thus configured to have a greater structural integrity under stress than an enclosure assembled from parts. In some embodiments, the entire monolithic structure shares a uniform set of chemical and physical properties throughout the structure. In other embodiments, the monolithic structure exhibits diverse chemical or physical properties in an otherwise indivisible structure. For example, the monolithic structure includes a first region and a second region having a different set of properties (e.g. hardness, plasticity, thermal conductivity, thermal radiation power, wavelength conversion or other optical capability) from that of the first region. In accordance with an alternative embodiment of the claimed invention, the enclosure includes a set of otherwise divisible modules interconnected to form a unitary structure of the enclosure. Unlike a monolithic structure, the modules in the set are made separately and then the enclosure is assembled from the set of modules. Each module is tested separately before being brought together with other modules. Thus, a defective module is discarded and replaced with a good one without having to abandon the entire enclosure when made of a monolithic structure but unfortunately having a defect even though of a localized nature. A module usually exhibits a uniform set of properties throughout the module. Alternatively, a module possesses diverse sets of properties where desired. For example, the module includes a first region and a second region having a different set of properties (e.g. hardness, plasticity, thermal conductivity, thermal radiation power, wavelength conversion or other optical capability) from that of the first region.

Figure 23:
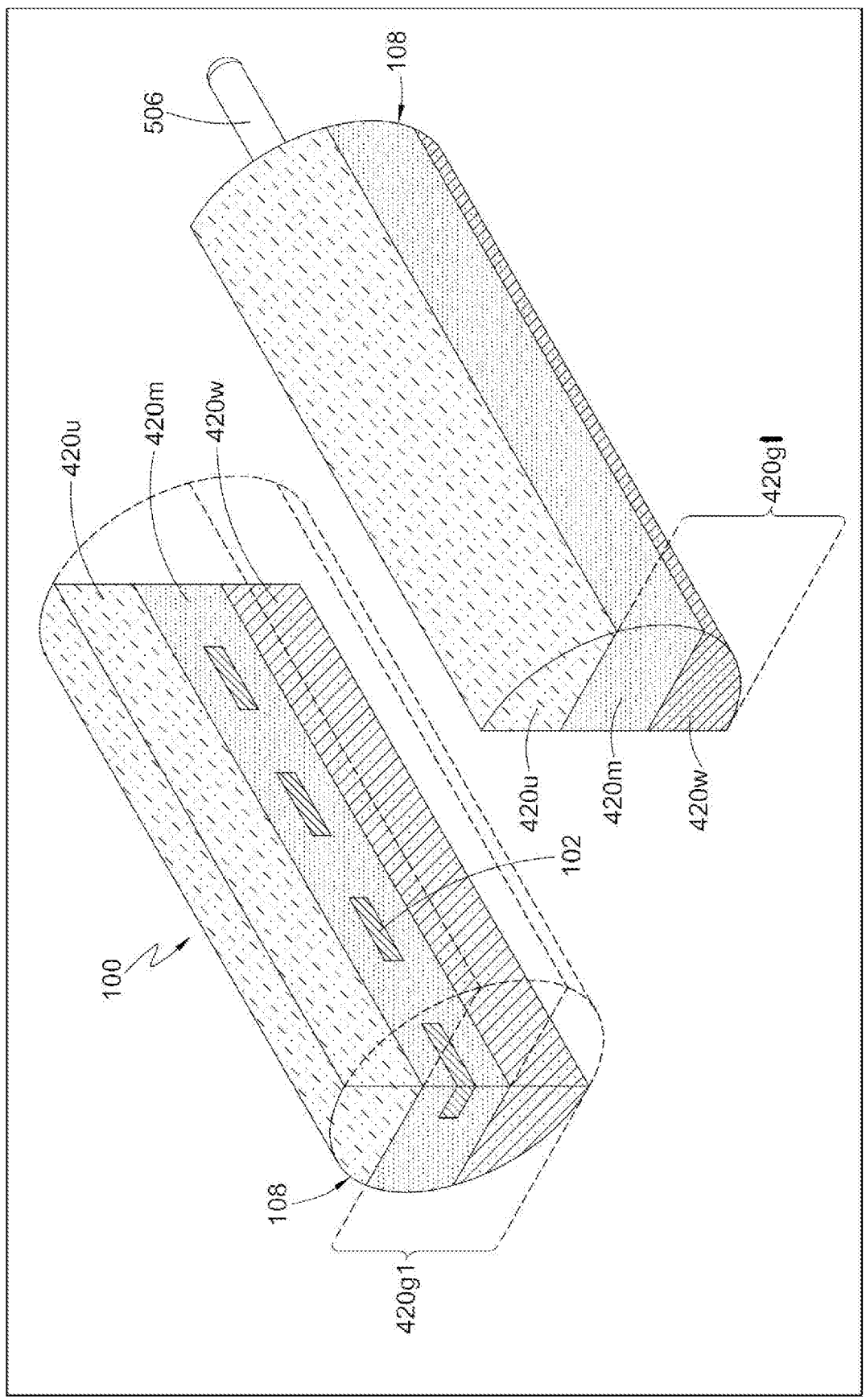
FIG. 23 shows a truncated LED filament cut into halves in accordance with an exemplary embodiment of the present invention.

In the embodiments where the enclosure is a monolithic structure exhibiting diverse chemical or physical properties in an otherwise indivisible structure, the enclosure includes a plurality of regions having distinctive properties to enable a desired totality of functions for the LED filament. The plurality of regions in the enclosure is defined in a variety of ways depending on applications. In FIG. 23, the truncated LED filament 100 is further sliced vertically—i.e. along the light illuminating direction of the linear array of LED devices 102—into equal halves along the longitudinal axis of the LED filament 100 to show its internal structure. The regions of the enclosure are defined by a hypothetical plane perpendicular to the light illuminating direction of the linear array of LED devices 102. For example, the enclosure 108 includes three regions, 420w, 420m, 420u defined by a hypothetical pair of planes compartmentalizing the enclosure 108 into an upper region 420u, a lower region 420w and a middle region 420m sandwiched by the upper region 420u and the lower region 420w. The linear array of LED devices 102 is disposed exclusively in one of the regions of the enclosure 108. Alternatively, the linear array of LED devices 102 is absent from at least one of the regions of the enclosure 108. Alternatively, the linear array of LED devices 102 is disposed in all regions of the enclosure 108. In FIG. 23, the linear array of LED devices 102 is disposed exclusively in the middle region 420m of the enclosure 108 and is spaced apart by the middle region 420m from the top region 420u and the lower region 420w. In an embodiment, the middle region 420m includes a wavelength converter for converting blue light emitting from the LED device 102 into white light. The upper region 420u includes a cylindrical lens for aligning the light beaming upwards. The lower region 420w includes a cylindrical lens for aligning the light beaming downwards. In another embodiment, the middle region 420m is made harder than the upper region 420u, the lower region 420w or both by, for example, embedding a greater concentration of phosphor particles in the middle region 420m than in the upper region 420u, the lower region 420w or both. The middle region 420m, because it is harder, is thus configured to better protect the linear array of LED devices 102 from malfunctioning when the LED filament 100 is bent to maintain a desired posture in a light bulb. The upper region 420*u* (or the lower region 420*w*) is made softer for keeping the entire LED filament 100 as bendable in the light bulb as it requires for generating omnidirectional light with preferably exactly one LED filament 100. In yet another embodiment, the middle region 420*m* has greater thermal conductivity than the upper region 420*u*, the lower region 420*w* or both by, for example, doping a greater concentration of nanoparticles in the middle region 420*m* than in the upper region 420*u*, the lower region 420*w* or both. The middle region 420*m*, having greater thermal conductivity, is thus configured to better protect the linear array of LED devices 102 from degrading or burning by removing excess heat from the LED device 102. The upper region 420*u* (or the lower region 420*w*), because it is spaced apart from the linear array of LED devices 102, plays a lesser role than the middle region 420*m* in cooling the LED device 102. The cost for making the LED filament 100 is thus economized when the upper region 420*u* (or the lower region 420*w*) is not as heavily doped with nanoparticles as the middle region 420*m*. The dimension of the middle region 420*m*, in which the linear array of LED devices 102 is exclusively disposed, in relation to the entire enclosure 108 is determined by a desired totality of considerations such as light conversion capability, bendability and thermal conductivity. Other things equal, the bigger the middle region 420*m* in relation to the entire enclosure 108, the LED filament 100 has greater light conversion capability and thermal conductivity but will be less bendable. A cross section perpendicular to the longitudinal axis of the LED filament 100 reveals the middle region 420*m* and other regions of the enclosure. R1 is a ratio of the area of the middle region 420*m* to the overall area of the cross section. Preferably, R1 is from 0.2 to 0.8. Most preferably, R1 is from 0.4 to 0.6.

Figure 24:
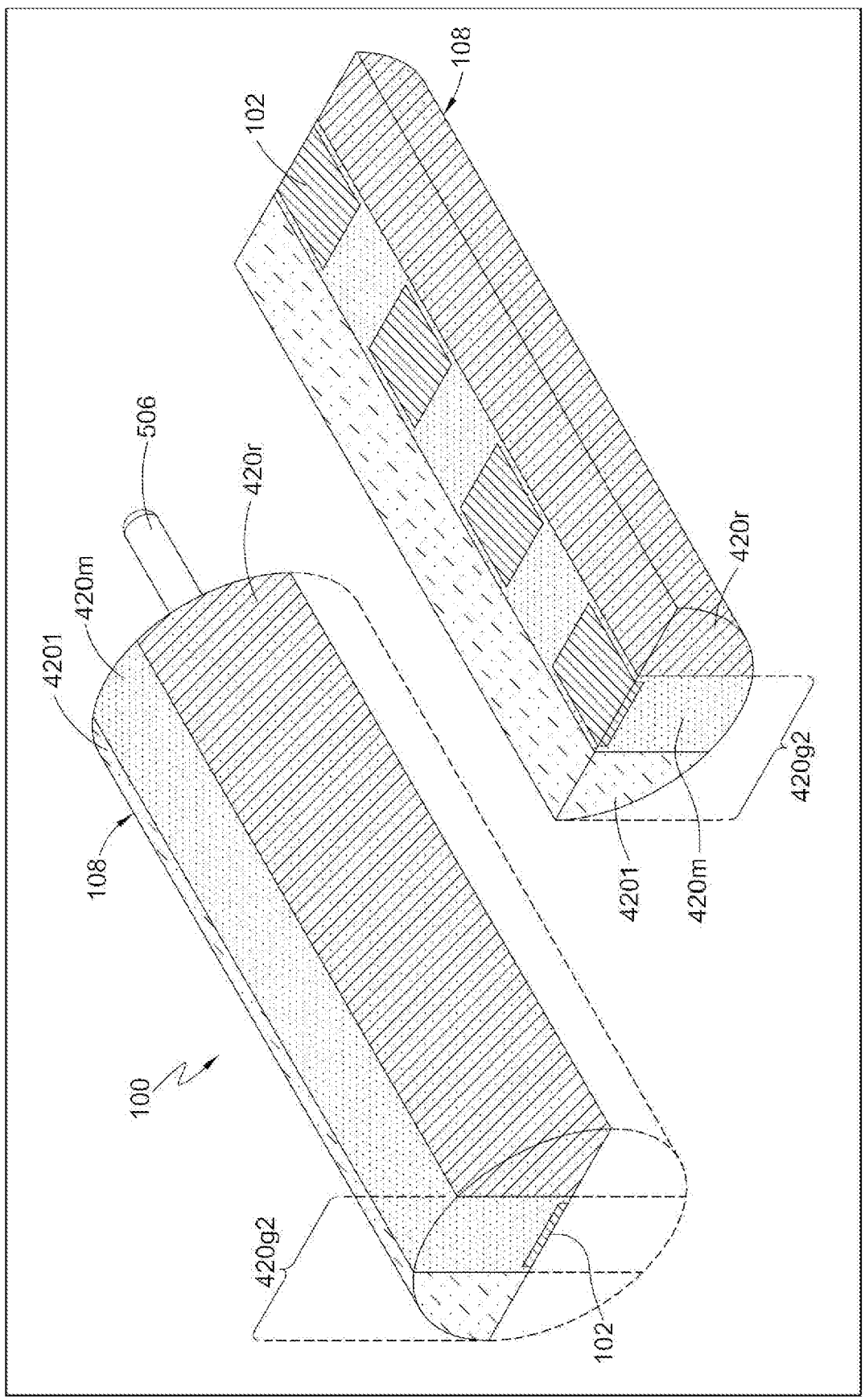
FIG. 24 shows a truncated LED filament cut into halves in accordance with an exemplary embodiment of the present invention.

In FIG. 24, the truncated LED filament 100 is further sliced horizontally—i.e. perpendicular to the light illuminating direction of the linear array of LED devices 102—into equal halves along the longitudinal axis of the LED filament 100 to show its internal structure. The regions of the enclosure 108 are defined by a hypothetical plane parallel to the light illuminating direction of the linear array of LED devices 102. For example, the enclosure 108 includes three regions 420*l*, 420*m*, 420*r* defined by a hypothetical pair of planes compartmentalizing the enclosure 108 into a right region 420*r*, a left region 420*l* and a middle region 420*m* sandwiched by the right region 420*r* and the left region 420*l*. The linear array of LED devices 102 is disposed exclusively in one of the regions of the enclosure 108. Alternatively, the linear array of LED devices 102 is absent from at least one of the regions of the enclosure 108. Alternatively, the linear array of LED devices 102 is disposed in all regions of the enclosure 108. In FIG. 24, the linear array of LED devices 102 is disposed exclusively in the middle region 420*m* of the enclosure 108 and is spaced apart by the middle region 420*m* from the right region 420*r* and the left region 420*l*. In an embodiment, the middle region 420*m* includes a wavelength converter for converting blue light emitting from the LED device 102 into white light. The right region 420*r* includes a cylindrical lens for aligning the light beaming rightwards. The left region 420*l* includes a cylindrical lens for aligning the light beaming leftwards. In another embodiment, the middle region 420*m* is made harder than the right region 420*r*, the left region 420*l* or both by, for example, embedding a greater concentration of phosphor particles in the middle region 420*m* than in the right region 420*r*, the left region 420*l* or both. The middle region 420*m*, because it is harder, is thus configured to better protect the linear array of LED devices 102 from malfunctioning when the LED filament 100 is bent to maintain a desired posture in a light bulb. The right region 420*r* (or the left region 420*l*) is made softer for keeping the entire LED filament 100 as bendable in the light bulb as it requires for generating omnidirectional light with, preferably, exactly one LED filament 100. In yet another embodiment, the middle region 420*m* has greater thermal conductivity than the right region 420*r*, the left region 420*l* or both by, for example, doping a greater concentration of nanoparticles in the middle region 420*m* than in the right region 420*r*, the left region 420*l* or both. The middle region 420*m*, having greater thermal conductivity, is thus configured to better protect the linear array of LED devices 102 from degrading or burning by removing excess heat from the LED device 102. The right region 420*r* (or the left region 420*l*), because it is spaced apart from the linear array of LED devices 102, plays a lesser role than the middle region 420*m* in cooling the LED device 102. The cost for making the LED filament 100 is thus economized when the right region 420*r* (or the left region 420*l*) is not as heavily doped with nanoparticles as the middle region 420*m*. The dimension of the middle region 420*m*, in which the linear array of LED devices 102 is exclusively disposed, in relation to the entire enclosure 108 is determined by a desired totality of considerations such as light conversion capability, bendability and thermal conductivity. Other things equal, the bigger the middle region 420*m* in relation to the entire enclosure 108, the LED filament 100 has greater light conversion capability and thermal conductivity but will be less bendable. A cross section perpendicular to the longitudinal axis of the LED filament 100 reveals the middle region 420*m* and other regions of the enclosure 108. R2 is a ratio of the area of the middle region 420*m* to the overall area of the cross section. Preferably, R2 is from 0.2 to 0.8. Most preferably, R2 is from 0.4 to 0.6.

Figure 25:
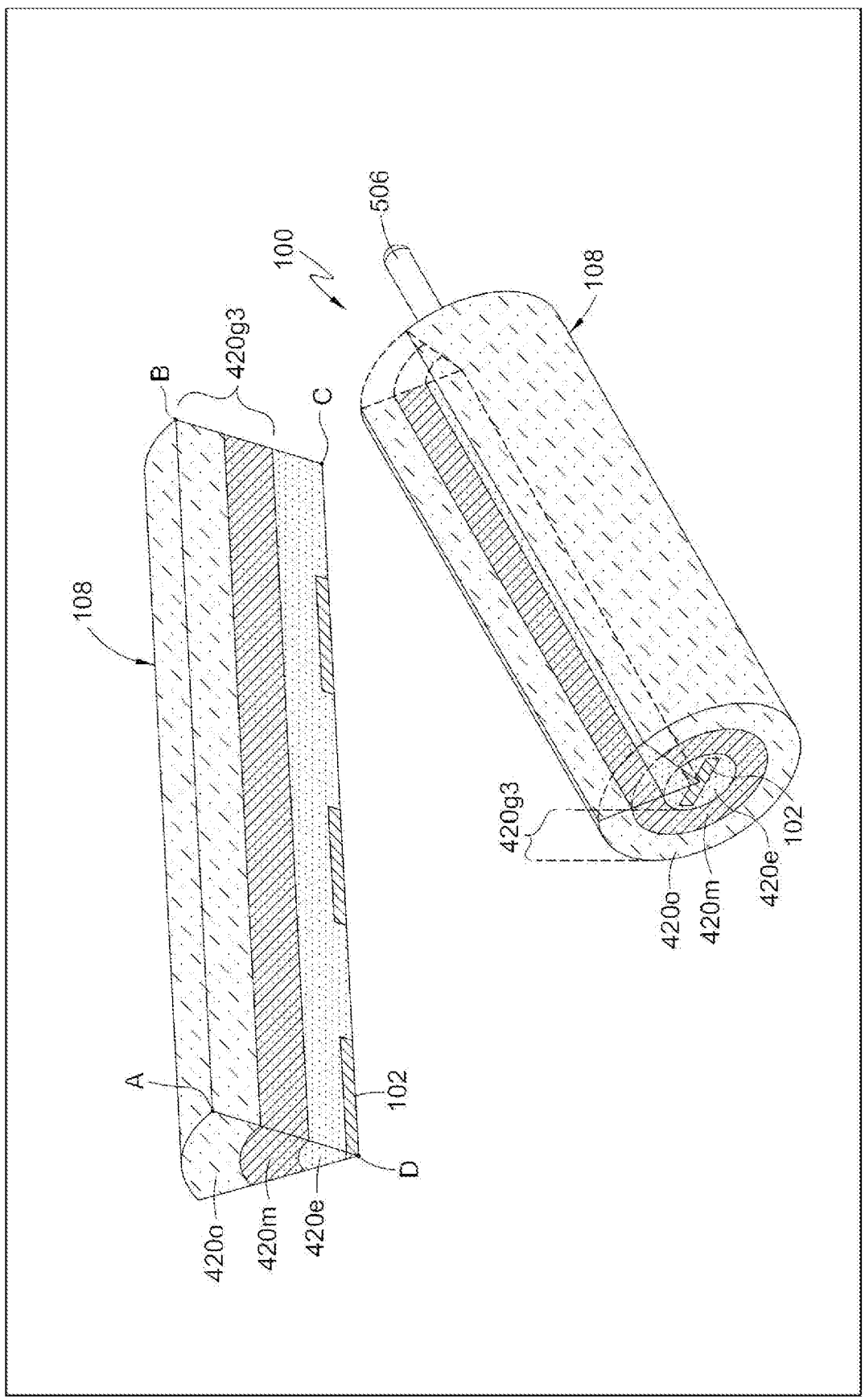
FIG. 25 shows a truncated LED filament carved into two portions in accordance with an exemplary embodiment of the present invention.

In FIG. 25, the truncated LED filament 100 is further carved into a small portion and a big portion to show its internal structure. The small portion is defined by revolving the rectangle ABCD around the line CD (i.e. the central axis of the LED filament 100) for a fraction of 360 degrees. Likewise, the big portion is defined by revolving the rectangle ABCD around the line CD but for the entirety of 360 degrees except for the space taken by the small portion. The regions of the enclosure 108 are defined by a hypothetical cylindrical surface having the central axis of the LED filament 100 as its central axis. For example, the enclosure 108 includes three regions 420*e*, 420*m*, 420*o* defined by a hypothetical pair of coaxial cylindrical surfaces compartmentalizing the enclosure 108 into a core region 420*e*, an outer region 420*o* and a middle region 420*m* sandwiched by the core region 420*e* and the outer region 420*o*. The linear array of LED devices 102 is disposed exclusively in one of the regions of the enclosure 108. Alternatively, the linear array of LED devices 102 is absent from at least one of the regions of the enclosure 108. Alternatively, the linear array of LED devices 102 is disposed in all regions of the enclosure 108. In FIG. 25, the linear array of LED devices 102 is disposed exclusively in the core region 420*e* of the enclosure 108 and is spaced apart by the core region 420*e* from the middle region 420*m* and the outer region 420*o*. In an embodiment, the outer region 420*o* includes a light scatterer for increasing light extraction from the LED device 102 by reducing total internal reflection. The middle region 420*m* includes a wavelength converter for converting blue light emitting from the LED device 102 into white light. The core region 420*e* includes a spacer. The spacer prevents heat coming from the LED device 102 from quickly degrading the phosphor particle in the wavelength converter by keeping the phosphor particle apart from the LED device 102. Moreover, the spacer enables a uniform thickness of the middle region 420m, which includes the wavelength converter, to produce uniform white light, which entails a proper combination of blue light and the phosphor light. In another embodiment, the middle region 420m is made harder than the core region 420e, the outer region 420o or both by, for example, embedding a greater concentration of phosphor particles in the middle region 420m than in the core region 420e, the outer region 420o or both. The middle region 420m, because it is harder, is thus configured to better protect the linear array of LED devices 102 from malfunctioning when the LED filament 100 is bent to maintain a desired posture in a light bulb. The core region 420e (or the outer region 420o) is made softer for keeping the entire LED filament 100 as bendable in the light bulb as it requires for generating omnidirectional light with, preferably, exactly one LED filament 100. In yet another embodiment, the core region 420e has greater thermal conductivity than the middle region 420m, the outer region 420o or both by, for example, doping a greater concentration of such particles as nanoparticles, aluminium oxide, aluminium nitride and boron nitride in the core region 420e than in the middle region 420m, the outer region 420o or both. These particles are electrical insulators while having greater heat conductivity than phosphor particles. The core region 420e, having greater thermal conductivity, is thus configured to better protect the linear array of LED devices 102 from degrading or burning by removing excess heat from the LED device 102. The middle region 420m (or the outer region 420o), because it is spaced apart from the linear array of LED devices 102, plays a lesser role than the core region 420e in cooling the LED device 102 through heat conduction. The cost for making the LED filament 100 is thus economized when the outer region 420o (or the middle region 420m) is not as heavily doped with nanoparticles as the core region 420e. In still another embodiment, the outer region 420o has greater thermal radiation power than the middle region 420m, the core region 420e or both by, for example, doping a greater concentration of such particles as nanoparticles, graphene, nano-silver, carbon nanotube and aluminium nitride in the outer region 420o than in the middle region 420m, the core region 420e or both. These particles have greater thermal radiation power than the optically transmissive binder and greater thermal conductivity than phosphor particles. The outer region 420o, having greater thermal conductivity, is thus configured to better protect the linear array of LED devices 102 from degrading or burning by removing excess heat from the LED device 102. The core region 420e (or the outer region 420o), because of their weaker thermal radiation power, plays a lesser role than the outer region 420o in cooling the LED device 102 through thermal radiation. The cost for making the LED filament 100 is thus economized when the core region 420m (or the middle region 420m) is not as heavily doped with nanoparticles as the outer region 420o. These particles are electrical insulators while having greater heat conductivity than phosphor particles. The core region 420e, having greater thermal conductivity, is thus configured to better protect the linear array of LED devices 102 from degrading or burning by removing excess heat from the LED device 102. The middle region 420m (or the outer region 420o), because it is spaced apart from the linear array of LED devices 102, plays a lesser role than the core region 420e in cooling the LED device 102 through heat conduction. The cost for making the LED filament 100 is thus economized when the outer region 420o (or the middle region 420m) is not as heavily doped with nanoparticles as the core region 420e. To enhance the ability of the LED filament 100 to reveal colors of objects faithfully in comparison with an ideal or natural light source, in still another embodiment, the core region 420e has an excitation spectrum (and/or emission spectrum) induced at shorter wavelengths than the middle region 420m, the outer region 420o or both by, for example, doping a greater concentration of such particles as phosphors in the core region 420e than in the middle region 420m, the outer region 420o or both. The core region 420e is responsible for converting light coming from the LED device 102 at the ultraviolet range into the visible spectrum. Other regions 420m, 420o of the LED filament 100 are responsible for, by contrast, further converting light coming from the core region 420e into light having even longer wavelengths. In an embodiment, the core region 420e is doped with a greater concentration of phosphor particles than the middle region 420m, the outer region 420o or both. The middle region 420m, which is optional in some embodiments, includes a luminescent dye for converting light coming from the core region 420e into light having longer wavelengths and a lesser concentration of phosphor particles than the core region 420e. The outer region 420o includes a luminescent dye for converting light coming from the core region 420e into light having longer wavelengths but includes no phosphor particles for keeping high flexibility of the LED filament 100. The dimension of the core region 420e, in which the linear array of LED devices 102 is exclusively disposed, in relation to the entire enclosure 108 is determined by a desired totality of considerations such as light conversion capability, bendability and thermal conductivity. Other things equal, the bigger the core region 420e in relation to the entire enclosure 108, the LED filament 100 has less light conversion capability and thermal conductivity but will be more bendable. A cross section perpendicular to the longitudinal axis of the LED filament 100 reveals the core region 420e and other regions of the enclosure 108. R3 is a ratio of the area of the core region 420e to the overall area of the cross section. Preferably, R3 is from 0.1 to 0.8. Most preferably, R3 is from 0.2 to 0.5. The dimension of the middle region 420m, which includes the wavelength converter, in relation to the entire enclosure 108 is determined by a desired totality of considerations such as light conversion capability, bendability and thermal conductivity. Other things equal, the bigger the middle region 420m in relation to the entire enclosure 108, the LED filament 100 has greater light conversion capability and thermal conductivity but will be less bendable. A cross section perpendicular to the longitudinal axis of the LED filament 100 reveals the middle region 420m and other regions of the enclosure 108. R4 is a ratio of the area of the middle region 420m to the overall area of the cross section. Preferably, R4 is from 0.1 to 0.8. Most preferably, R4 is from 0.2 to 0.5.

Figure 26:
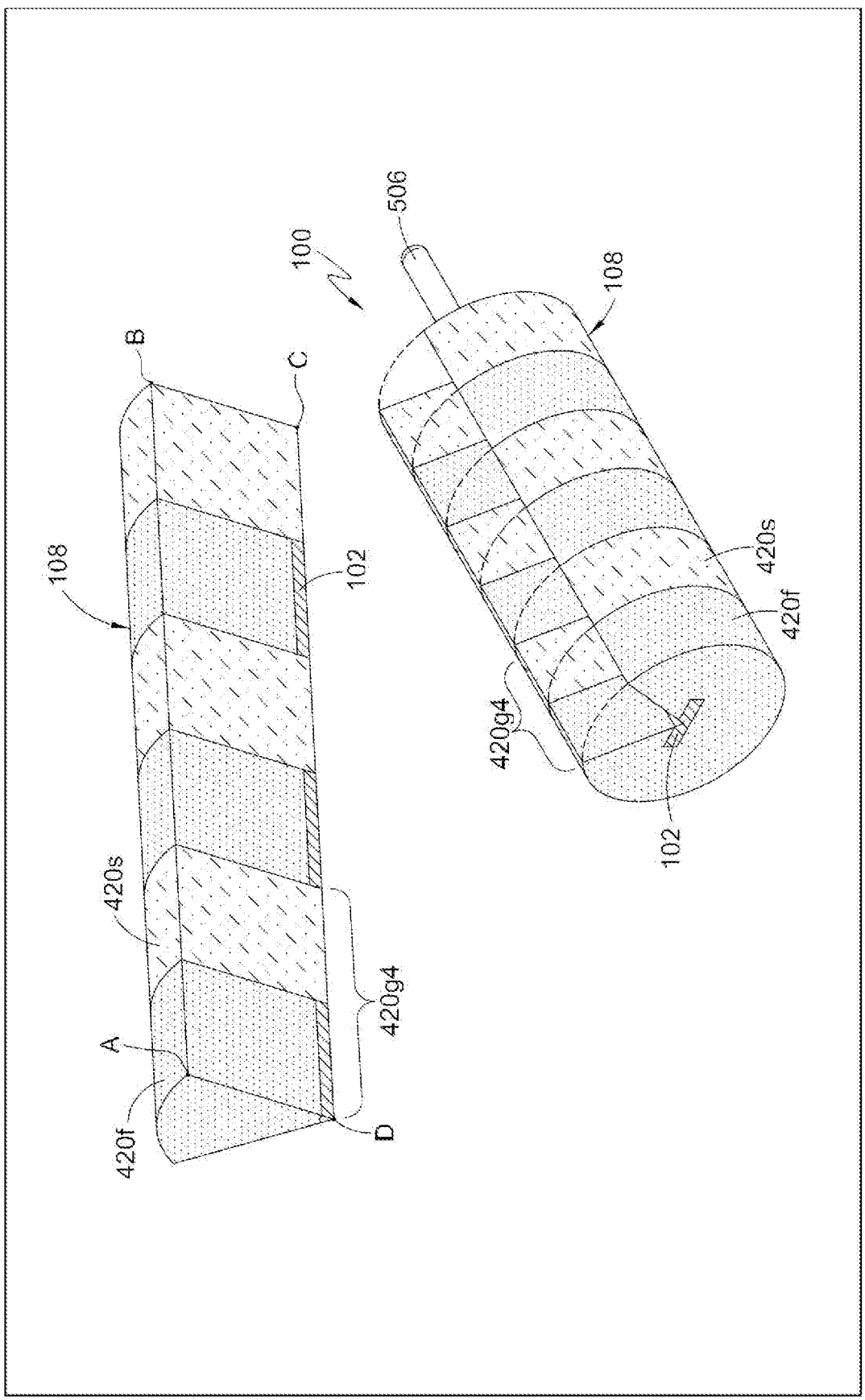
FIG. 26 shows a truncated LED filament carved into two portions in accordance with an exemplary embodiment of the present invention.

In FIG. 26, the truncated LED filament 100 is further carved into a small portion and a big portion to show its internal structure. Like FIG. 25, the small portion is defined by revolving the rectangle ABCD around the line CD (i.e. the central axis of the LED filament 100) for a fraction of 360 degrees. Likewise, the big portion is defined by revolving the rectangle ABCD around the line CD for the entirety of 360 degrees except for the space taken by the small portion. The regions of the enclosure 108 are defined by a hypothetical set of parallel planes intersecting the enclosure 108 perpendicularly to the longitudinal axis of the enclosure 108. For example, the enclosure 108 includes two alternating regions 420f, 420s, i.e. a first region 420f and a second region 420s, defined by the hypothetical set of parallel planes. In an embodiment, the hypothetical set of parallel planes intersect the enclosure 108 right at the edges of an LED device 102. The LED device 102 is disposed exclusively in the first region 420f. The means for electrically connecting the LED devices 102, e.g. the bond wire, is disposed exclusively in the second region 420s. In another embodiment, the hypothetical set of parallel planes intersect the enclosure 108 between the edges of an LED device 102. A portion of the LED device 102, excluding the edges, is disposed in the first region 420f; the other portion of the LED device 102, including the edges, is disposed in the second region 420s. A portion of the means for electrically connecting the LED devices 102, excluding the ends of the wiring, is disposed in the second region 420s; the other portion of the means for electrically connecting the LED devices 102, including the ends of the wiring, is disposed in the second region 420s. In yet another embodiment, the hypothetical set of parallel planes intersect the enclosure 108 at the space between adjacent LED devices 102. The LED device 102 is disposed exclusively in the first region 420f. A portion of the means for electrically connecting the LED devices 102, excluding the ends of the wiring, is disposed in the first region 420f; the other portion of the means for electrically connecting the LED devices 102, including the ends of the wiring, is disposed in the second region 420s. Depending on applications, the first region 420f is configured to have a different set of properties from that of the second region 420s. In an embodiment, the first region 420f is made harder than the second region 420s by, for example, embedding a greater concentration of phosphor particles in the first region 420f than in the second region 420s. The first region 420f, because it is harder, is thus configured to better protect the linear array of LED devices 102 from malfunctioning when the LED filament 100 is bent to maintain a desired posture in a light bulb. The second region 420s is made softer for keeping the entire LED filament 100 as bendable in the light bulb as it requires for generating omnidirectional light with, preferably, exactly one LED filament 100. In another embodiment, the first region 420f has greater thermal conductivity than the second region 420s by, for example, doping a greater concentration of nanoparticles in the first region 420f than in the second region 420s. The first region 420f, having greater thermal conductivity, is thus configured to better protect the linear array of LED devices 102 from degrading or burning by removing excess heat from the LED device 102. The second region 420s, because it is spaced apart from the linear array of LED devices 102, plays a lesser role than the first region 420f in cooling the LED device 102. The cost for making the LED filament 100 is thus economized when the second region 420s is not as heavily doped with nanoparticles as the first region 420f. The dimension of the first region 420f, in which the LED device 102 is disposed, in relation to the entire enclosure 108 is determined by a desired totality of considerations such as light conversion capability, bendability and thermal conductivity. Other things equal, the bigger the first region 420f in relation to the entire enclosure 108, the LED filament 100 has greater light conversion capability and thermal conductivity but will be less bendable. An outer surface of the enclosure 108 shows a combination of the first region 420f and other regions. R5 is a ratio of the total area of the first region 420f found on the outer surface of the enclosure 108 to the overall area of the outer surface of the enclosure 108. Preferably, R5 is from 0.2 to 0.8. Most preferably, R5 is from 0.4 to 0.6.

Figure 27:
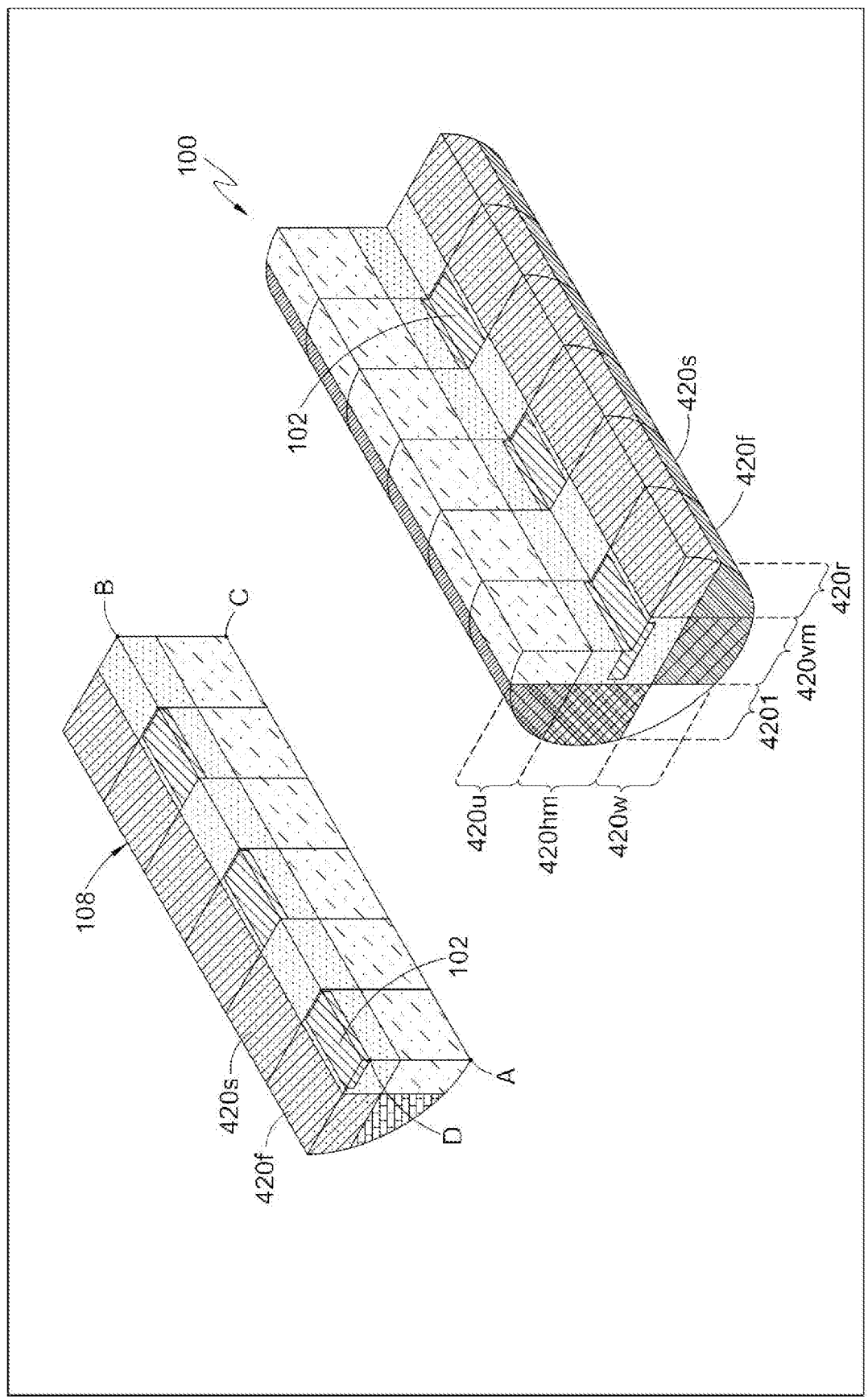
FIG. 27 shows a truncated LED filament carved into two portions in accordance with an exemplary embodiment of the present invention.
Figure 29:
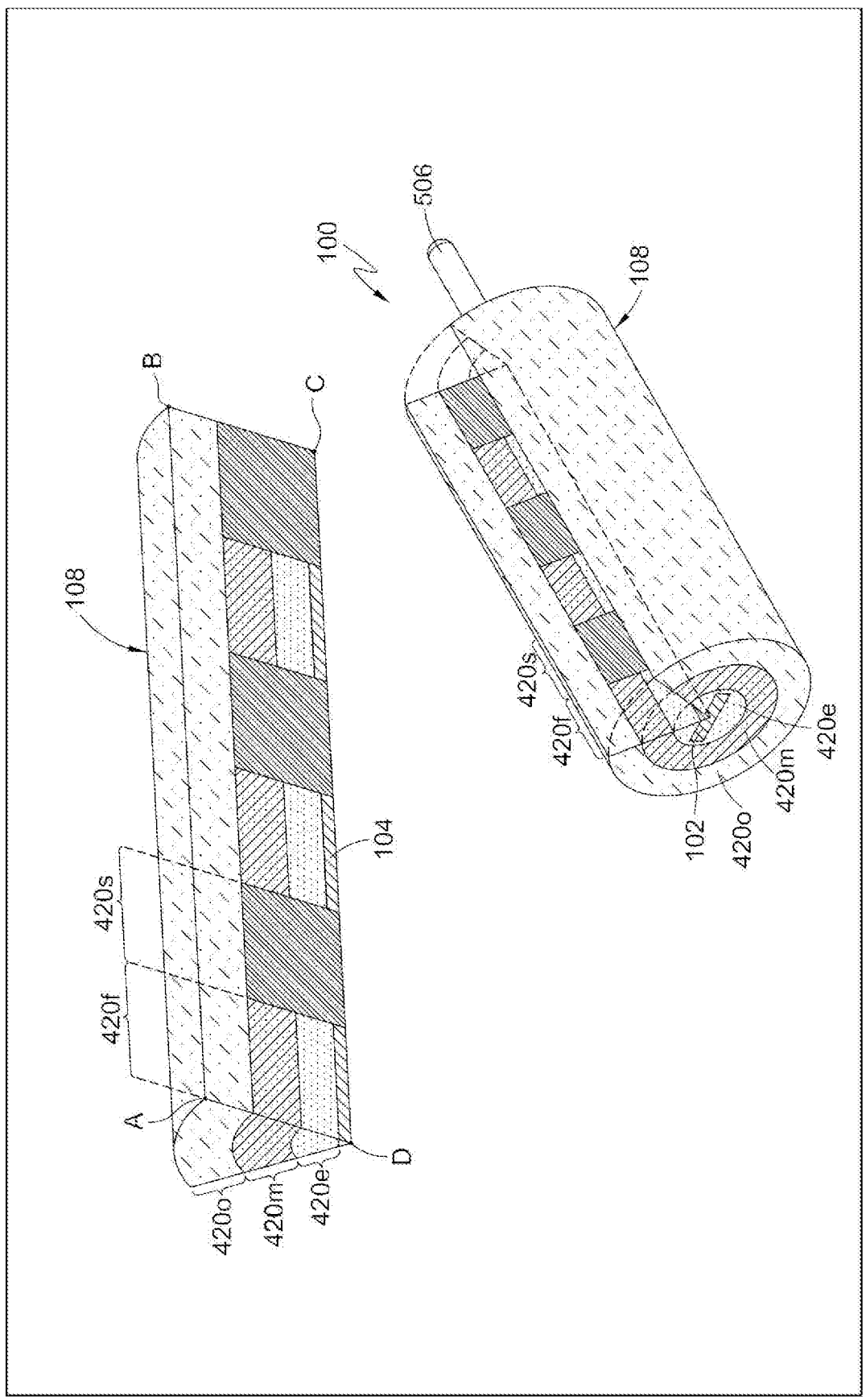
FIG. 29 shows a truncated LED filament carved into two portions in accordance with an exemplary embodiment of the present invention.

The ways illustrated above in which an enclosure is divided into regions having distinctive properties can be employed in combination with one another, in FIGS. 27 and 29 as examples, to functionalize an LED filament 100 as desired. In FIG. 27, the truncated LED filament 100 is further carved into a small portion and a big portion to show its internal structure. The small portion is defined by revolving the rectangle ABCD around the line CD (i.e. the central axis of the LED filament 100) for 90 degrees. Likewise, the big portion is defined by revolving the rectangle ABCD around the line CD for the entirety of 360 degrees except for the space taken by the small portion. The enclosure 108 is regionalized with, for example, three sets of hypothetical planes. The first set of hypothetical planes intersects the enclosure 108 perpendicularly to the light illuminating direction of the linear array of LED devices 102. For example, the enclosure 108 includes three regions defined by a hypothetical pair of planes compartmentalizing the enclosure 108 into an upper region 420u, a lower region 420w and a horizontal middle region 420hm sandwiched by the upper region 420u and the lower region 420w. The linear array of LED devices 102 is disposed exclusively in one of the regions of the enclosure 108. Alternatively, the linear array of LED devices 102 is absent from at least one of the regions of the enclosure 108. Alternatively, the linear array of LED devices 102 is disposed in all regions of the enclosure 108. In FIG. 27, the linear array of LED devices 102 is disposed exclusively in the horizontal middle region 420hm of the enclosure 108 and is spaced apart by the horizontal middle region 420hm from the top region 420u and the lower region 420w. In an embodiment, the horizontal middle region 420hm includes a wavelength converter for converting blue light emitting from the LED device 102 into white light. The upper region 420u includes a cylindrical lens for aligning the light beaming upwards. The lower region 420w includes a cylindrical lens for aligning the light beaming downwards. In another embodiment, the horizontal middle region 420hm is made harder than the upper region 420u, the lower region 420w or both by, for example, embedding a greater concentration of phosphor particles in the horizontal middle region 420hm than in the upper region 420u, the lower region 420w or both. The horizontal middle region 420hm, because it is harder, is thus configured to better protect the linear array of LED devices 102 from malfunctioning when the LED filament 100 is bent to maintain a desired posture in a light bulb. The upper region 420u (or the lower region 420w) is made softer for keeping the entire LED filament 100 as bendable in the light bulb as it requires for generating omnidirectional light with preferably exactly one LED filament 100. In yet another embodiment, the horizontal middle region 420hm has greater thermal conductivity than the upper region 420u, the lower region 420w or both by, for example, doping a greater concentration of nanoparticles in the horizontal middle region 420hm than in the upper region 420u, the lower region 420w or both. The horizontal middle region 420hm, having greater thermal conductivity, is thus configured to better protect the linear array of LED devices 102 from degrading or burning by removing excess heat from the LED device 102. The upper region 420u (or the lower region 420w), because it is spaced apart from the linear array of LED devices 102, plays a lesser role than the horizontal middle region 420hm in cooling the LED device 102. The cost for making the LED filament 100 is thus economized when the upper region 420u (or the lower region 420w) is not as heavily doped with nanoparticles as the horizontal middle region 420hm. The dimension of the horizontal middle region 420hm, in which the linear array of LED devices 102 is exclusively disposed, in relation to the entire enclosure 108 is determined by a desired totality of considerations such as light conversion capability, bendability and thermal conductivity. Other things equal, the bigger the horizontal middle region 420*hm* in relation to the entire enclosure 108, the LED filament 100 has greater light conversion capability and thermal conductivity but will be less bendable.

Staying on FIG. 27, the second set of hypothetical planes intersects the enclosure 108 parallelly to the light illuminating direction of the linear array of LED devices 102. For example, the enclosure includes three regions 274, 275, 276 defined by a hypothetical pair of planes compartmentalizing the enclosure 108 into a right region 420*r*, a left region 420*l* and a vertical middle region 420*vm* sandwiched by the right region 420*r* and the left region 420*l*. The linear array of LED devices 102 is disposed exclusively in one of the regions of the enclosure 108. Alternatively, the linear array of LED devices 102 is absent from at least one of the regions of the enclosure 108. Alternatively, the linear array of LED devices 102 is disposed in all regions of the enclosure 108. In FIG. 27, the linear array of LED devices 102 is disposed exclusively in the vertical middle region 420*vm* of the enclosure 108 and is spaced apart by the vertical middle region 420*vm* from the right region 420*r* and the left region 420*l*. In an embodiment, the vertical middle region 420*vm* includes a wavelength converter for converting blue light emitting from the LED device 102 into white light. The right region 420*r* includes a cylindrical lens for aligning the light beaming rightwards. The left region 420*l* includes a cylindrical lens for aligning the light beaming leftwards. In another embodiment, the vertical middle region 420*vm* is made harder than the right region 420*r*, the left region 420*l* or both by, for example, embedding a greater concentration of phosphor particles in the vertical middle region 420*vm* than in the right region 420*r*, the left region 420*l* or both. The vertical middle region 420*vm*, because it is harder, is thus configured to better protect the linear array of LED devices 102 from malfunctioning when the LED filament 100 is bent to maintain a desired posture in a light bulb. The right region 420*r* (or the left region 420*l*) is made softer for keeping the entire LED filament 100 as bendable in the light bulb as it requires for generating omnidirectional light with, preferably, exactly one LED filament 100. In yet another embodiment, the vertical middle region 420*vm* has greater thermal conductivity than the right region 420*r*, the left region 420*l* or both by, for example, doping a greater concentration of nanoparticles in the vertical middle region 420*vm* than in the right region 420*r*, the left region 420*l* or both. The vertical middle region 420*vm*, having greater thermal conductivity, is thus configured to better protect the linear array of LED devices 102 from degrading or burning by removing excess heat from the LED device 102. The right region 420*r* (or the left region 420*l*), because it is spaced apart from the linear array of LED devices 102, plays a lesser role than the vertical middle region 420*vm* in cooling the LED device 102. The cost for making the LED filament 100 is thus economized when the right region 420*r* (or the left region 420*l*) is not as heavily doped with nanoparticles as the vertical middle region 420*vm*. The dimension of the vertical middle region 420*vm*, in which the linear array of LED devices 102 is exclusively disposed, in relation to the entire enclosure 108 is determined by a desired totality of considerations such as light conversion capability, bendability and thermal conductivity. Other things equal, the bigger the vertical middle region 420*vm* in relation to the entire enclosure 108, the LED filament 100 has greater light conversion capability and thermal conductivity but will be less bendable.

Still staying on FIG. 27, the third set of hypothetical planes intersects the enclosure 108 perpendicularly to the longitudinal axis of the enclosure 108. For example, the enclosure 108 includes two alternating regions 420*f*, 420*s*, i.e. a first region 420*f* and a second region 420*s*, defined by the hypothetical set of parallel planes. In an embodiment, the hypothetical set of parallel planes intersect the enclosure 108 right at the edges of an LED device 102. The LED device 102 is disposed exclusively in the first region 420*f*. The means for electrically connecting the LED devices 102, e.g. the bond wire, is disposed exclusively in the second region 420*s*. In another embodiment, the hypothetical set of parallel planes intersect the enclosure 108 between the edges of an LED device 102. A portion of the LED device 102, excluding the edges, is disposed in the first region 420*f*; the other portion of the LED device 102, including the edges, is disposed in the second region 420*s*. A portion of the means for electrically connecting the LED devices 102, excluding the ends of the wiring, is disposed in the second region 420*s*; the other portion of the means for electrically connecting the LED devices 102, including the ends of the wiring, is disposed in the second region 420*s*. In yet another embodiment, the hypothetical set of parallel planes intersect the enclosure 108 at the space between adjacent LED devices 102. The LED device 102 is disposed exclusively in the first region 420*f*. A portion of the means for electrically connecting the LED devices 102, excluding the ends of the wiring, is disposed in the first region 420*f*; the other portion of the means for electrically connecting the LED devices 102, including the ends of the wiring, is disposed in the second region 420*s*. Depending on applications, the first region 420*f* is configured to have a different set of properties from that of the second region 420*s*. In an embodiment, the first region 420*f* is made harder than the second region 420*s* by, for example, embedding a greater concentration of phosphor particles in the first region 420*f* than in the second region 420*s*. The first region 420*f*, because it is harder, is thus configured to better protect the linear array of LED devices 102 from malfunctioning when the LED filament 100 is bent to maintain a desired posture in a light bulb. The second region 420*s* is made softer for keeping the entire LED filament 100 as bendable in the light bulb as it requires for generating omnidirectional light with, preferably, exactly one LED filament 100. In another embodiment, the first region 420*f* has greater thermal conductivity than the second region 420*s* by, for example, doping a greater concentration of nanoparticles in the first region 420*f* than in the second region 420*s*. The first region 420*f*, having greater thermal conductivity, is thus configured to better protect the linear array of LED devices 102 from degrading or burning by removing excess heat from the LED device 102. The second region 420*s*, because it is spaced apart from the linear array of LED devices 102, plays a lesser role than the first region 420*f* in cooling the LED device 102. The cost for making the LED filament 100 is thus economized when the second region 420*s* is not as heavily doped with nanoparticles as the first region 420*f*. The dimension of the first region 420*f*, in which the LED device 102 is disposed, in relation to the entire enclosure 108 is determined by a desired totality of considerations such as light conversion capability, bendability and thermal conductivity. Other things equal, the bigger the first region 420*f* in relation to the entire enclosure 108, the LED filament 100 has greater light conversion capability and thermal conductivity but will be less bendable.

Figure 28:
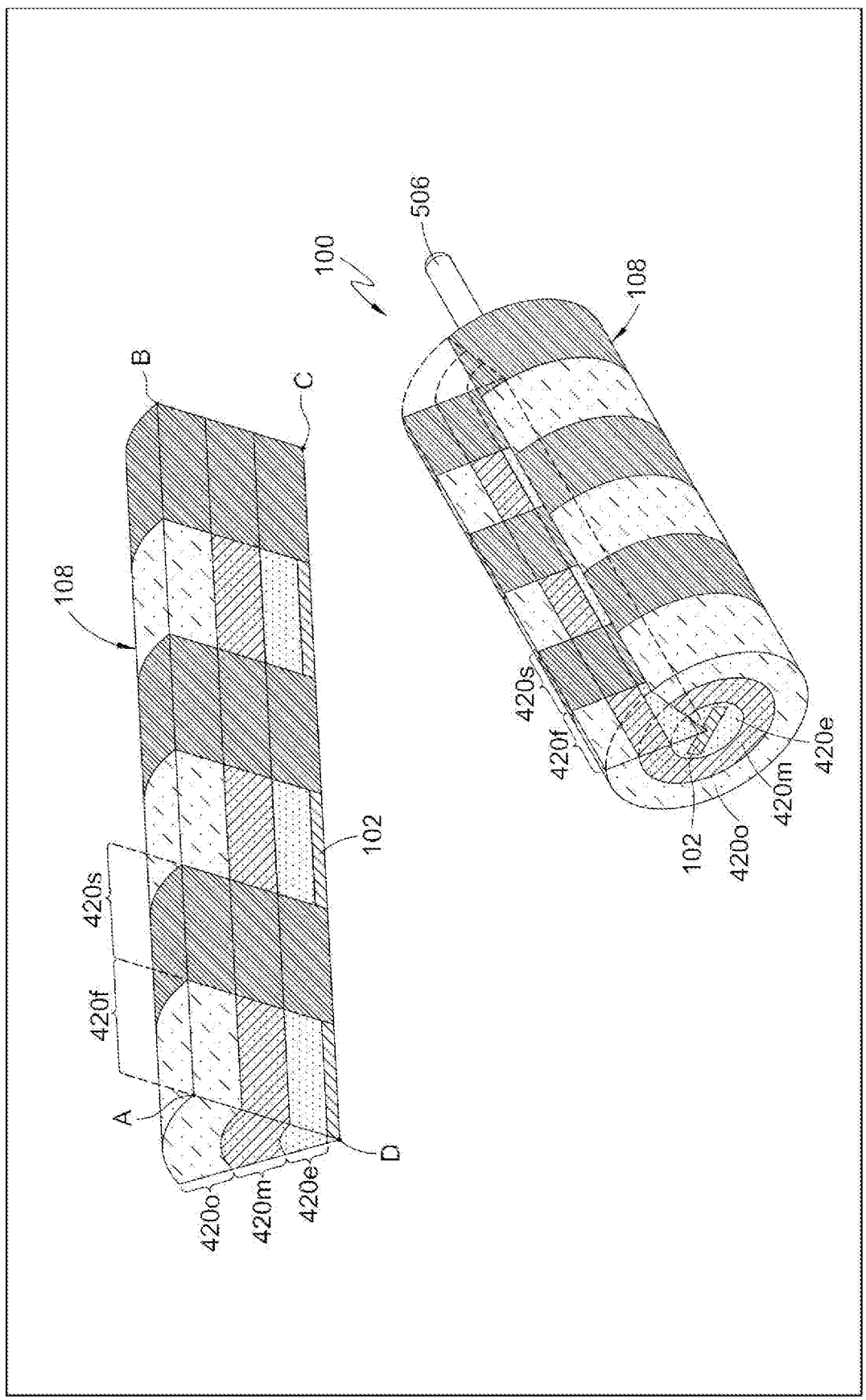
FIG. 28 shows a truncated LED filament carved into two portions in accordance with an exemplary embodiment of the present invention.

Shifting to FIG. 28, the truncated LED filament 100 is further carved into a small portion and a big portion to show its internal structure. The small portion is defined by revolving the rectangle ABCD around the line CD (i.e. the central axis of the LED filament 100) for a fraction of 360 degrees. Likewise, the big portion is defined by revolving the rectangle ABCD around the line CD for the entirety of 360 degrees except for the space taken by the small portion. In an embodiment, the enclosure 108 is regionalized with, for example, a hypothetical set of cylindrical surfaces in combination with a hypothetical set of planes. First, the regions 420e, 420m, 420o of the enclosure 108 are defined by a hypothetical cylindrical surface having the longitudinal axis of the LED filament 100 as its central axis. For example, the enclosure 108 includes three regions 420e, 420m, 420o defined by a hypothetical pair of coaxial cylindrical surfaces compartmentalizing the enclosure 108 into a core region 420e, an outer region 420o and a tubular middle region 420m sandwiched by the core region 420e and the outer region 420o. The linear array of LED devices 102 is disposed exclusively in one of the regions of the enclosure 108. Alternatively, the linear array of LED devices 102 is absent from at least one of the regions of the enclosure 108. Alternatively, the linear array of LED devices 102 is disposed in all regions of the enclosure 108. In an embodiment, the outer region 420o includes a light scatterer for increasing light extraction from the LED device 102 by reducing total internal reflection. The tubular middle region 420m includes a wavelength converter for converting blue light emitting from the LED device 102 into white light. The core region 420e includes a spacer. The spacer prevents heat coming from the LED device 102 from quickly degrading the phosphor particle by keeping the phosphor particle apart from the LED device 102. Moreover, the spacer enables a uniform thickness for the tubular middle region 420m, which includes the wavelength converter, to produce uniform white light, which entails a proper combination of blue light and the phosphor light. In another embodiment, the tubular middle region 420m is made harder than the core region 420e, the outer region 420o or both by, for example, embedding a greater concentration of phosphor particles in the tubular middle region 420m than in the core region 420e, the outer region 420o or both. The tubular middle region 420m, because it is harder, is thus configured to better protect the linear array of LED devices 102 from malfunctioning when the LED filament 100 is bent to maintain a desired posture in a light bulb. The core region 420e (or the outer region 420o) is made softer for keeping the entire LED filament 100 as bendable in the light bulb as it requires for generating omnidirectional light with, preferably, exactly one LED filament 100. In yet another embodiment, the core region 420e has greater thermal conductivity than the tubular middle region 420m, the outer region 420o or both by, for example, doping a greater concentration of nanoparticles in the core region 420e than in the tubular middle region 420m, the outer region 420o or both. The core region 420e, having greater thermal conductivity, is thus configured to better protect the linear array of LED devices 102 from degrading or burning by removing excess heat from the LED device 102. The tubular middle region 420m (or the outer region 420o), because it is spaced apart from the linear array of LED devices 102, plays a lesser role than the core region 420e in cooling the LED device 102. The cost for making the LED filament 100 is thus economized when the tubular middle region 420m (or the outer region 420o) is not as heavily doped with nanoparticles as the core region 420e. The dimension of the core region 420e, in which the linear array of LED devices 102 is exclusively disposed, in relation to the entire enclosure 108 is determined by a desired totality of considerations such as light conversion capability, bendability and thermal conductivity. Other things equal, the bigger the core region 420e in relation to the entire enclosure 108, the LED filament 100 has less light conversion capability and thermal conductivity but will be more bendable. The dimension of the tubular middle region 420m, which includes the wavelength converter, in relation to the entire enclosure 108 is determined by a desired totality of considerations such as light conversion capability, bendability and thermal conductivity. Other things equal, the bigger the middle region 420m in relation to the entire enclosure 108, the LED filament 100 has greater light conversion capability and thermal conductivity but will be less bendable. Next, the regions of the enclosure 108 are defined by a hypothetical set of parallel planes intersecting the enclosure perpendicularly to the longitudinal axis of the enclosure 108. For example, the enclosure 108 includes two alternating regions 420f, 420s, i.e. a first region 420f and a second region 420s, defined by the hypothetical set of parallel planes. In an embodiment, the hypothetical set of parallel planes intersect the enclosure 108 right at the edges of an LED device 102. The LED device 102 is disposed exclusively in the first region 420f. The means for electrically connecting the LED devices 102, e.g. the bond wire, is disposed exclusively in the second region 420s. In another embodiment, the hypothetical set of parallel planes intersect the enclosure 108 between the edges of an LED device 102. A portion of the LED device 102, excluding the edges, is disposed in the first region 420f; the other portion of the LED device 102, including the edges, is disposed in the second region 420s. The means for electrically connecting the LED devices, including the ends of the wiring, is disposed in the second region 420s. In yet another embodiment, the hypothetical set of parallel planes intersect the enclosure 108 at the space between adjacent LED devices 102. The LED device 102 is disposed exclusively in the first region 420f. A portion of the means for electrically connecting the LED devices 102, including the ends of the wiring, is disposed in the first region 420f; the other portion of the means for electrically connecting the LED devices 102, excluding the ends of the wiring, is disposed in the second region 420s. Depending on applications, the first region 420f is configured to have a different set of properties from that of the second region 420s. In an embodiment, the first region 420f is made harder than the second region 420s by, for example, embedding a greater concentration of phosphor particles in the first region 420f than in the second region 420s. The first region 420f, because it is harder, is thus configured to better protect the linear array of LED devices 102 from malfunctioning when the LED filament 100 is bent to maintain a desired posture in a light bulb. The second region 420s is made softer for keeping the entire LED filament 100 as bendable in the light bulb as it requires for generating omnidirectional light with, preferably, exactly one LED filament 100. In another embodiment, the first region 420f has greater thermal conductivity than the second region 420s by, for example, doping a greater concentration of nanoparticles in the first region 420f than in the second region 420s. The first region 420f, having greater thermal conductivity, is thus configured to better protect the linear array of LED devices 102 from degrading or burning by removing excess heat from the LED device 102. The second region 420s, because it is spaced apart from the linear array of LED devices 102, plays a lesser role than the first region 420f in cooling the LED device 102. The cost for making the LED filament 100 is thus economized when the second region 420s is not as heavily doped with nanoparticles as the first region 420f. The dimension of the first region 420f, in which the LED device 102 is disposed, in relation to the entire enclosure 108 is determined by a desired totality of considerations such as light conversion capability, bendability and thermal conductivity. Other things equal, the bigger the first region 420f in relation to the entire enclosure 108, the LED filament 100 has greater light conversion capability and thermal conductivity but will be less bendable.

The regions defined by the hypothetical set of cylindrical surfaces and the hypothetical set of planes are either continuous or not continuous. Shifting to FIG. 29, the core region 420e and the tubular middle region 420m extend longitudinally across the first region 420f of the enclosure 108 but are broken periodically and absent from the second region 420s. In other words, what would be a tubular middle region and a core region if the all regions were continuous in the second region 420s are merged into one region in the second region 420s when all regions of the enclosure 108 are not continuous. For example, the outer region 420o, which is continuous throughout the enclosure 108, includes a light scatterer for reducing total internal reflection. The first region 420f includes a tubular middle region 420m and a core region 420e. The tubular middle region 420m—sandwiched by the outer region 420o and the core region 420e—includes a wavelength converter, e.g. phosphor particles embedded in a transparent binder, for producing uniform white light, which entails a proper combination of blue light and the phosphor light. The core region 420e includes a spacer for preventing heat coming from the LED device 102 from degrading the phosphor particles in the wavelength converter prematurely. Moreover, the spacer enables a uniform thickness for the tubular middle region 420m. The second region 420s, like the core region 420e, also includes a wavelength converter. In an embodiment, the second region 420s is softer than the core region 420e, the tubular middle region 420m or both such that the LED filament 100 is as bendable as it is required to generate omnidirectional light with exactly one LED filament 100. In another embodiment, the second region 420s is less thermally conductive than the core region 420e, the tubular middle region 420m or both. The core region 420e (or the tubular middle region 420m) plays a bigger role than the second region 420s in removing heat generated by the LED device 102.

In the embodiments where the enclosure is a modular structure assembled from modules having diverse chemical or physical properties, the enclosure includes a plurality of modules having distinctive properties to enable a desired totality of functions for the LED filament. The plurality of modules in the enclosure is defined in a variety of ways depending on applications. Going back to FIG. 23, the truncated LED filament 100 is further sliced vertically—i.e. along the light illuminating direction of the linear array of LED devices 102—into equal halves along the longitudinal axis of the LED filament 100 to show its internal structure. The modules of the enclosure 108 are defined by a hypothetical plane perpendicular to the light illuminating direction of the linear array of LED devices 102. For example, the enclosure 108 includes three modules 420w, 420m, 420u defined by a hypothetical pair of planes compartmentalizing the enclosure 108 into an upper module 420u, a lower module 420w and a middle module 420m sandwiched by the upper module 420u and the lower module 420w. The linear array of LED devices 102 is disposed exclusively in one of the modules of the enclosure 108. Alternatively, the linear array of LED devices 102 is absent from at least one of the modules of the enclosure 108. Alternatively, the linear array of LED devices 102 is disposed in all modules of the enclosure 108. In FIG. 23, the linear array of LED devices 102 is disposed exclusively in the middle module 420m of the enclosure 108 and is spaced apart by the middle module 420m from the top module 420u and the lower module 420w. In an embodiment, the middle module 420m includes a wavelength converter for converting blue light emitting from the LED device 102 into white light. The upper module 420u includes a cylindrical lens for aligning the light beaming upwards. The lower module 420w includes a cylindrical lens for aligning the light beaming downwards. In another embodiment, the middle module 420m is made harder than the upper module 420u, the lower module 420w or both by, for example, embedding a greater concentration of phosphor particles in the middle module 420m than in the upper module 420u, the lower module 420w or both. The middle module 420m, because it is harder, is thus configured to better protect the linear array of LED devices 102 from malfunctioning when the LED filament 100 is bent to maintain a desired posture in a light bulb. The upper module 420u (or the lower module 420w) is made softer for keeping the entire LED filament 100 as bendable in the light bulb as it requires for generating omnidirectional light with preferably exactly one LED filament 100. In yet another embodiment, the middle module 420m has greater thermal conductivity than the upper module 420u, the lower module 420w or both by, for example, doping a greater concentration of nanoparticles in the middle module 420m than in the upper module 420u, the lower module 420w or both. The middle module 420m, having greater thermal conductivity, is thus configured to better protect the linear array of LED devices 102 from degrading or burning by removing excess heat from the LED device 102. The upper module 420u (or the lower module 420w), because it is spaced apart from the linear array of LED devices 102, plays a lesser role than the middle module 420m in cooling the LED device 102. The cost for making the LED filament 100 is thus economized when the upper module 420u (or the lower module 420w) is not as heavily doped with nanoparticles as the middle module 420m. The dimension of the middle module 420m, in which the linear array of LED devices is exclusively disposed, in relation to the entire enclosure 108 is determined by a desired totality of considerations such as light conversion capability, bendability and thermal conductivity. Other things equal, the bigger the middle module 420m in relation to the entire enclosure 108, the LED filament 100 has greater light conversion capability and thermal conductivity but will be less bendable. A cross section perpendicular to the longitudinal axis of the LED filament 100 reveals the middle module 420m and other modules of the enclosure 108. R6 is a ratio of the area of the middle module 420m to the overall area of the cross section. Preferably, R6 is from 0.2 to 0.8. Most preferably, R6 is from 0.4 to 0.6.

Shifting to FIG. 24, the truncated LED filament 100 is further sliced horizontally—i.e. perpendicular to the light illuminating direction of the linear array of LED devices 102—into equal halves along the longitudinal axis of the LED filament 100 to show its internal structure. The modules of the enclosure 108 are defined by a hypothetical plane parallel to the light illuminating direction of the linear array of LED devices 102. For example, the enclosure 108 includes three modules 420l, 420m, 420r defined by a hypothetical pair of planes compartmentalizing the enclosure 108 into a right module 420r, a left module 420l and a middle module 420m sandwiched by the right module 420r and the left module 420*l*. The linear array of LED devices 102 is disposed exclusively in one of the modules of the enclosure 108. Alternatively, the linear array of LED devices 102 is absent from at least one of the modules of the enclosure 108. Alternatively, the linear array of LED devices 102 is disposed in all modules of the enclosure 108. In FIG. 24, the linear array of LED devices 102 is disposed exclusively in the middle module 420*m* of the enclosure 108 and is spaced apart by the middle module 420*m* from the right module 420*r* and the left module 420*l*. In an embodiment, the middle module 420*m* includes a wavelength converter for converting blue light emitting from the LED device 102 into white light. The right module 420*r* includes a cylindrical lens for aligning the light beaming rightwards. The left module 420*l* includes a cylindrical lens for aligning the light beaming leftwards. In another embodiment, the middle module 420*m* is made harder than the right module 420*r*, the left module 420*l* or both by, for example, embedding a greater concentration of phosphor particles in the middle module 420*m* than in the right module 420*r*, the left module 420*l* or both. The middle module 420*m*, because it is harder, is thus configured to better protect the linear array of LED devices 102 from malfunctioning when the LED filament 100 is bent to maintain a desired posture in a light bulb. The right module 420*r* (or the left module 420*l*) is made softer for keeping the entire LED filament 100 as bendable in the light bulb as it requires for generating omnidirectional light with, preferably, exactly one LED filament 100. In yet another embodiment, the middle module 420*m* has greater thermal conductivity than the right module 420*r*, the left module 420*l* or both by, for example, doping a greater concentration of nanoparticles in the middle module 420*m* than in the right module 420*r*, the left module 420*l* or both. The middle module 420*m*, having greater thermal conductivity, is thus configured to better protect the linear array of LED devices 102 from degrading or burning by removing excess heat from the LED device 102. The right module 420*r* (or the left module 420*l*), because it is spaced apart from the linear array of LED devices 102, plays a lesser role than the middle module 420*m* in cooling the LED device 102. The cost for making the LED filament 100 is thus economized when the right module 420*r* (or the left module 420*l*) is not as heavily doped with nanoparticles as the middle module 420*m*. The dimension of the middle module 420*m*, in which the linear array of LED devices is exclusively disposed, in relation to the entire enclosure 108 is determined by a desired totality of considerations such as light conversion capability, bendability and thermal conductivity. Other things equal, the bigger the middle module 420*m* in relation to the entire enclosure 108, the LED filament 100 has greater light conversion capability and thermal conductivity but will be less bendable. A cross section perpendicular to the longitudinal axis of the LED filament 100 reveals the middle module 420*m* and other modules of the enclosure 108. R7 is a ratio of the area of the middle module 420*m* to the overall area of the cross section. Preferably, R7 is from 0.2 to 0.8. Most preferably, R7 is from 0.4 to 0.6.

Shifting to FIG. 25, the truncated LED filament 100 is further carved into a small portion and a big portion to show its internal structure. The small portion is defined by revolving the rectangle ABCD around the line CD (i.e. the central axis of the LED filament 100) for a fraction of 360 degrees. Likewise, the big portion is defined by revolving the rectangle ABCD but the line CD but for the entirety of 360 degrees except for the space taken by the small portion. The modules of the enclosure 108 are defined by a hypothetical cylindrical surface having the central axis of the LED filament 100 as its central axis. For example, the enclosure 108 includes three modules 420*e*, 420*m*, 420*o* defined by a hypothetical pair of coaxial cylindrical surfaces compartmentalizing the enclosure 108 into a core module 420*e*, an outer module 420*o* and a middle module 420*m* sandwiched by the core module 420*e* and the outer module 420*o*. The linear array of LED devices 102 is disposed exclusively in one of the modules of the enclosure 108. Alternatively, the linear array of LED devices 102 is absent from at least one of the modules of the enclosure 108. Alternatively, the linear array of LED devices 102 is disposed in all modules of the enclosure 108. In FIG. 25, the linear array of LED devices 102 is disposed exclusively in the core module 420*e* of the enclosure 108 and is spaced apart by the core module 420*e* from the middle module 420*m* and the outer module 420*o*. In an embodiment, the outer module 420*o* includes a light scatterer for increasing light extraction from the LED device 102 by reducing total internal reflection. The middle module 420*m* includes a wavelength converter for converting blue light emitting from the LED device 102 into white light. The core module 420*e* includes a spacer. The spacer prevents heat coming from the LED device 102 from quickly degrading the phosphor particle by keeping the phosphor particle apart from the LED device 102. Moreover, the spacer enables a uniform thickness for the middle module 420*m*, which includes the wavelength converter, to produce uniform white light, which entails a proper combination of blue light and the phosphor light. In another embodiment, the middle module 420*m* is made harder than the core module 420*e*, the outer module 420*o* or both by, for example, embedding a greater concentration of phosphor particles in the middle module 420*m* than in the core module 420*e*, the outer module 420*o* or both. The middle module 420*m*, because it is harder, is thus configured to better protect the linear array of LED devices 102 from malfunctioning when the LED filament 100 is bent to maintain a desired posture in a light bulb. The core module 420*e* (or the outer module 420*o*) is made softer for keeping the entire LED filament 100 as bendable in the light bulb as it requires for generating omnidirectional light with, preferably, exactly one LED filament 100. In yet another embodiment, the core module 420*e* has greater thermal conductivity than the middle module 420*m*, the outer module 420*o* or both by, for example, doping a greater concentration of nanoparticles in the core module 420*e* than in the middle module 420*m*, the outer module 420*o* or both. The core module 420*e*, having greater thermal conductivity, is thus configured to better protect the linear array of LED devices 102 from degrading or burning by removing excess heat from the LED device 102. The middle module 420*m* (or the outer module 420*o*), because it is spaced apart from the linear array of LED devices 102, plays a lesser role than the core module 420*e* in cooling the LED device 102. The cost for making the LED filament 100 is thus economized when the middle module 420*m* (or the outer module 420*o*) is not as heavily doped with nanoparticles as the core module 420*e*. The dimension of the core module 420*e*, in which the linear array of LED devices 102 is exclusively disposed, in relation to the entire enclosure 108 is determined by a desired totality of considerations such as light conversion capability, bendability and thermal conductivity. Other things equal, the bigger the core module 420*e* in relation to the entire enclosure 108, the LED filament 100 has less light conversion capability and thermal conductivity but will be more bendable. A cross section perpendicular to the longitudinal axis of the LED filament 100 reveals the core module 420*e* and other modules of the enclosure 108. R8 is a ratio of the area of the core module 420e to the overall area of the cross section. Preferably, R8 is from 0.1 to 0.8. Most preferably, R8 is from 0.2 to 0.5. The dimension of the middle module 420m, which includes the wavelength converter, in relation to the entire enclosure 108 is determined by a desired totality of considerations such as light conversion capability, bendability and thermal conductivity. Other things equal, the bigger the middle module 420m in relation to the entire enclosure 108, the LED filament 100 has greater light conversion capability and thermal conductivity but will be less bendable. A cross section perpendicular to the longitudinal axis of the LED filament 100 reveals the middle module 420m and other modules of the enclosure 108. R9 is a ratio of the area of the middle module 420m to the overall area of the cross section. Preferably, R9 is from 0.1 to 0.8. Most preferably, R9 is from 0.2 to 0.5.

Shifting to FIG. 26, the truncated LED filament 100 is further carved into a small portion and a big portion to show its internal structure. Like FIG. 25, the small portion is defined by revolving the rectangle ABCD around the line CD (i.e. the central axis of the LED filament 100) for a fraction of 360 degrees. Likewise, the big portion is defined by revolving the rectangle ABCD around the line CD for the entirety of 360 degrees except for the space taken by the small portion. The modules of the enclosure 108 are defined by a hypothetical set of parallel planes intersecting the enclosure 108 perpendicularly to the longitudinal axis of the enclosure 108. For example, the enclosure 108 includes two alternating modules 420f, 420s, i.e. a first module 420f and a second module 420s, defined by the hypothetical set of parallel planes. In an embodiment, the hypothetical set of parallel planes intersect the enclosure 108 right at the edges of an LED device 102. The LED device 102 is disposed exclusively in the first module 420f. The means for electrically connecting the LED devices 102, e.g. the bond wire, is disposed exclusively in the second module 420s. In another embodiment, the hypothetical set of parallel planes intersect the enclosure 108 between the edges of an LED device 102. A portion of the LED device 102, excluding the edges, is disposed in the first module 420f; the other portion of the LED device 102, including the edges, is disposed in the second module 420s. A portion of the means for electrically connecting the LED devices 102, excluding the ends of the wiring, is disposed in the second module 420s; the other portion of the means for electrically connecting the LED devices 102, including the ends of the wiring, is disposed in the first module 420f. In yet another embodiment, the hypothetical set of parallel planes intersect the enclosure 108 at the space between adjacent LED devices 102. The LED device 102 is disposed exclusively in the first module 420f. A portion of the means for electrically connecting the LED devices 102, including the ends of the wiring, is disposed in the first module 420f; the other portion of the means for electrically connecting the LED devices 102, excluding the ends of the wiring, is disposed in the second module 420s. Depending on applications, the first module 420f is configured to have a different set of properties from that of the second module 420s. In an embodiment, the first module 420f is made harder than the second module 420s by, for example, embedding a greater concentration of phosphor particles in the first module 420f than in the second module 420s. The first module 420f, because it is harder, is thus configured to better protect the linear array of LED devices 102 from malfunctioning when the LED filament 100 is bent to maintain a desired posture in a light bulb. The second module 420s is made softer for keeping the entire LED filament 100 as bendable in the light bulb as it requires for generating omnidirectional light with, preferably, exactly one LED filament 100. In another embodiment, the first module 420f has greater thermal conductivity than the second module by, for example, doping a greater concentration of nanoparticles in the first module 420f than in the second module 420s. The first module 420f, having greater thermal conductivity, is thus configured to better protect the linear array of LED devices 102 from degrading or burning by removing excess heat from the LED device 102. The second module 420s, because it is spaced apart from the linear array of LED devices 102, plays a lesser role than the first module 420f in cooling the LED device 102. The cost for making the LED filament 100 is thus economized when the second module 420s is not as heavily doped with nanoparticles as the first module 420f. The dimension of the first module 420f, in which the LED device 102 is disposed, in relation to the entire enclosure 108 is determined by a desired totality of considerations such as light conversion capability, bendability and thermal conductivity. Other things equal, the bigger the first module 420f in relation to the entire enclosure 108, the LED filament 100 has greater light conversion capability and thermal conductivity but will be less bendable. An outer surface of the enclosure 108 shows a combination of the first module 420f and other modules. R10 is a ratio of the total area of the first module 420f found on the outer surface to the overall area of the outer surface of the enclosure 108. Preferably, R10 is from 0.2 to 0.8. Most preferably, R10 is from 0.4 to 0.6.

The ways illustrated above in which an enclosure is divided into modules having distinctive properties can be employed in combination with one another, in FIGS. 27 and 28 as examples, to functionalize an LED filament 100 as desired. In FIG. 27, the truncated LED filament 100 is further carved into a small portion and a big portion to show its internal structure. The small portion is defined by revolving the rectangle ABCD around the line CD (i.e. the central axis of the LED filament 100) for 90 degrees. Likewise, the big portion is defined by revolving the rectangle ABCD around the line CD for the entirety of 360 degrees except for the space taken by the small portion. The enclosure 108 is modularized with, for example, three sets of hypothetical planes. The first set of hypothetical planes intersect the enclosure 108 perpendicularly to the light illuminating direction of the linear array of LED devices 102. For example, the enclosure 108 includes three modules 420u, 420hm, 420w defined by a hypothetical pair of planes compartmentalizing the enclosure 108 into an upper module 420u, a lower module 420w and a horizontal middle module 420hm sandwiched by the upper module 420u and the lower module 420w. The linear array of LED devices 102 is disposed exclusively in one of the modules of the enclosure 108. Alternatively, the linear array of LED devices 102 is absent from at least one of the modules of the enclosure 108. Alternatively, the linear array of LED devices 102 is disposed in all modules of the enclosure 108. In FIG. 27, the linear array of LED devices 102 is disposed exclusively in the horizontal middle module 420hm of the enclosure 108 and is spaced apart by the horizontal middle module 420hm from the top module 420u and the lower module 420l. In an embodiment, the horizontal middle module 420hm includes a wavelength converter for converting blue light emitting from the LED device 102 into white light. The upper module 420u includes a cylindrical lens for aligning the light beaming upwards. The lower module 420l includes a cylindrical lens for aligning the light beaming downwards. In another embodiment, the horizontal middle module 420hm is made harder than the upper module 420*u*, the lower module 420*l* or both by, for example, embedding a greater concentration of phosphor particles in the horizontal middle module 420*hm* than in the upper module 420*u*, the lower module 420*l* or both. The horizontal middle module 420*hm*, because it is harder, is thus configured to better protect the linear array of LED devices 102 from malfunctioning when the LED filament 100 is bent to maintain a desired posture in a light bulb. The upper module 420*u* (or the lower module 420*l*) is made softer for keeping the entire LED filament 100 as bendable in the light bulb as it requires for generating omnidirectional light with preferably exactly one LED filament 100. In yet another embodiment, the horizontal middle module 420*hm* has greater thermal conductivity than the upper module 420*u*, the lower module 420*l* or both by, for example, doping a greater concentration of nanoparticles in the horizontal middle module 420*hm* than in the upper module 420*u*, the lower module 420*l* or both. The horizontal middle module 420*hm*, having greater thermal conductivity, is thus configured to better protect the linear array of LED devices 102 from degrading or burning by removing excess heat from the LED device 102. The upper module 420*u* (or the lower module 420*l*), because it is spaced apart from the linear array of LED devices 102, plays a lesser role than the horizontal middle module 420*hm* in cooling the LED device 102. The cost for making the LED filament 100 is thus economized when the upper module 420*u* (or the lower module 420*l*) is not as heavily doped with nanoparticles as the horizontal middle module 420*hm*. The dimension of the horizontal middle module 420*hm*, in which the linear array of LED devices 102 is exclusively disposed, in relation to the entire enclosure 108 is determined by a desired totality of considerations such as light conversion capability, bendability and thermal conductivity. Other things equal, the bigger the horizontal middle module 420*hm* in relation to the entire enclosure 108, the LED filament 100 has greater light conversion capability and thermal conductivity but will be less bendable.

Staying on FIG. 27, the second set of hypothetical planes, which are parallel to the central axis of the LED filament 100, intersect the enclosure 108 longitudinally. For example, the enclosure 108 includes three modules 420*l*, 420*vm*, 420*r* defined by a hypothetical pair of planes compartmentalizing the enclosure 108 into a right module 420*r*, a left module 420*l* and a vertical middle module 420*vm* sandwiched by the right module 420*r* and the left module 420*l*. The linear array of LED devices 102 is disposed exclusively in one of the modules of the enclosure 108. Alternatively, the linear array of LED devices 102 is absent from at least one of the modules of the enclosure 108. Alternatively, the linear array of LED devices 102 is disposed in all modules of the enclosure 108. In FIG. 27, the linear array of LED devices 102 is disposed exclusively in the vertical middle module 420*vm* of the enclosure 108 and is spaced apart by the vertical middle module 420*vm* from the right module 420*r* and the left module 420*l*. In an embodiment, the vertical middle module 420*vm* includes a wavelength converter for converting blue light emitting from the LED device 102 into white light. The right module 420*r* includes a cylindrical lens for aligning the light beaming rightwards. The left module 420*l* includes a cylindrical lens for aligning the light beaming leftwards. In another embodiment, the vertical middle module 420*vm* is made harder than the right module 420*r*, the left module 420*l* or both by, for example, embedding a greater concentration of phosphor particles in the vertical middle module 420*vm* than in the right module 420*r*, the left module 420*l* or both. The vertical middle module 420*vm*, because it is harder, is thus configured to better protect the linear array of LED devices 102 from malfunctioning when the LED filament 100 is bent to maintain a desired posture in a light bulb. The right module 420*r* (or the left module 420*l*) is made softer for keeping the entire LED filament 100 as bendable in the light bulb as it requires for generating omnidirectional light with, preferably, exactly one LED filament 100. In yet another embodiment, the vertical middle module 420*vm* has greater thermal conductivity than the right module 420*r*, the left module 420*l* or both by, for example, doping a greater concentration of nanoparticles in the vertical middle module 420*vm* than in the right module 420*r*, the left module 420*l* or both. The vertical middle module 420*vm*, having greater thermal conductivity, is thus configured to better protect the linear array of LED devices 102 from degrading or burning by removing excess heat from the LED device 102. The right module 420*r* (or the left module 420*l*), because it is spaced apart from the linear array of LED devices 102, plays a lesser role than the vertical middle module 420*vm* in cooling the LED device 102. The cost for making the LED filament 100 is thus economized when the right module 420*r* (or the left module 420*l*) is not as heavily doped with nanoparticles as the vertical middle module 420*vm*. The dimension of the vertical middle module 420*vm*, in which the linear array of LED devices 102 is exclusively disposed, in relation to the entire enclosure 108 is determined by a desired totality of considerations such as light conversion capability, bendability and thermal conductivity. Other things equal, the bigger the vertical middle module 420*vm* in relation to the entire enclosure 108, the LED filament 100 has greater light conversion capability and thermal conductivity but will be less bendable.

The third set of hypothetical planes, which are perpendicular to the longitudinal axis of the enclosure 108, intersect the enclosure 108 radially. For example, the enclosure 108 includes two alternating modules 420*f*, 420*s*, i.e. a first module 420*f* and a second module 420*s*, defined by the hypothetical set of parallel planes. In an embodiment, the hypothetical set of parallel planes intersect the enclosure 108 right at the edges of an LED device 102. The LED device 102 is disposed exclusively in the first module 420*f*. The means for electrically connecting the LED devices 102, e.g. the bond wire, is disposed exclusively in the second module 420*s*. In another embodiment, the hypothetical set of parallel planes intersect the enclosure 108 between the edges of an LED device 102. A portion of the LED device 102, excluding the edges, is disposed in the first module 420*f*; the other portion of the LED device, including the edges, is disposed in the second module 420*s*. A portion of the means for electrically connecting the LED devices 102, excluding the ends of the wiring, is disposed in the second module 420*s*; the other portion of the means for electrically connecting the LED devices, including the ends of the wiring, is disposed in the first module 420*f*. In yet another embodiment, the hypothetical set of parallel planes intersect the enclosure 108 at the space between adjacent LED devices 102. The LED device 102 is disposed exclusively in the first module 420*f*. A portion of the means for electrically connecting the LED devices 102, excluding the ends of the wiring, is disposed in the second module 420*s*; the other portion of the means for electrically connecting the LED devices, including the ends of the wiring, is disposed in the first module 420*f*. Depending on applications, the first module 420*f* is configured to have a different set of properties from that of the second module 420*s*. In an embodiment, the first module 420*f* is made harder than the second module 420*s* by, for example, embedding a greater concentration of phosphor particles in the first module 420f than in the second module 420s. The first module 420f, because it is harder, is thus configured to better protect the linear array of LED devices 102 from malfunctioning when the LED filament 100 is bent to maintain a desired posture in a light bulb. The second module 420s is made softer for keeping the entire LED filament 100 as bendable in the light bulb as it requires for generating omnidirectional light with, preferably, exactly one LED filament 100. In another embodiment, the first module 420f has greater thermal conductivity than the second module 420s by, for example, doping a greater concentration of nanoparticles in the first module 420f than in the second module 420s. The first module 420f, having greater thermal conductivity, is thus configured to better protect the linear array of LED devices 102 from degrading or burning by removing excess heat from the LED device 102. The second module 420s, because it is spaced apart from the linear array of LED devices 102, plays a lesser role than the first module 420f in cooling the LED device 102. The cost for making the LED filament 100 is thus economized when the second module 420s is not as heavily doped with nanoparticles as the first module 420f. The dimension of the first module 420f, in which the LED device 102 is disposed, in relation to the entire enclosure 108 is determined by a desired totality of considerations such as light conversion capability, bendability and thermal conductivity. Other things equal, the bigger the first module 420f in relation to the entire enclosure 108, the LED filament 100 has greater light conversion capability and thermal conductivity but will be less bendable.

Shifting to FIG. 28, the truncated LED filament 100 is further carved into a small portion and a big portion to show its internal structure. The small portion is defined by revolving the rectangle ABCD around the line CD (i.e. the longitudinal axis of the LED filament 100) for a fraction of 360 degrees. Likewise, the big portion is defined by revolving the rectangle ABCD around the line CD for the entirety of 360 degrees except for the space taken by the small portion. In an embodiment, the enclosure 108 is modularized with, for example, a hypothetical set of cylindrical surfaces in combination with a hypothetical set of planes. First, the modules of the enclosure 108 are defined by a set of hypothetical cylindrical surfaces having the longitudinal axis of the LED filament 100 as their central axis. For example, the enclosure 108 includes three modules 420e, 420m, 420o defined by a hypothetical pair of coaxial cylindrical surfaces compartmentalizing the enclosure 108 into a core module 420e, an outer module 420o and a tubular middle module 420m sandwiched by the core module 420e and the outer module 420o. The linear array of LED devices 102 is disposed exclusively in one of the modules of the enclosure 108. Alternatively, the linear array of LED devices 102 is absent from at least one of the modules of the enclosure 108. Alternatively, the linear array of LED devices 102 is disposed in all modules of the enclosure 108. In an embodiment, the outer module 420o includes a light scatterer for increasing light extraction from the LED device 102 by reducing total internal reflection. The tubular middle module 420m includes a wavelength converter for converting blue light emitting from the LED device 102 into white light. The core module 420e includes a spacer. The spacer prevents heat coming from the LED device 102 from quickly degrading the phosphor particle by keeping the phosphor particle apart from the LED device 102. Moreover, the spacer enables a uniform thickness for the tubular middle module 420m, which includes the wavelength converter, to produce uniform white light, which entails a proper combination of blue light and the phosphor light. In another embodiment, the tubular middle module 420m is made harder than the core module 420e, the outer module 420o or both by, for example, embedding a greater concentration of phosphor particles in the tubular middle module 420m than in the core module 420e, the outer module 420o or both. The tubular middle module 420m, because it is harder, is thus configured to better protect the linear array of LED devices 102 from malfunctioning when the LED filament 100 is bent to maintain a desired posture in a light bulb. The core module 420e (or the outer module 420o) is made softer for keeping the entire LED filament 100 as bendable in the light bulb as it requires for generating omnidirectional light with, preferably, exactly one LED filament 100. In yet another embodiment, the core module 420e has greater thermal conductivity than the tubular middle module 420m, the outer module 420o or both by, for example, doping a greater concentration of nanoparticles in the core module 420e than in the tubular middle module 420m, the outer module 420o or both. The core module 420e, having greater thermal conductivity, is thus configured to better protect the linear array of LED devices 102 from degrading or burning by removing excess heat from the LED device 102. The tubular middle module 420m (or the outer module 420o), because it is spaced apart from the linear array of LED devices 102, plays a lesser role than the core module 420e in cooling the LED device 102. The cost for making the LED filament 100 is thus economized when the tubular middle module 420m (or the outer module 420o) is not as heavily doped with nanoparticles as the core module 420e. The dimension of the core module 420e, in which the linear array of LED devices 102 is exclusively disposed, in relation to the entire enclosure 108 is determined by a desired totality of considerations such as light conversion capability, bendability and thermal conductivity. Other things equal, the bigger the core module 420e in relation to the entire enclosure 108, the LED filament 100 has less light conversion capability and thermal conductivity but will be more bendable. The dimension of the tubular middle module 102, which includes the wavelength converter, in relation to the entire enclosure 108 is determined by a desired totality of considerations such as light conversion capability, bendability and thermal conductivity. Other things equal, the bigger the tubular middle module 420m in relation to the entire enclosure 108, the LED filament 100 has greater light conversion capability and thermal conductivity but will be less bendable. Next, the modules of the enclosure 108 are defined by a hypothetical set of parallel planes, which are perpendicular to the longitudinal axis of the enclosure 108 and intersect the enclosure 108 radially. For example, the enclosure 108 includes two alternating modules 420f, 420s, i.e. a first module 420f and a second module 420s, defined by the hypothetical set of parallel planes. In an embodiment, the hypothetical set of parallel planes intersect the enclosure 108 right at the edges of an LED device 102. The LED device 102 is disposed exclusively in the first module 420f. The means for electrically connecting the LED devices 102, e.g. the bond wire, is disposed exclusively in the second module 420s. In another embodiment, the hypothetical set of parallel planes intersect the enclosure 108 between the edges of an LED device 102. A portion of the LED device 102, excluding the edges, is disposed in the first module 420f; the other portion of the LED device 102, including the edges, is disposed in the second module 420s. A portion of the means for electrically connecting the LED devices 102, excluding the ends of the wiring, is disposed in the second module 420s; the other portion of the means for electrically connecting the LED devices 102, including the ends of the wiring, is disposed in the first module 420f. In yet another embodiment, the hypothetical set of parallel planes intersect the enclosure 108 at the space between adjacent LED devices 102. The LED device 102 is disposed exclusively in the first module 420f. A portion of the means for electrically connecting the LED devices 102, including the ends of the wiring, is disposed in the first module 420f; the other portion of the means for electrically connecting the LED devices 102, excluding the ends of the wiring, is disposed in the second module 420s. Depending on applications, the first module 420f is configured to have a different set of properties from that of the second module 420s. In an embodiment, the first module 420f is made harder than the second module 420s by, for example, embedding a greater concentration of phosphor particles in the first module 420f than in the second module 420s. The first module 420f, because it is harder, is thus configured to better protect the linear array of LED devices 102 from malfunctioning when the LED filament 100 is bent to maintain a desired posture in a light bulb. The second module 420s is made softer for keeping the entire LED filament 100 as bendable in the light bulb as it requires for generating omnidirectional light with, preferably, exactly one LED filament 100. In another embodiment, the first module 420f has greater thermal conductivity than the second module 420s by, for example, doping a greater concentration of nanoparticles in the first module 420f than in the second module 420s. The first module 420f, having greater thermal conductivity, is thus configured to better protect the linear array of LED devices 102 from degrading or burning by removing excess heat from the LED device 102. The second module 420s, because it is spaced apart from the linear array of LED devices 102, plays a lesser role than the first module 420f in cooling the LED device 102. The cost for making the LED filament 100 is thus economized when the second module 420s is not as heavily doped with nanoparticles as the first module 420f. The dimension of the first module 420f, in which the LED device 102 is disposed, in relation to the entire enclosure 108 is determined by a desired totality of considerations such as light conversion capability, bendability and thermal conductivity. Other things equal, the bigger the first module 420f in relation to the entire enclosure 108, the LED filament 100 has greater light conversion capability and thermal conductivity but will be less bendable.

The modules defined by the hypothetical set of cylindrical surfaces and the hypothetical set of planes are either continuous or not continuous. Shifting to FIG. 29, the core module 420e and the tubular middle module 420m extend longitudinally across the first module 420f of the enclosure 108 but are broken periodically and absent from the second module 420s. In other words, what would be a tubular middle module and a core module if the all modules were continuous in the second module 420s are merged into one module in the second module 420s when all modules of the enclosure 108 are not continuous. For example, the outer module 420o, which is continuous throughout the enclosure 108, includes a light scatterer for reducing total internal reflection. The first module 420f includes a tubular middle module 420m and a core module 420e. The tubular middle module 420m—sandwiched by the outer module 420o and the core module 420e—includes a wavelength converter, e.g. phosphor particles embedded in a transparent binder, for producing uniform white light, which entails a proper combination of blue light and the phosphor light. The core module 420e includes a spacer for preventing heat coming from the LED device 102 from degrading the phosphor particles in the wavelength converter prematurely. Moreover, the spacer enables a uniform thickness for the tubular middle region 420m. The second module 420s, like the tubular middle module 420m, also includes a wavelength converter. In an embodiment, the second module 420s is softer than the core module 420e, the tubular middle module 420m or both such that the LED filament 100 is as bendable as it is required to generate omnidirectional light with exactly one LED filament 100. In another embodiment, the second module 420s is less thermally conductive than the core module 420e, the tubular middle module 420m or both. The core module 420e (or the tubular middle module 420m) plays a bigger role than the second module 420s in removing heat generated by the LED device 102.

Figure 30:
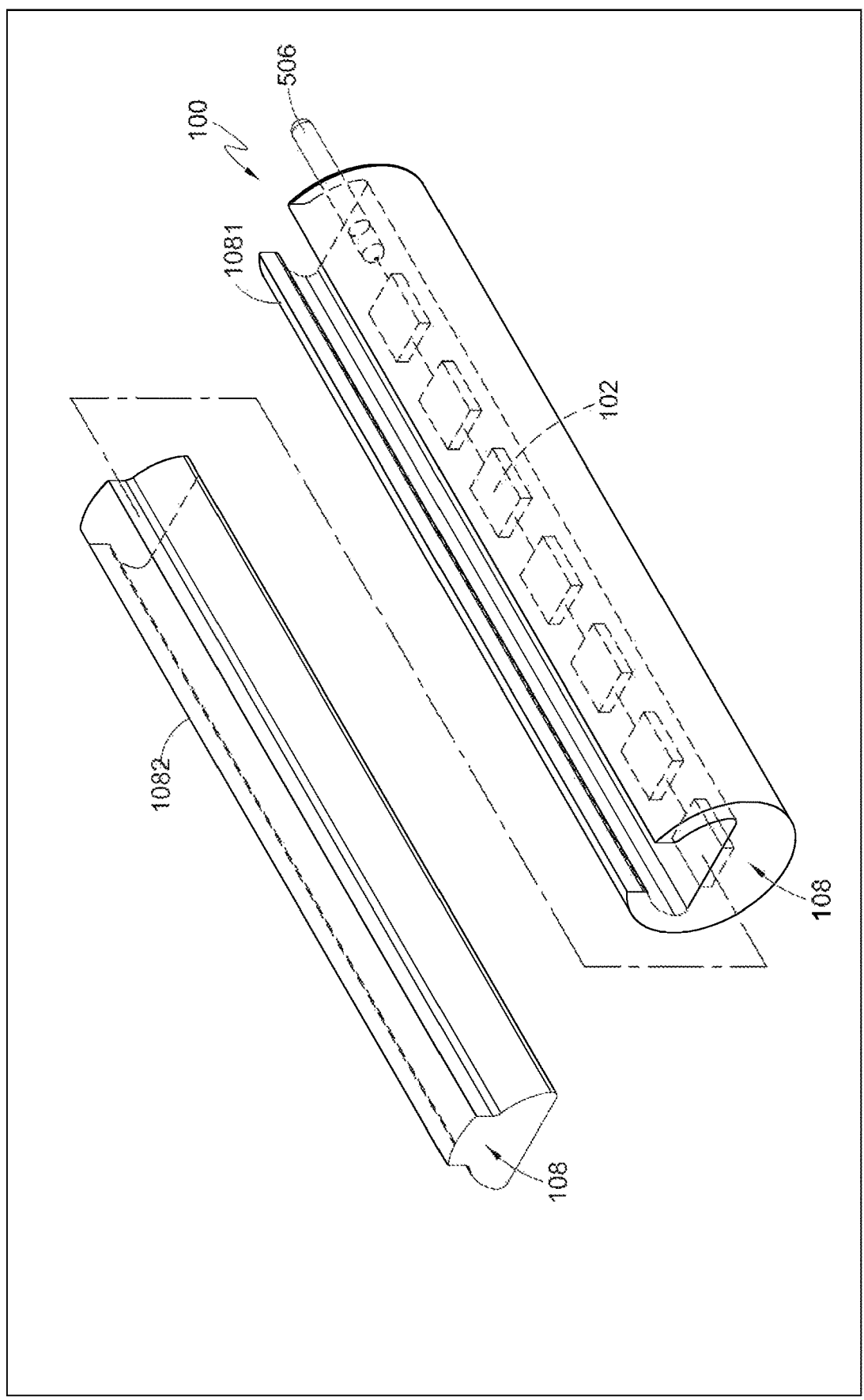
FIG. 30 shows a truncated LED filament assembled from two modules in accordance with an exemplary embodiment of the present invention.
Figure 31:
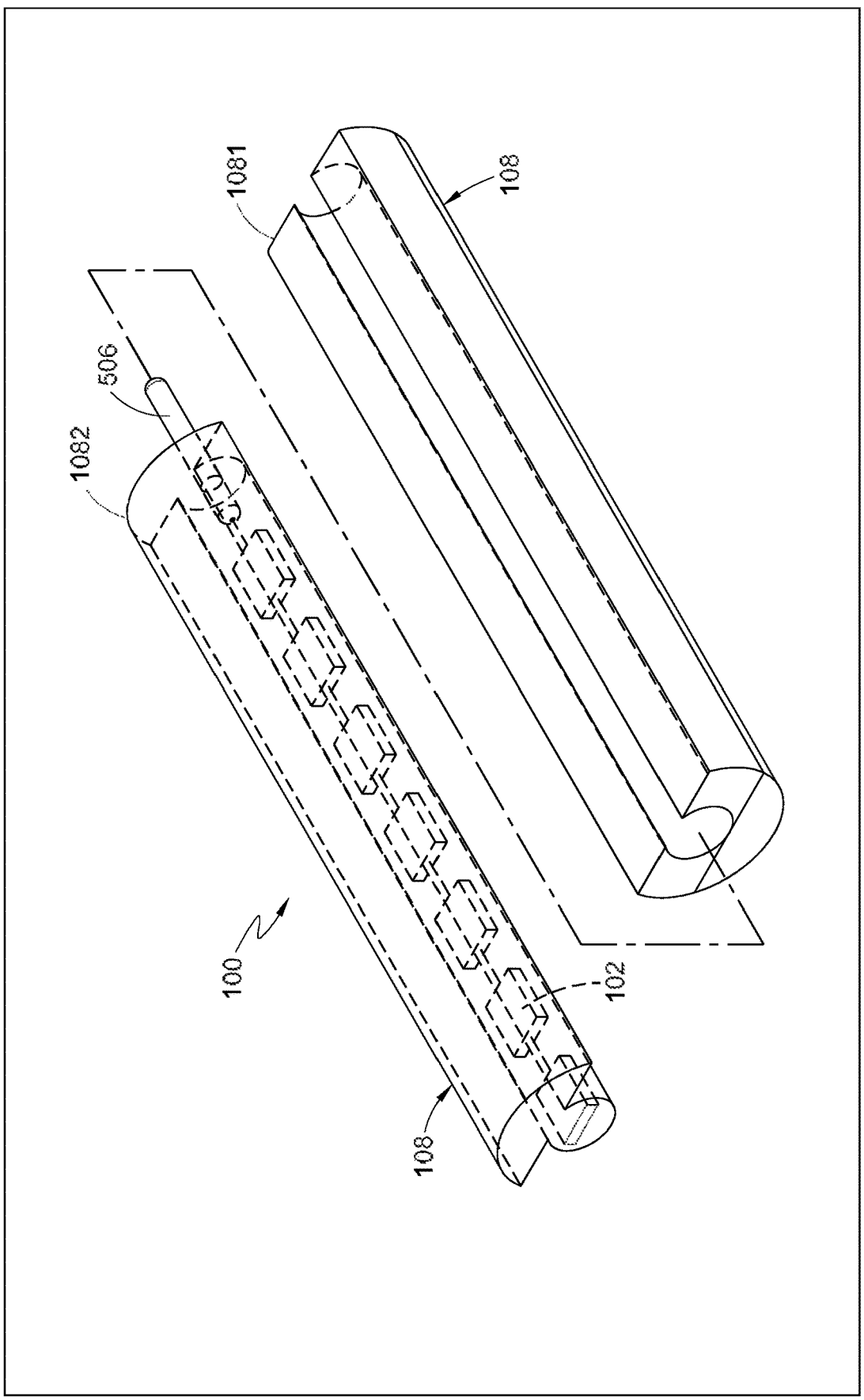
FIG. 31 shows a truncated LED filament assembled from two modules in accordance with an exemplary embodiment of the present invention.
Figure 32:
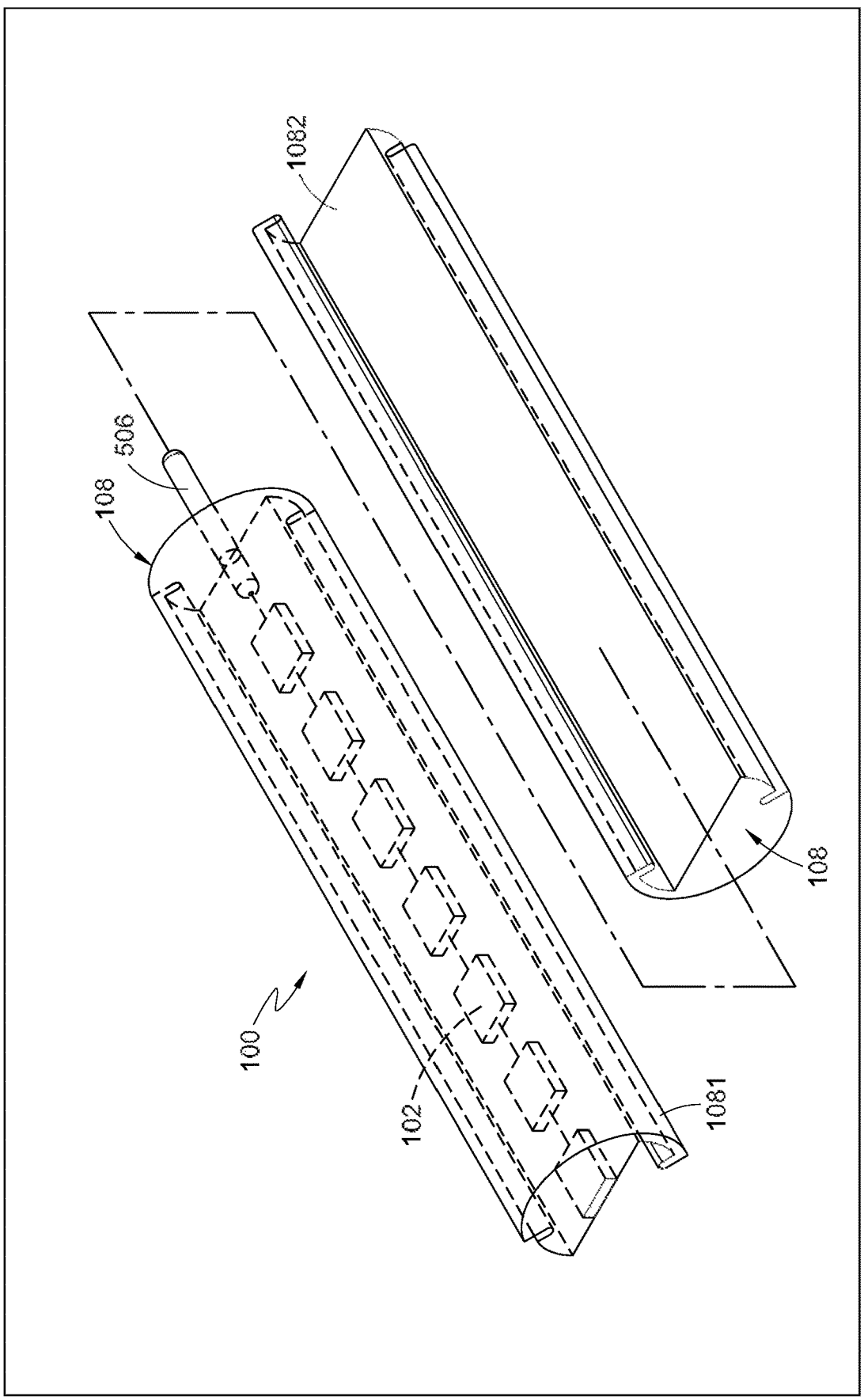
FIG. 32 shows a truncated LED filament assembled from two modules in accordance with an exemplary embodiment of the present invention.

The LED filament of the present invention is configured to withstand bending and stay operable under the working temperature of the LED device. Thus, when an enclosure includes a plurality of modules, the plurality of modules are configured to interconnect durably and form a unitary structure. In an embodiment, the interface that interconnects the plurality of modules is provided by a suitable glue that fills up the gaps between the surfaces of adjacent modules. In another embodiment, the module includes a coarse surface for strengthening the friction between adjacent modules. In yet another embodiment, the plurality of modules are connected with an interlocker, which includes a male structure and a female structure. FIGS. 30 to 32 show a truncated LED filament 100 in accordance with an exemplary embodiment of the present invention. The enclosure 108 includes a first module 1081 and a second module 1082. In FIG. 30, the linear array of LED devices 102 is disposed in the first module 1081. The first module 1081 includes a female structure for interlocking with the second module 1082 having a male structure. In FIG. 31, the linear array of LED devices 102 is disposed in the second module 1082. The first module 1081 includes a female structure for interlocking with the second module 1082 having a male structure. In FIG. 32, the linear array of LED devices 102 is disposed in the first module 1081. Both of the first module 1081 and the second module 1082 include a male structure and a female structure for interlocking the first module 1081 and the second module 1082. Related features may be referred to FIG. 49H to FIG. 49K in application of U.S. Ser. No. 15/499,143 filed Apr. 27, 2017.

Where the enclosure is a modular structure assembled from modules having diverse chemical or physical properties, the enclosure includes a plurality of modules having distinctive properties to enable a desired totality of functions for the LED filament. In some embodiments, a module in the enclosure has a uniform set of properties throughout the module. In other embodiments, the enclosure further includes a multi-functional module. The multi-functional module, though structurally indivisible, is functionally divisible into a plurality of regions having distinctive sets of properties in different regions. The plurality of modules in the enclosure and the plurality of regions in the multi-functional module can be defined in a variety of ways depending on applications. Going back to FIG. 23, the truncated LED filament 100 is further sliced vertically—i.e. along the light illuminating direction of the linear array of LED devices 102—into equal halves along the longitudinal axis of the LED filament 100 to show its internal structure. The modules 420u, 420g1 of the enclosure 108 and the regions 420w, 420m of the multi-functional module 420g1 are defined by a hypothetical plane perpendicular to the light illuminating direction of the linear array of LED devices 102. For example, the enclosure 108 includes two modules defined by a hypothetical pair of planes compartmentalizing the enclosure 108 into an upper module 420u and a multi-functional module 420g1 having a lower region 420w and a middle region 420m sandwiched by the upper module 420u and the lower region 420w. The linear array of LED devices 102 is disposed exclusively in one of the modules of the enclosure 108. Alternatively, the linear array of LED devices 102 is absent from at least one of the modules of the enclosure 108. Alternatively, the linear array of LED devices 102 is disposed in all modules of the enclosure 108. When at least a portion of the linear array of LED devices 102 is found in the multi-functional module 420g1, the portion of the linear array of LED devices 102 is disposed exclusively in one of the regions of the multi-functional module 420g1. Alternatively, the portion of the linear array of LED devices 102 is absent from at least one of the regions of the multi-functional module 420g1. Alternatively, the portion of the linear array of LED devices 102 is disposed in all regions of the multi-functional module 420g1. Staying on FIG. 23, the linear array of LED devices 102 is disposed exclusively in the middle region 420m of the multi-functional module 420g1 and is spaced apart by the middle region 420m of the multi-functional module 420g1 from the top module 420u and the lower region 420w of the multi-functional module 420g1. In an embodiment, the middle region 420m of multi-functional module 420g1 includes a wavelength converter for converting blue light emitting from the LED device 102 into white light. The upper module 420u includes a cylindrical lens for aligning the light beaming upwards. The lower region 420w of the multi-functional module 420g1 includes a cylindrical lens for aligning the light beaming downwards. In another embodiment, the middle region 420m of the multi-functional module 420g1 is made harder than the upper module 420u, the lower region 420w of the multi-functional module 420g1 or both by, for example, embedding a greater concentration of phosphor particles in the middle region 420m of the multi-functional module 420g1 than in the upper module 420u, the lower region 420w of the multi-functional module 420g1 or both. The middle region 420m of the multi-functional module 420g1, because it is harder, is thus configured to better protect the linear array of LED devices 102 from malfunctioning when the LED filament 100 is bent to maintain a desired posture in a light bulb. The upper module 420u (or the lower region 420w of the multi-functional module 420g1) is made softer for keeping the entire LED filament 100 as bendable in the light bulb as it requires for generating omnidirectional light with preferably exactly one LED filament 100. In yet another embodiment, the middle region 420m of the multi-functional module 420g1 has greater thermal conductivity than the upper module 420u, the lower region 420w of the multi-functional module 420g1 or both by, for example, doping a greater concentration of nanoparticles in the middle region 420m of the multi-functional module 420g1 than the upper module 420u, the lower region 420w of the multi-functional module 420g1 or both. The middle region 420m of the multi-functional module 420g1, having greater thermal conductivity, is thus configured to better protect the linear array of LED devices 102 from degrading or burning by removing excess heat from the LED device 102. The upper module 420u (or the lower region 420w of the multi-functional module 420g1), because it is spaced apart from the linear array of LED devices 102, plays a lesser role than the middle region 420m of the multi-functional module 420g1 in cooling the LED device 102. The cost for making the LED filament 100 is thus economized when the upper module 420u (or the lower region 420w of the multi-functional module) is not as heavily doped with nanoparticles as the middle region 420m of the multi-functional module 420g1. The dimension of the middle region 420m of the multi-functional module 420g1, in which the linear array of LED devices 102 is exclusively disposed, in relation to the entire enclosure 108 is determined by a desired totality of considerations such as light conversion capability, bendability and thermal conductivity. Other things equal, the bigger the middle region 420m of the multi-functional module 420g1 in relation to the entire enclosure 108, the LED filament 100 has greater light conversion capability and thermal conductivity but will be less bendable. A cross section of the enclosure 108 perpendicular to the longitudinal axis of the LED filament 100 reveals the middle region 420m of the multi-functional module 420g1 and other modules of the enclosure 108. R11 is a ratio of the area of the middle region 420m of the multi-functional module 420g1 to the overall area of the cross section of the enclosure 108. Preferably, R11 is from 0.2 to 0.8. Most preferably, R11 is from 0.4 to 0.6.

Shifting to FIG. 24, the truncated LED filament 100 is further sliced horizontally—i.e. perpendicular to the light illuminating direction of the linear array of LED devices 102—into equal halves along the longitudinal axis of the LED filament 100 in order to show its internal structure. The modules 420r, 420g2 of the enclosure 108 and the regions 420l, 420m of the multi-functional module 420g2 are defined by a hypothetical plane parallel to the light illuminating direction of the linear array of LED devices 102. For example, the enclosure 108 includes two modules 420r, 420g2 defined by a hypothetical pair of planes compartmentalizing the enclosure 108 into a right module 420r and a multi-functional module 420g2 having a left region 420l and a middle region 420m sandwiched by the right module 420r and the left region 420l of the multi-functional module 420g2. The linear array of LED devices 102 is disposed exclusively in one of the modules of the enclosure 108. Alternatively, the linear array of LED devices 102 is absent from at least one of the modules of the enclosure 108. Alternatively, the linear array of LED devices 102 is disposed in all modules of the enclosure 108. When at least a portion of the linear array of LED devices 102 is found in the multi-functional module 420g2, the portion of the linear array of LED devices 102 is disposed exclusively in one of the regions of the multi-functional module 420g2. Alternatively, the portion of the linear array of LED devices 102 is absent from at least one of the regions of the multi-functional module 420g2. Alternatively, the portion of the linear array of LED devices 420g2 is disposed in all regions of the multi-functional module 420g2. Staying on FIG. 24, the linear array of LED devices 102 is disposed exclusively in the middle region 420m of the multi-functional module 420g2 and is spaced apart by the middle region 420m of the multi-functional module 420g2 from the right module 420r and the left region 420l of the multi-functional module 420g2. In an embodiment, the middle region 420m of the multi-functional module 420g2 includes a wavelength converter for converting blue light emitting from the LED device 102 into white light. The right module 420r includes a cylindrical lens for aligning the light beaming rightwards. The left region 420l of the multi-functional module 243 includes a cylindrical lens for aligning the light beaming leftwards. In another embodiment, the middle region 420m of the multi-functional module 240g2 is made harder than the right module 420r, the left region 420l of the multi-functional module 420g2 or both by, for example, embedding a greater concentration of phosphor particles in the middle region 420*m* of the multi-functional module 420*g*2 than in the right module 420*r*, the left region 420*l* of the multi-functional module 420*g*2 or both. The middle region 420*m* of the multi-functional module 420*g*2, because it is harder, is thus configured to better protect the linear array of LED devices 102 from malfunctioning when the LED filament 100 is bent to maintain a desired posture in a light bulb. The right module 420*r* (or the left region 420*l* of the multi-functional module 420*g*2) is made softer for keeping the entire LED filament 100 as bendable in the light bulb as it requires for generating omnidirectional light with, preferably, exactly one LED filament 100. In yet another embodiment, the middle region 420*m* of the multi-functional module 420*g*2 has greater thermal conductivity than the right module 420*r*, the left region 420*l* of the multi-functional module 420*g*2 or both by, for example, doping a greater concentration of nanoparticles in the middle region 420*m* of the multi-functional module 420*g*2 than in the right module 420*r*, the left region 420*l* of the multi-functional module 420*g*2 or both. The middle region 420*m* of the multi-functional module 420*g*2, having greater thermal conductivity, is thus configured to better protect the linear array of LED devices 102 from degrading or burning by removing excess heat from the LED device 102. The right module 420*r* (or the left region 420*l* of the multi-functional module 420*g*2), because it is spaced apart from the linear array of LED devices 102, plays a lesser role than the middle region 420*m* of the multi-functional module 420*g*2 in cooling the LED device 102. The cost for making the LED filament 100 is thus economized when the right module 420*r* (or the left region 420*l* of the multi-functional module 420*g*2) is not as heavily doped with nanoparticles as the middle region 420*m* of the multi-functional module 420*g*2. The dimension of the middle region 420*m* of the multi-functional module 420*g*2, in which the linear array of LED devices 102 is exclusively disposed, in relation to the entire enclosure 108 is determined by a desired totality of considerations such as light conversion capability, bendability and thermal conductivity. Other things equal, the bigger the middle region 420*m* of the multi-functional module 420*g*2 in relation to the entire enclosure 108, the LED filament 100 has greater light conversion capability and thermal conductivity but will be less bendable. A cross section of the enclosure 108 perpendicular to the longitudinal axis of the LED filament 100 reveals the middle region 420*m* of the multi-functional module 420*g*2 and other modules of the enclosure 108. R12 is a ratio of the area of the middle region 420*m* of the multi-functional module 420*g*2 to the overall area of the cross section of the enclosure 108. Preferably, R12 is from 0.2 to 0.8. Most preferably, R12 is from 0.4 to 0.6.

Shifting to FIG. 25, the truncated LED filament 100 is further carved into a small portion and a big portion to show its internal structure. The small portion is defined by revolving the rectangle ABCD around the line CD (i.e. the central axis of the LED filament 100) for a fraction of 360 degrees. Likewise, the big portion is defined by revolving the rectangle ABCD around the line CD for the entirety of 360 degrees except for the space taken by the small portion. The modules 420*e*, 420*g*3 of the enclosure 108 and the regions 420*m*, 420*o* of the multi-functional module 420*g*3 are defined by a hypothetical cylindrical surface having the central axis of the LED filament 100 as its central axis. For example, the enclosure 108 includes two modules 420*e*, 420*g*3 defined by a hypothetical pair of coaxial cylindrical surfaces compartmentalizing the enclosure 108 into a core module 420*e*, a multi-functional module 420*g*3 having an outer region 420*o* and a middle region 420*m* sandwiched by the core module 420*e* and the outer region 420*o* of the multi-functional module 420*g*3. The linear array of LED devices 102 is disposed exclusively in one of the modules of the enclosure 108. Alternatively, the linear array of LED devices 102 is absent from at least one of the modules of the enclosure 108. Alternatively, the linear array of LED devices 102 is disposed in all modules of the enclosure 108. When at least a portion of the linear array of LED devices 102 is found in the multi-functional module 420*g*3, the portion of the linear array of LED devices 102 is disposed exclusively in one of the regions of the multi-functional module 420*g*3. Alternatively, the portion of the linear array of LED devices 102 is absent from at least one of the regions of the multi-functional module 420*g*3. Alternatively, the portion of the linear array of LED devices 102 is disposed in all regions of the multi-functional module 420*g*3. Staying on FIG. 25, the linear array of LED devices 102 is disposed exclusively in the core module 420*e* of the enclosure 108 and is spaced apart by the core module 420*e* from the middle region 420*m* of the multi-functional module 420*g*3 and the outer region 420*o* of the multi-functional module 420*g*3. In an embodiment, the outer region 420*o* of the multi-functional module 420*g*3 includes a light scatterer for increasing light extraction from the LED device 102 by reducing total internal reflection. The middle region 420*m* of the multi-functional module 420*e* includes a wavelength converter for converting blue light emitting from the LED device 102 into white light. The core module 420*e* includes a spacer. The spacer prevents heat coming from the LED device 102 from quickly degrading the phosphor particle by keeping the phosphor particle apart from the LED device 102. Moreover, the spacer enables a uniform thickness for the middle region 420*m* of the multi-functional module 420*g*3, which includes the wavelength converter, to produce uniform white light, which entails a proper combination of blue light and the phosphor light. In another embodiment, the middle region 420*m* of the multi-functional module 420*g*3 is made harder than the core module 420*e*, the outer region 420*o* of the multi-functional module 420*g*3 or both by, for example, embedding a greater concentration of phosphor particles in the middle region 420*m* of the multi-functional module 420*g*3 than in the core module 420*e*, the outer region 420*o* of the multi-functional module 420*g*3 or both. The middle region 420*m* of the multi-functional module 420*g*3, because it is harder, is thus configured to better protect the linear array of LED devices 102 from malfunctioning when the LED filament 100 is bent to maintain a desired posture in a light bulb. The core module 420*e* (or the outer region 420*o* of the multi-functional module 420*g*3) is made softer for keeping the entire LED filament 100 as bendable in the light bulb as it requires for generating omnidirectional light with, preferably, exactly one LED filament 100. In yet another embodiment, the core module 420*e* has greater thermal conductivity than the middle region 420*m* of the multi-functional module 420*g*3, the outer region 420*o* of the multi-functional module 420*g*3 or both by, for example, doping a greater concentration of nanoparticles in the core module 420*e* than in the middle region 420*m* of the multi-functional module 420*g*3, the outer region 420*o* of the multi-functional module 420*g*3 or both. The core module 420*e*, having greater thermal conductivity, is thus configured to better protect the linear array of LED devices 102 from degrading or burning by removing excess heat from the LED device 102. The middle region 420*m* of the multi-functional module 420*g*3 (or the outer region 420*o* of the multi-functional module 420*g*3), because it is spaced apart from the linear array of LED devices 102, plays a lesser role than the core module 420e in cooling the LED device 102. The cost for making the LED filament 100 is thus economized when the middle region 420m of the multi-functional module 420g3 (or the outer region 420o of the multi-functional module 420g3) is not as heavily doped with nanoparticles as the core module 420e. The dimension of the core module 420e, in which the linear array of LED devices 102 is exclusively disposed, in relation to the entire enclosure 108 is determined by a desired totality of considerations such as light conversion capability, bendability and thermal conductivity. Other things equal, the bigger the core module 420e in relation to the entire enclosure 108, the LED filament 100 has less light conversion capability and thermal conductivity but will be more bendable. A cross section of the enclosure 108 perpendicular to the longitudinal axis of the LED filament 100 reveals the core module 420e and other modules of the enclosure 108. R13 is a ratio of the area of the core module 420e to the overall area of the cross section of the enclosure 108. Preferably, R13 is from 0.1 to 0.8. Most preferably, R13 is from 0.2 to 0.5. The dimension of the middle region 420m of the multi-functional module 420g3, which includes the wavelength converter, in relation to the entire enclosure 108 is determined by a desired totality of considerations such as light conversion capability, bendability and thermal conductivity. Other things equal, the bigger the middle region 420m of the multi-functional module 420g3 in relation to the entire enclosure 108, the LED filament 100 has greater light conversion capability and thermal conductivity but will be less bendable. A cross section of the enclosure 108 perpendicular to the longitudinal axis of the LED filament 100 reveals the middle region 420m of the multi-functional module 420g3 and other portions of the enclosure 108. R14 is a ratio of the area of the middle region 420m of the multi-functional module 420g3 to the overall area of the cross section of the enclosure 108. Preferably, R14 is from 0.1 to 0.8. Most preferably, R14 is from 0.2 to 0.5.

Shifting to FIG. 26, the truncated LED filament 100 is further carved into a small portion and a big portion to show its internal structure. Like FIG. 25, the small portion is defined by revolving the rectangle ABCD around the line CD (i.e. the central axis of the LED filament 100) for a fraction of 360 degrees. Likewise, the big portion is defined by revolving the rectangle ABCD around the line CD for the entirety of 360 degrees except for the space taken by the small portion. The modules of the enclosure 108 and the regions of the multi-functional module are defined by a hypothetical set of parallel planes intersecting the enclosure 108 perpendicularly to the longitudinal axis of the enclosure 108. For example, the enclosure 108 includes a plurality of serially connected multi-functional modules 420g4. The multi-functional module 420g4 includes a first region 420f and a second region 420s. The pair of alternating regions 420f, 420s in the enclosure 108, i.e. a first region 420f and a second region 420s, are defined by a hypothetical set of parallel planes. In an embodiment, the hypothetical set of parallel planes intersect the enclosure 108 right at the edges of an LED device 102. The LED device 102 is disposed exclusively in the first region 420f of the multi-functional module 420g4. The means for electrically connecting the LED devices 102, e.g. the bond wire, is disposed exclusively in the second region 420s of the multi-functional module 420g4. In another embodiment, the hypothetical set of parallel planes intersect the enclosure 108 between the edges of an LED device 102. A portion of the LED device 102, excluding the edges, is disposed in the first region 420f of the multi-functional module 420g4; the other portion of the LED device 102, including the edges, is disposed in the second region 420s of the multi-functional module 420g4. The means for electrically connecting the LED devices 102, including the ends of the wiring, is disposed in the second region 420s of the multi-functional module 420g4. In yet another embodiment, the hypothetical set of parallel planes intersect the enclosure 108 at the space between adjacent LED devices 102. The LED device 102 is disposed exclusively in the first region 420f of the multi-functional module 420g4. A portion of the means for electrically connecting the LED devices 102, including the ends of the wiring, is disposed in the first region 420f of the multi-functional module 420g4; the other portion of the means for electrically connecting the LED devices 102, excluding the ends of the wiring, is disposed in the second region 420s of the multi-functional module 420g4. Depending on applications, the first region 420f of the multi-functional module 420g4 is configured to have a different set of properties from that of the second region 420s of the multi-functional module 420g4. In an embodiment, the first region 420f of the multi-functional module 420g4 is made harder than the second region 420s of the multi-functional module 420g4 by, for example, embedding a greater concentration of phosphor particles in the first region 420f of the multi-functional module 420g4 than in the second region 420s of the multi-functional module 420g4. The first region 420f of the multi-functional module 420g4, because it is harder, is thus configured to better protect the linear array of LED devices 102 from malfunctioning when the LED filament 100 is bent to maintain a desired posture in a light bulb. The second region 420s of the multi-functional module 420g4 is made softer for keeping the entire LED filament 100 as bendable in the light bulb as it requires for generating omnidirectional light with, preferably, exactly one LED filament 100. In another embodiment, the first region 420f of the multi-functional module 420g4 has greater thermal conductivity than the second region 420s of the multi-functional module 420g4 by, for example, doping a greater concentration of nanoparticles in the first region 420f of the multi-functional module 420g4 than in the second region 420s of the multi-functional module 420g4. The first region 420f of the multi-functional module 420g4, having greater thermal conductivity, is thus configured to better protect the linear array of LED devices 102 from degrading or burning by removing excess heat from the LED device 102. The second region 420s of the multi-functional module 420g4, because it is spaced apart from the linear array of LED devices 102, plays a lesser role than the first region 420f of the multi-functional module 420g4 in cooling the LED device 102. The cost for making the LED filament 100 is thus economized when the second region 420s of the multi-functional module 420g4 is not as heavily doped with nanoparticles as the first region 420f of the multi-functional module 420g4. The dimension of the first region 420f of the multi-functional module 420g4, in which the LED device 102 is disposed, in relation to the entire enclosure 108 is determined by a desired totality of considerations such as light conversion capability, bendability and thermal conductivity. Other things equal, the bigger the first region 420f of the multi-functional module 420g4 in relation to the entire enclosure 108, the LED filament 100 has greater light conversion capability and thermal conductivity but will be less bendable. An outer surface of the enclosure 108 shows a combination of the first region 420f of the multi-functional module 420g4 and other regions of the multi-functional module 420g4. R15 is a ratio of the total area of the first regions 420f of the multi-functional modules 420g4 found on the outer surface to the overall area of the outer surface of the enclosure 108. Preferably, R15 is from 0.2 to 0.8. Most preferably, R15 is from 0.4 to 0.6.

The ways illustrated above in which an enclosure is divided into modules, including a multi-functional module, having distinctive properties can be employed in combination with one another, in FIGS. 27 and 29 as examples, to functionalize an LED filament 100 as desired. In FIG. 27, the truncated LED filament 100 is further carved into a small portion and a big portion to show its internal structure. The small portion is defined by revolving the rectangle ABCD around the line CD (i.e. the longitudinal axis of the LED filament 100) for 90 degrees. Likewise, the big portion is defined by revolving the rectangle ABCD around the line CD for the entirety of 360 degrees except for the space taken by the small portion. For example, the enclosure 108 is modularized with a first set of hypothetical planes. The module thus defined is further regionalized with a second set of hypothetical planes and with a third set of hypothetical planes. The first set of hypothetical planes intersect the enclosure 108 perpendicularly to the longitudinal axis of the enclosure 108. For example, the enclosure 108 includes two alternating multi-functional modules 420f, 420s, i.e. a first multi-functional module 420f and a second multi-functional module 420s, defined by the hypothetical set of parallel planes. In an embodiment, the hypothetical set of parallel planes intersect the enclosure 108 right at the edges of an LED device 102. The LED device 102 is disposed exclusively in the first multi-functional module 420f. The means for electrically connecting the LED devices 102, e.g. the bond wire, is disposed exclusively in the second multi-functional module 420s. In another embodiment, the hypothetical set of parallel planes intersect the enclosure 108 between the edges of an LED device 102. A portion of the LED device 102, excluding the edges, is disposed in the first multi-functional module 420f; the other portion of the LED device 102, including the edges, is disposed in the second multi-functional module 420s. The means for electrically connecting the LED devices 102, including the ends of the wiring, is disposed in the second multi-functional module 420s. In yet another embodiment, the hypothetical set of parallel planes intersect the enclosure 108 at the space between adjacent LED devices 102. The LED device 102 is disposed exclusively in the first multi-functional module 420f. A portion of the means for electrically connecting the LED devices 102, excluding the ends of the wiring, is disposed in the second multi-functional module 420s; the other portion of the means for electrically connecting the LED devices 102, including the ends of the wiring, is disposed in the first multi-functional module 420f. Depending on applications, the first multi-functional module 420f is configured to have a different set of properties from that of the second multi-functional module 420s. In an embodiment, the first multi-functional module 420f is made harder than the second multi-functional module 420s by, for example, embedding a greater concentration of phosphor particles in the first multi-functional module 420f than in the second multi-functional module 420s. The first multi-functional module 420f, because it is harder, is thus configured to better protect the linear array of LED devices 102 from malfunctioning when the LED filament 100 is bent to maintain a desired posture in a light bulb. The second multi-functional module 420s is made softer for keeping the entire LED filament 100 as bendable in the light bulb as it requires for generating omnidirectional light with, preferably, exactly one LED filament 100. In another embodiment, the first multi-functional module 420f has greater thermal conductivity than the second multi-functional module 420s by, for example, doping a greater concentration of nanoparticles in the first multi-functional module 420f than in the second multi-functional module 420s. The first multi-functional module 420f, having greater thermal conductivity, is thus configured to better protect the linear array of LED devices 102 from degrading or burning by removing excess heat from the LED device 102. The second multi-functional module 420s, because it is spaced apart from the linear array of LED devices 102, plays a lesser role than the first multi-functional module 420f in cooling the LED device 102. The cost for making the LED filament 100 is thus economized when the second multi-functional module 420s is not as heavily doped with nanoparticles as the first multi-functional module 420f. The dimension of the first multi-functional module 420f, in which the LED device 102 is disposed, in relation to the entire enclosure 108 is determined by a desired totality of considerations such as light conversion capability, bendability and thermal conductivity. Other things equal, the bigger the first multi-functional module 420f in relation to the entire enclosure 108, the LED filament 100 has greater light conversion capability and thermal conductivity but will be less bendable.

Staying on FIG. 27, the second set of hypothetical planes intersect the enclosure 108 perpendicularly to the light illuminating direction of the linear array of LED devices 102. For example, the multi-functional module 420f, 420s descried above includes three regions 420u, 420hm, 420w defined by a hypothetical pair of planes compartmentalizing the multi-functional module 420f, 420s into an upper region 420u, a lower region 420w and a horizontal middle region 420hm sandwiched by the upper region 420u and the lower region 420w. The linear array of LED devices 102 is disposed exclusively in one of the regions of the multi-functional module. Alternatively, the linear array of LED devices 102 is absent from at least one of the regions of the multi-functional module. Alternatively, the linear array of LED devices 102 is disposed in all regions of the multi-functional module. Staying on FIG. 27, the linear array of LED devices 102 is disposed exclusively in the horizontal middle region 420hm of the multi-functional module 420f, 420s and is spaced apart by the horizontal middle region 420hm from the top region 420u and the lower region 420w. In an embodiment, the horizontal middle region 420hm includes a wavelength converter for converting blue light emitting from the LED device 102 into white light. The upper region 420u includes a cylindrical lens for aligning the light beaming upwards. The lower region 420w includes a cylindrical lens for aligning the light beaming downwards. In another embodiment, the horizontal middle region 420hm is made harder than the upper region 420u, the lower region 420w or both by, for example, embedding a greater concentration of phosphor particles in the horizontal middle region 420hm than in the upper region 420u, the lower region 420w or both. The horizontal middle region 420hm, because it is harder, is thus configured to better protect the linear array of LED devices 102 from malfunctioning when the LED filament 100 is bent to maintain a desired posture in a light bulb. The upper region 420u (or the lower region 420w) is made softer for keeping the entire LED filament 100 as bendable in the light bulb as it requires for generating omnidirectional light with preferably exactly one LED filament 100. In yet another embodiment, the horizontal middle region 420hm has greater thermal conductivity than the upper region 420u, the lower region 420w or both by, for example, doping a greater concentration of nanoparticles in the horizontal middle region 420*hm* than in the upper region 420*u*, the lower region 420*w* or both. The horizontal middle region 420*hm*, having greater thermal conductivity, is thus configured to better protect the linear array of LED devices 102 from degrading or burning by removing excess heat from the LED device 102. The upper region 420*u* (or the lower region 420*w*), because it is spaced apart from the linear array of LED devices 102, plays a lesser role than the horizontal middle region 420*hm* in cooling the LED device 102. The cost for making the LED filament 100 is thus economized when the upper region 420*u* (or the lower region 420*w*) is not as heavily doped with nanoparticles as the horizontal middle region 420*hm*. The dimension of the horizontal middle region 420*hm*, in which the linear array of LED devices 102 is exclusively disposed, in relation to the entire enclosure 108 is determined by a desired totality of considerations such as light conversion capability, bendability and thermal conductivity. Other things equal, the bigger the horizontal middle region 420*hm* in relation to the entire enclosure 108, the LED filament 100 has greater light conversion capability and thermal conductivity but will be less bendable.

Staying on FIG. 27, the third set of hypothetical planes intersect the enclosure 108 parallelly to the light illuminating direction of the linear array of LED devices 102. For example, the multi-functional module 420*f*, 420*s* described above includes three regions 420*l*, 420*vm*, 420*r* defined by a hypothetical pair of planes compartmentalizing the multi-functional module 420*f*, 420*s* into a right region 420*r*, a left region 420*l* and a vertical middle region 420*vm* sandwiched by the right region 420*r* and the left region 420*l*. The linear array of LED devices 102 is disposed exclusively in one of the regions of the multi-functional module 420*f*, 420*s*. Alternatively, the linear array of LED devices 102 is absent from at least one of the regions of the multi-functional module 420*f*, 420*s*. Alternatively, the linear array of LED devices 102 is disposed in all regions of the multi-functional module 420*f*, 420*s*. In FIG. 27, the linear array of LED devices 102 is disposed exclusively in the vertical middle region 420*vm* of the multi-functional module 420*f*, 420*s* and is spaced apart by the vertical middle region 420*vm* from the right region 420*r* and the left region 420*l*. In an embodiment, the vertical middle region 420*vm* includes a wavelength converter for converting blue light emitting from the LED device 102 into white light. The right region 420*r* includes a cylindrical lens for aligning the light beaming rightwards. The left region 420*l* includes a cylindrical lens for aligning the light beaming leftwards. In another embodiment, the vertical middle region 420*vm* is made harder than the right region 420*r*, the left region 420*l* or both by, for example, embedding a greater concentration of phosphor particles in the vertical middle region 420*vm* than in the right region 420*r*, the left region 420*l* or both. The vertical middle region 420*vm*, because it is harder, is thus configured to better protect the linear array of LED devices 102 from malfunctioning when the LED filament 100 is bent to maintain a desired posture in a light bulb. The right region (or the left region) is made softer for keeping the entire LED filament 100 as bendable in the light bulb as it requires for generating omnidirectional light with, preferably, exactly one LED filament 100. In yet another embodiment, the vertical middle region 420*vm* has greater thermal conductivity than the right region 420*r*, the left region 420*l* or both by, for example, doping a greater concentration of nanoparticles in the vertical middle region 420*vm* than in the right region 420*r*, the left region 420*l* or both. The vertical middle region 420*vm*, having greater thermal conductivity, is thus configured to better protect the linear array of LED devices 102 from degrading or burning by removing excess heat from the LED device 102. The right region 420*r* (or the left region 420*l*), because it is spaced apart from the linear array of LED devices 102, plays a lesser role than the vertical middle region 420*vm* in cooling the LED device 102. The cost for making the LED filament 100 is thus economized when the right region 420*r* (or the left region 420*l*) is not as heavily doped with nanoparticles as the vertical middle region 420*vm*. The dimension of the vertical middle region 420*vm*, in which the linear array of LED devices 102 is exclusively disposed, in relation to the entire enclosure 108 is determined by a desired totality of considerations such as light conversion capability, bendability and thermal conductivity. Other things equal, the bigger the vertical middle region 420*vm* in relation to the entire enclosure 108, the LED filament 100 has greater light conversion capability and thermal conductivity but will be less bendable.

Shifting to FIG. 28, the truncated LED filament 100 is further carved into a small portion and a big portion to show its internal structure. The small portion is defined by revolving the rectangle ABCD around the line CD (i.e. the longitudinal axis of the LED filament 100) for a fraction of 360 degrees. Likewise, the big portion is defined by revolving the rectangle ABCD around the line CD for the entirety of 360 degrees except for the space taken by the small portion. In an embodiment, the enclosure 108 is modularized and regionalized with, for example, a hypothetical set of cylindrical surfaces in combination with a hypothetical set of planes. First, the multifunctional modules of the enclosure 108 are defined by a hypothetical set of parallel planes intersecting the enclosure 108 perpendicularly to the longitudinal axis of the enclosure 108. For example, the enclosure 108 includes two alternating multifunctional modules 420*f*, 420*s*, i.e. a first module 420*f* and a second module 420*s*, defined by the hypothetical set of parallel planes. In an embodiment, the hypothetical set of parallel planes intersect the enclosure 108 right at the edges of the LED device 102. The LED device 102 is disposed exclusively in the first module 420*f*. The means for electrically connecting the LED devices 102, e.g. the bond wire, is disposed exclusively in the second module 420*s*. In another embodiment, the hypothetical set of parallel planes intersect the enclosure 108 between the edges of the LED device 102. A portion of the LED device 102, excluding the edges, is disposed in the first module 420*f*; the other portion of the LED device 102, including the edges, is disposed in the second module 420*s*. The means for electrically connecting the LED devices 102, including the ends of the wiring, is disposed in the second module 420*s*. In yet another embodiment, the hypothetical set of parallel planes intersect the enclosure 108 at the space between adjacent LED devices 102. The LED device 102 is disposed exclusively in the first module 420*f*. A portion of the means for electrically connecting the LED devices 102, excluding the ends of the wiring, is disposed in the second module 420*s*; the other portion of the means for electrically connecting the LED devices 102, including the ends of the wiring, is disposed in the first module 420*f*. Depending on applications, the first module 420*f* is configured to have a different set of properties from that of the second module 420*s*. In an embodiment, the first module 420*f* is made harder than the second module 420*s* by, for example, embedding a greater concentration of phosphor particles in the first module 420*f* than in the second module 420*s*. The first module 420*f*, because it is harder, is thus configured to better protect the linear array of LED devices 102 from malfunctioning when the LED filament 100 is bent to maintain a desired posture in a light bulb. The second module 420s is made softer for keeping the entire LED filament 100 as bendable in the light bulb as it requires for generating omnidirectional light with, preferably, exactly one LED filament 100. In another embodiment, the first module 420f has greater thermal conductivity than the second module 420s by, for example, doping a greater concentration of nanoparticles in the first module 420f than in the second module 420s. The first module 420f, having greater thermal conductivity, is thus configured to better protect the linear array of LED devices 102 from degrading or burning by removing excess heat from the LED device 102. The second module 420s, because it is spaced apart from the linear array of LED devices 102, plays a lesser role than the first module 420f in cooling the LED device 102. The cost for making the LED filament 100 is thus economized when the second module 420s is not as heavily doped with nanoparticles as the first module 420f. The dimension of the first module 420f, in which the LED device 102 is disposed, in relation to the entire enclosure 108 is determined by a desired totality of considerations such as light conversion capability, bendability and thermal conductivity. Other things equal, the bigger the first module 420f in relation to the entire enclosure 108, the LED filament 100 has greater light conversion capability and thermal conductivity but will be less bendable.

Next, the regions of the multifunctional module are defined by a hypothetical set of coaxial cylindrical surfaces having the longitudinal axis of the LED filament 100 as their central axis. For example, the enclosure 108 includes three regions 420e, 420m, 420o defined by a hypothetical pair of coaxial cylindrical surfaces compartmentalizing the multifunctional module 420f, 420s into a core region 420e, an outer region 420o and a tubular middle region 420m sandwiched by the core region 420e and the outer module 420o. The linear array of LED devices 102 is disposed exclusively in one of the regions of the multifunctional module. Alternatively, the linear array of LED devices 102 is absent from at least one of the regions of the multifunctional module. Alternatively, the linear array of LED devices 102 is disposed in all regions of the multifunctional module. In an embodiment, the outer region 420o includes a light scatterer for increasing light extraction from the LED device 102 by reducing total internal reflection. The tubular middle region 420m includes a wavelength converter for converting blue light emitting from the LED device 102 into white light. The core region 420e includes a spacer. The spacer prevents heat coming from the LED device 102 from quickly degrading the phosphor particle by keeping the phosphor particle apart from the LED device 102. Moreover, the spacer enables a uniform thickness for the tubular middle region 420m, which includes the wavelength converter, to produce uniform white light, which entails a proper combination of blue light and the phosphor light. In another embodiment, the tubular middle region 420m is made harder than the core region 420e, the outer region 420o or both by, for example, embedding a greater concentration of phosphor particles in the tubular middle region 420m than in the core region 420e, the outer region 420o or both. The tubular middle region 420m, because it is harder, is thus configured to better protect the linear array of LED devices 102 from malfunctioning when the LED filament 100 is bent to maintain a desired posture in a light bulb. The core region 420e (or the outer region 420o) is made softer for keeping the entire LED filament 100 as bendable in the light bulb as it requires for generating omnidirectional light with, preferably, exactly one LED filament 100. In yet another embodiment, the core region 420e has greater thermal conductivity than the tubular middle region 420m, the outer region 420o or both by, for example, doping a greater concentration of nanoparticles in the core region 420e than in the tubular middle region 420m, the outer region 420o or both. The core region 420e, having greater thermal conductivity, is thus configured to better protect the linear array of LED devices 102 from degrading or burning by removing excess heat from the LED device 102. The tubular middle region 420m (or the outer region 420o), because it is spaced apart from the linear array of LED devices 102, plays a lesser role than the core region 420e in cooling the LED device 102. The cost for making the LED filament 100 is thus economized when the tubular middle region 420m (or the outer region 420o) is not as heavily doped with nanoparticles as the core region 420e. The dimension of the core region 420e, in which the linear array of LED devices 102 is exclusively disposed, in relation to the entire enclosure 108 is determined by a desired totality of considerations such as light conversion capability, bendability and thermal conductivity. Other things equal, the bigger the core region 420e in relation to the entire enclosure 108, the LED filament 100 has less light conversion capability and thermal conductivity but will be more bendable. The dimension of the tubular middle region 420m, which includes the wavelength converter, in relation to the entire enclosure 108 is determined by a desired totality of considerations such as light conversion capability, bendability and thermal conductivity. Other things equal, the bigger the tubular middle region 420m in relation to the entire enclosure 108, the LED filament 100 has greater light conversion capability and thermal conductivity but will be less bendable.

The region of a multifunctional module defined by the hypothetical set of cylindrical surfaces and the hypothetical set of planes is either continuous or not continuous. Shifting to FIG. 29, in an embodiment, the core region 420e and the tubular middle region 420m extend longitudinally across the first module 420f of the enclosure 108 but are broken periodically and absent from the second module 420s. In other words, what would be a tubular middle region and a core region if the all regions were continuous throughout second module 420s are merged into one region in the second module 420s when all regions of the multifunctional modules 420f, 420s are not continuous. Staying on FIG. 29, what would otherwise be a core module 420e and a tubular middle module 420m in the first module 420f in FIG. 28 become a core region 420e and a tubular middle region 420m in the multifunctional module 420f. For example, the outer module 420o, which is continuous throughout the enclosure 108, includes a light scatterer for reducing total internal reflection. The multi-functional module 420f includes a tubular middle region 420m and a core region 420e. The tubular middle region 420m of the multi-functional module 420f—sandwiched by the outer module 420o and the core region 420e of the multifunctional module 420f—includes a wavelength converter, e.g. phosphor particles embedded in a transparent binder, for producing uniform white light, which entails a proper combination of blue light and the phosphor light. The core region 420e of the multifunctional module 420f includes a spacer for preventing heat coming from the LED device 102 from degrading the phosphor particles in the wavelength converter prematurely. Moreover, the spacer enables a uniform thickness for the tubular middle region 420m of the multifunctional module 420f. The second module 420s, like the core region 420e of the multifunctional module 420f, also includes a wavelength converter. In an embodiment, the second module 420s is softer than the core region 420e of the multifunctional module 420f, the tubular middle region 420m of the multifunctional module 420f or both such that the LED filament 100 is as bendable as it is required to generate omnidirectional light with exactly one LED filament 100. In another embodiment, the second module 420s is less thermally conductive than the core region 420e of the multifunctional module 420f, the tubular middle region 420m of the multifunctional module 420f or both. The core region 420e of the multifunctional module 420f (or the tubular middle region 420m of the multifunctional module 420f) plays a bigger role than the second module 420s in removing heat generated by the LED device 102. Related features are described in FIGS. 49A to 54 and 56 in U.S. Ser. No. 15/499,143 filed Apr. 27, 2017.

Figure 33:
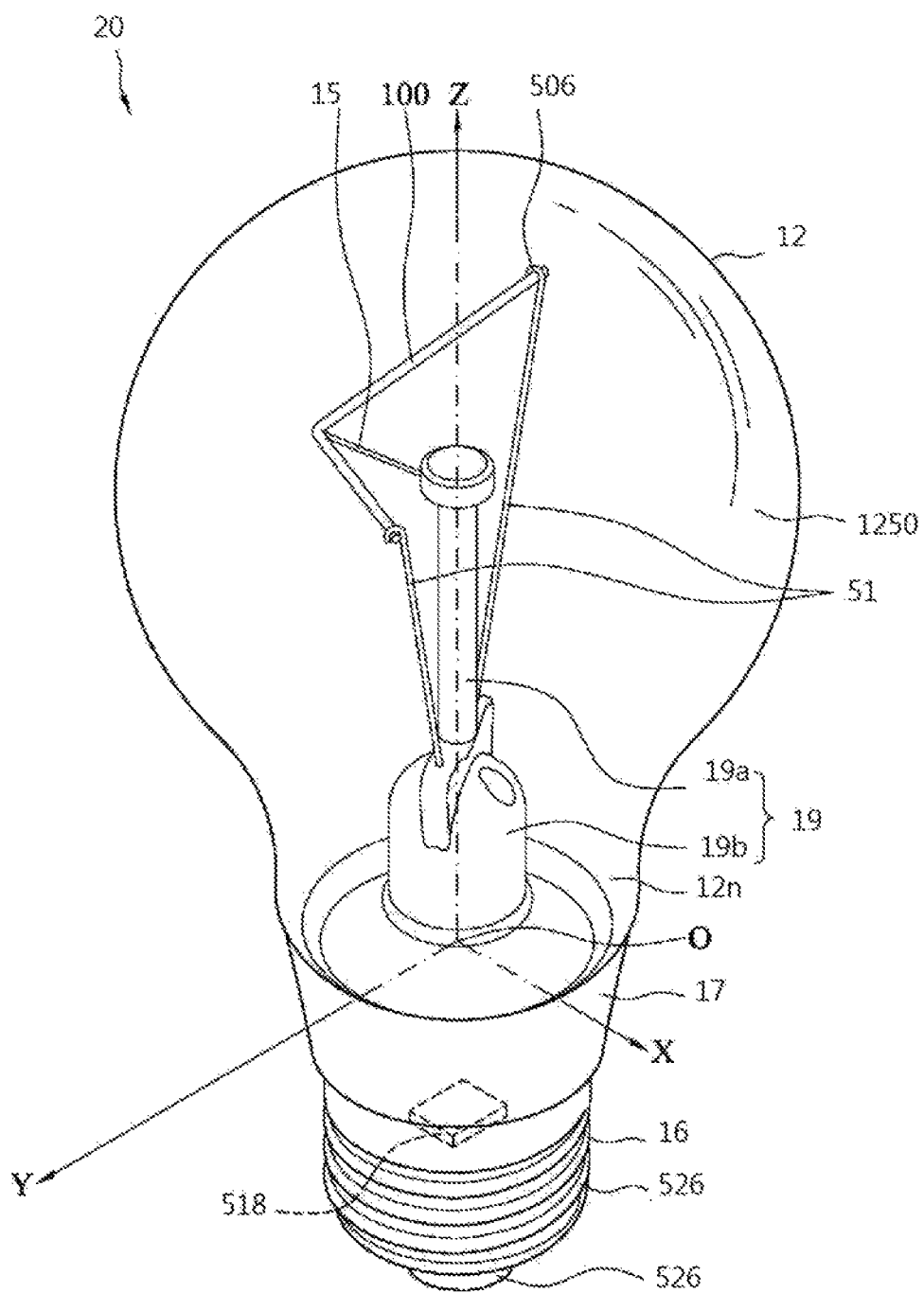
FIG. 33 shows an LED light bulb in accordance with an exemplary embodiment of the present invention.

FIG. 33 shows an LED light bulb 20 having an LED filament 100 of the present invention as the light source. In an embodiment, the LED light bulb 20 comprises a light transmissive envelope (i.e. bulb shell, bulb housing) 12, a base 16, a stem press 19, an LED filament 100 and a plurality of lead wires 51. The light transmissive envelope 12 is a bulbous shell made from light transmissive materials such as glass and plastic. The light transmissive envelope 12 includes a bulbous main chamber 1250 for housing the LED filament 100 and sometimes a neck 12n dimensionally adapted for attaching to the base 16. At least part of the base 16 is metal and includes a plurality of electrical contacts 526 for receiving electrical power from a lampholder. In FIG. 33, the light transmissive envelope 12 is mounted with its neck 12n on the base 16. The stem press 19 is mounted on the base 16 within the light transmissive envelope 12 for holding the lead wire 51 and the LED filament 100 in position while keeping the positive and negative currents insulated from each other. The lead wire 51 extends in a substantially axial direction from the base 16 through the neck 12n all the way into the main chamber 1250. The lead wires 51 are coupled to the electrical contacts 526 of the base 16 and an electrical connector 506 of the LED filament 100. Electrical power is communicated from the lampholder to the base 16 and all the way to the LED filament 100 through the lead wire 51 when the base 16 and the lampholder are properly connected. The LED light bulb 20 is thus configured to emit light omnidirectionally. In some embodiments, the LED light bulb 20, including exactly one LED filament 100, is configured to emit light omnidirectionally. In other embodiments, the LED light bulb 20, including a plurality of LED filaments 100, is configured to emit light omnidirectionally. In addition to brining electrical power for the LED filament 100, the lead wire 51 also supports the LED filament 100 to maintain a desired posture in the main chamber 1250.

In some embodiment where the lead wire 51 alone cannot provide sufficient support, the LED light bulb 20 further includes a plurality of support wires 15 to help the LED filament 100 maintain a desired posture in the main chamber 1250. In some embodiments, the support wire 15 is made of carbon spring steel for additional damping protection. Preferably, the support wire 15 is not in electrical communication with any part of the LED light bulb 20. Thus, negative impact resulting from thermal expansion or heat is mitigated. When the LED filament 100 defines a sinuous curve in the main chamber 1250, the lead wire 51 supports the LED filament 100 either at the crest of the curve, the trough of the curve or anywhere between the crest and the trough. The support wire 334 attaches to the LED filament 100 in a variety of ways. For example, the lead wire 51 includes a hook or claw at a tip. The throat of the hook is snugly closed around the LED filament 100. Alternatively, the claw is snugly closed around the LED filament 100.

Staying on FIG. 33, in an embodiment, the LED light bulb include exactly two lead wires 51. The base 16 includes a top end, a bottom end and a side surface. The light transmissive envelope 12 is mounted with its neck 12n on the top end of the base 16. The base 16 includes two electrical contracts 526 at the bottom end and the side surface. Lead wires 51 are coupled to the electrical contacts of the base 16 and the electrical connector 506 of the LED filament 100. For example, the lead wire 51 and the electrical connector 506 may be fastened together by soldering. The filler metal for soldering includes gold, silver, silver-based alloy or tin. Alternatively, when the electrical connector 506 includes an aperture and the lead wire 51 includes a hook structure at a tip, the lead wire 51 and the electrical connector 506 is fastened by closing the throat of the hook against the aperture. In some embodiments, the LED light bulb 20 further includes a driving circuit 518 (e.g. rectifier), which is in electrical connection with the electrical contacts 526 of the base 16 and the lead wire 51, for converting AC electricity from the lampholder into DC electricity to drive the LED filament 100.

Staying on FIG. 33, preferably, the base 16 has a form factor compatible with industry standard light bulb lampholder. Specifications for light bulb bases and sockets are largely overseen by two organizations. The American National Standards Institute (ANSI) is an organization that publishes C81.61 and C81.62, while International Electrotechnical Commission (IEC) publishes 60061-1 and 60061-2. Edison screw lamp base and lampholder examples include but are not limited to the E-series described in ANSI C81.61 and C81.62: E5 midget, E10 miniature, E11 mini-candelabra, E12 candelabra, E17 intermediate, E26/24 single-contact medium, E26d double-contact medium, E26/50×39 skirted medium, E26/53×39 extended skirted medium, E29/53×39 extended skirted admedium, E39 single-contact mogul, E39d double-contact mogul, EP39 position-oriented mogul, and EX39 exclusionary mogul. Multiple-pin lamp base and lampholder examples include but are not limited to the G-series described in ANSI C81.61 and C81.62: GY two-pin for T, G4 two-pin for single-ended TH, GU4 two-pin for MR11 GLS lamps, GZ4 two-pin for projection lamps, G5 fluorescent miniature two-pin, 2G7 four-pin compact fluorescent, GZ10 bipin, G16t three-contact lug for PAR lamps, G17t three-pin prefocus for incandescent projection lamps. Bayonet lamp base and lampholder examples include but are not limited to the B-series described in ANSI C81.61 and C81.62: B/BX8.4d small instrument panel, BA9/12.5 miniature, BAW9s for HY21W, BA15s candelabra single contact, BAZ15d double contact with offset, and BY22d multipurpose sleeved double contact.

Staying on FIG. 33, in an embodiment, the light transmissive envelope 12 is made from a light transmissive material with good thermal conductively, e.g. glass, plastic. In another embodiment, the light transmissive envelope 12 is configured to absorb a portion of the blue light emitted by the LED filament 100 to obtain a warmer color temperature. To make the light warmer, for example, the light transmissive envelope 12 is made from a material doped with yellow particles. Alternatively, the light transmissive envelope 12 is coated with a yellow film. In yet another embodiment, the light transmissive envelope 12, which is hermetically connected to the base 16, is charged with a gas having greater thermal conductivity than the air such as hydrogen, nitrogen and a mixture of both. In additional to greater heat dissipation, humidity—potentially undermining the electronics of the LED light bulb 20—is thus removed from the light transmissive envelope 12. In an embodiment, hydrogen accounts for from 5% to 50% of the volume of the light transmissive envelope 12. In still another embodiment, the light transmissive envelope 12 is sealed at an internal pressure of from 0.4 to 1.0 ATM.

Staying on FIG. 33, the stem press 19 is made from an electrically insulative material such as glass or plastic. The shape and dimension of the stem press 19 depends on a totality of considerations such as the number of LED filaments 100 the LED light bulb 20 has, the posture the LED filament 100 is expected to maintain in the main chamber 1250; the manner the lead wire 51 supports the LED filament 100; the number of lead wires 51 the LED light bulb 20 has; whether the LED light bulb 20 further includes support wires 15; and whether or how a heatsink finds itself in the LED light bulb 20. In an embodiment, the step press 19 includes a basal portion 19b for attaching the stem press 19 to the base 19b and a post portion 19a for attaching the support wire 51 to the step press 19. The length of the step press 19 depends on the position the LED filament 100 is expected to be elevated in the light transmissive envelope 12. In an embodiment, the stem press 19 extends barely above the base 16. In another embodiment, the stem press 19 extends above the base 16 and into the neck 12n. In yet another embodiment, the stem press 19 extends above the base 16, through the neck 12n and into the main chamber 1250. In some embodiments, the stem press 19 is made from an electrically insulative material having good thermal conductivity such as aluminium oxide and aluminium nitride. In other embodiments, the stem press 19 includes an opening for evacuating air from the light transmissive envelope 12 and for charging the light transmissive envelope 12 with the desired amount of gas.

Staying on FIG. 33, in some embodiments, the base 16 includes a heatsink 17. The heatsink 17 is made from materials having good thermal conductivity such as metal, thermal ceramics and thermal plastic. In some embodiments, the stem press 19, the portion of the base 16 other than the heatsink 17 or both is made from a same material from which the heatsink 17 is made. In other embodiments, an integral piece including a combination of at least two of the stem press 19, the other portion of the base 16 other than the heatsink 17 and the heatsink 17 is formed with a same material to reduce thermal resistance of the LED light bulb 20. The heatsink 17 is in thermal communication with the LED filament 100 and ambient air for transferring heat coming from the LED device to the ambient air. Preferably, the heatsink 17 is in thermal communication with, in addition to the LED filament 100 and ambient air, the stem press 19, the lead wire 51, the support wire 15, the other portion of the base 16 other than the heatsink 17 or any combination of the above.

The LED filament 100 is designed to maintain a posture within the chamber to obtain an omnidirectional light emission. Shifting to FIG. 34, the LED light bulb 20 comprises a light transmissive envelope 12, a base 16, a stem press 19, exactly one LED filament 100, exactly a pair of lead wires 51 and a rectifier 518. The rectifier 518 is disposed within the space inside the base 16. The stem press 19 includes a stump-like structure projecting from the base 16. The LED filament 100 defines an arc extending substantially vertically in the light transmissive envelope 12. Optionally, the base 16 includes a heatsink 17. For easy reference, a Cartesian coordinate system is oriented for the LED light bulb 20 where: (1) the interface connecting the light transmissive envelope 19a and base 19b falls on the x-y plane; and (2) the z-axis, also the longitudinal axis of the LED light bulb 20, intersects the interface at point O. In an embodiment, the endpoint of the arc reaches as high as point H1 on the z-axis. The distance on the y-axis between the endpoints of the LED filament 100 is D. The length of LED filament 100 on the z-axis is A1. The posture of the LED filament 100 in the LED light bulb 20 is defined by all points in the set (0, Y, Z+H1), where Z goes up from 0 to A1 and then from A1 back to 0 as Y goes from −D/2 to 0 and then from 0 to D/2. The length of the heatsink 17 along the z-axis is L1. The length of the combination of the light transmissive envelope 12 and the heatsink 17 along the z-axis is L2. Q is the ratio of L1 to L2. Other things equal, the greater Q is, the LED light bulb 20 has stronger heatsinking capability but less space for the LED filament 100 to maintain a suitable posture in the light transmissive envelope 12 and shine omnidirectionally. Preferably, Q is from 0.1 to 1.5. Most preferably, Q is from 0.2 to 0.4. The curvaceous length of the LED filament 100 is L. The sinuosity (S) of the LED filament 100 is L/D. Other things equal, the greater S is, the closer to an omnidirectional luminary the LED light bulb 20 will be. Preferably, S is from 1.5 to 4. Most preferably, S is from 2 to 3. M is the ratio of the length of the LED filament 100 on the x-axis to the length of the light transmissive envelope 12 on the x-axis. N is the ratio of the length of the LED filament 100 on the y-axis to the length of the light transmissive envelope 12 on the y-axis. P is the ratio of the length of the LED filament 100 on the z-axis to the length of the light transmissive envelope 12 on the z-axis. Other things equal, the closer to 3 the aggregate of M, N and P is, the closer to an omnidirectional luminary the LED light bulb is. In the embodiment, M is from 0 to 0.05. Preferably, N is from 0.1 to 0.8 and P is from 0.1 to 0.8. Most preferably, N is from 0.3 to 0.6 and P is from 0.2 to 0.5.

Figure 35:
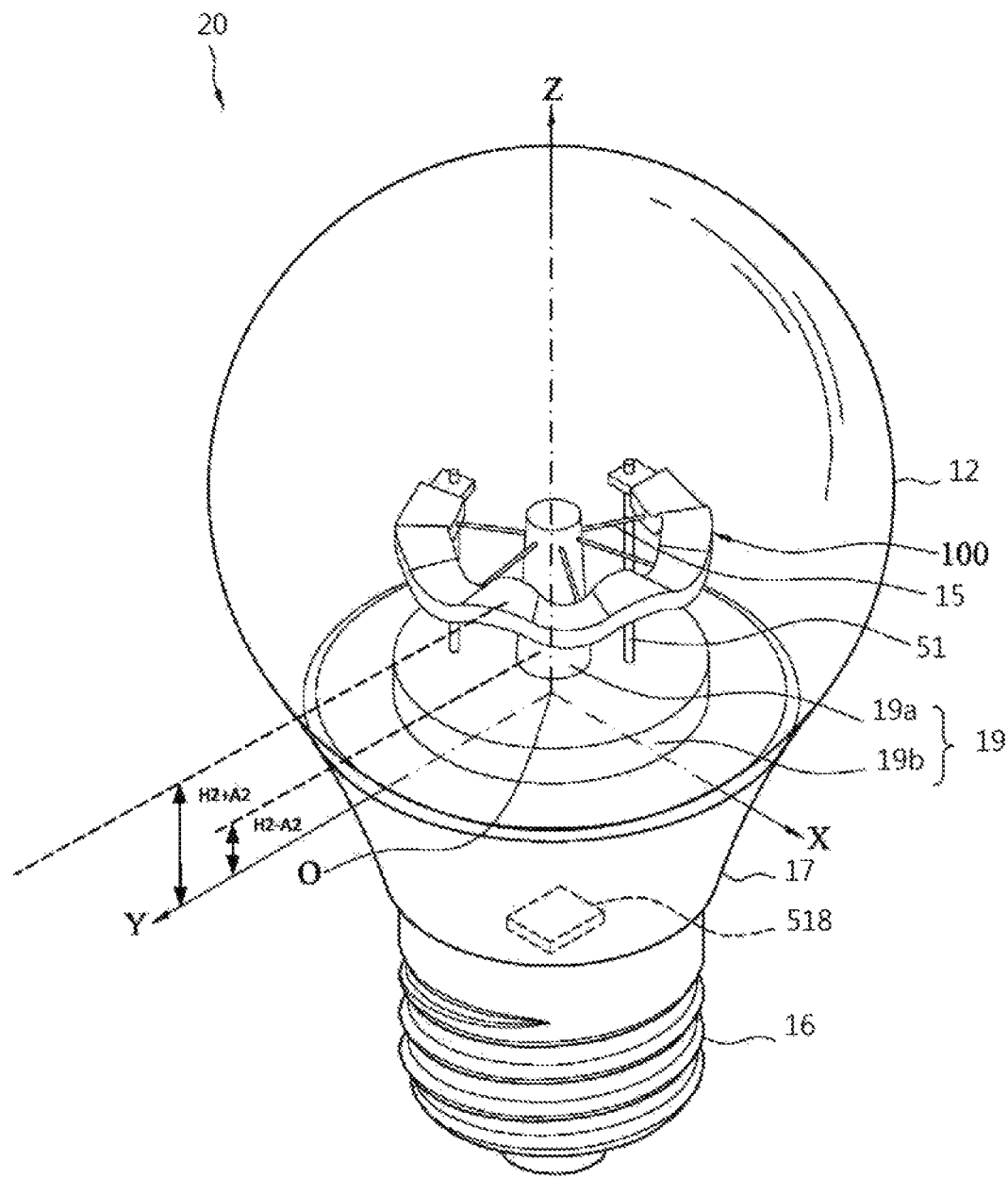
FIG. 35 shows an LED light bulb in accordance with an exemplary embodiment of the present invention.

Shifting to FIG. 35, the LED light bulb 20 comprises a light transmissive envelope 12, a base 16 including a heatsink 17, a stem press 19, exactly one LED filament 100, exactly a pair of lead wires 51, a rectifier 518 and a plurality of support wires 15. The rectifier 518 is disposed within the base 16. The stem press 19 includes a stump-like basal portion 19b for attaching the stem press 19 to the base 332 and an elongated post portion 19a for elevating the LED filament 100 to a desired position in the light transmissive envelope 12. The plurality of support wires 15 radiates (horizontally, for example) from the post portion 19a to form a spoke-and-hub structure in the light transmissive envelope 12. The support wire 15 is attached to the post portion 19a at a first end and to the LED filament 100 at a second end. In the embodiment, the LED filament 100 defines a sinuous curve along an arc meandering in the light transmissive envelope 12. The sinuous curve defined by the LED filament 100 oscillates in the range from H2+A2 to H2−A2 on the z-axis, where H2 represents the average height of the LED filament 100 along the z-axis in the LED light bulb 20 and A2 the amplitude of the sinuous curve the LED filament 100 defines. The plurality of support wires 15 has a same length R. The posture of the LED filament 100 in the LED light bulb 20 is defined by all points in the set (X, Y, Z+H2), where −R=<X=<−R=<Y=<R; and −A2=<Z=<A2. The LED filament 100, seen through the light transmissive envelope 12, is aesthetically pleasing whether it is glowing or not. Moreover, omnidirectional light emission is made possible with only one LED filament 100 having a posture like this. The quality as well the cost for producing omnidirectional LED light bulbs 20 is thus improved because fewer interconnections of parts are needed when only one LED filament 100 is employed. The length between the endpoints of the LED filament 100 is D. The actual length of the LED filament 100 is L. The sinuosity (S) of the LED filament 100 is L/D. Other things equal, the greater S is, the closer to an omnidirectional luminary the LED light bulb 20 will be. Preferably, S is from 2 to 20. Most preferably, S is from 4 to 6. M is the ratio of the length of the LED filament 100 on the x-axis to the length of the light transmissive envelope 12 on the x-axis. N is the ratio of the length of the LED filament 100 on the y-axis to the length of the light transmissive envelope 12 on the y-axis. P is the ratio of the length of the LED filament 100 on the z-axis to the length of the light transmissive envelope 12 on the z-axis. In the embodiment, P is from 0.2 to 0.7. Preferably, P is from 0.3 to 0.6. Preferably, M is from 0.2 to 0.8 and N is from 0.2 to 0.8. Most preferably, M is from 0.3 to 0.4 and N is from 0.3 to 0.4.

Figure 34:
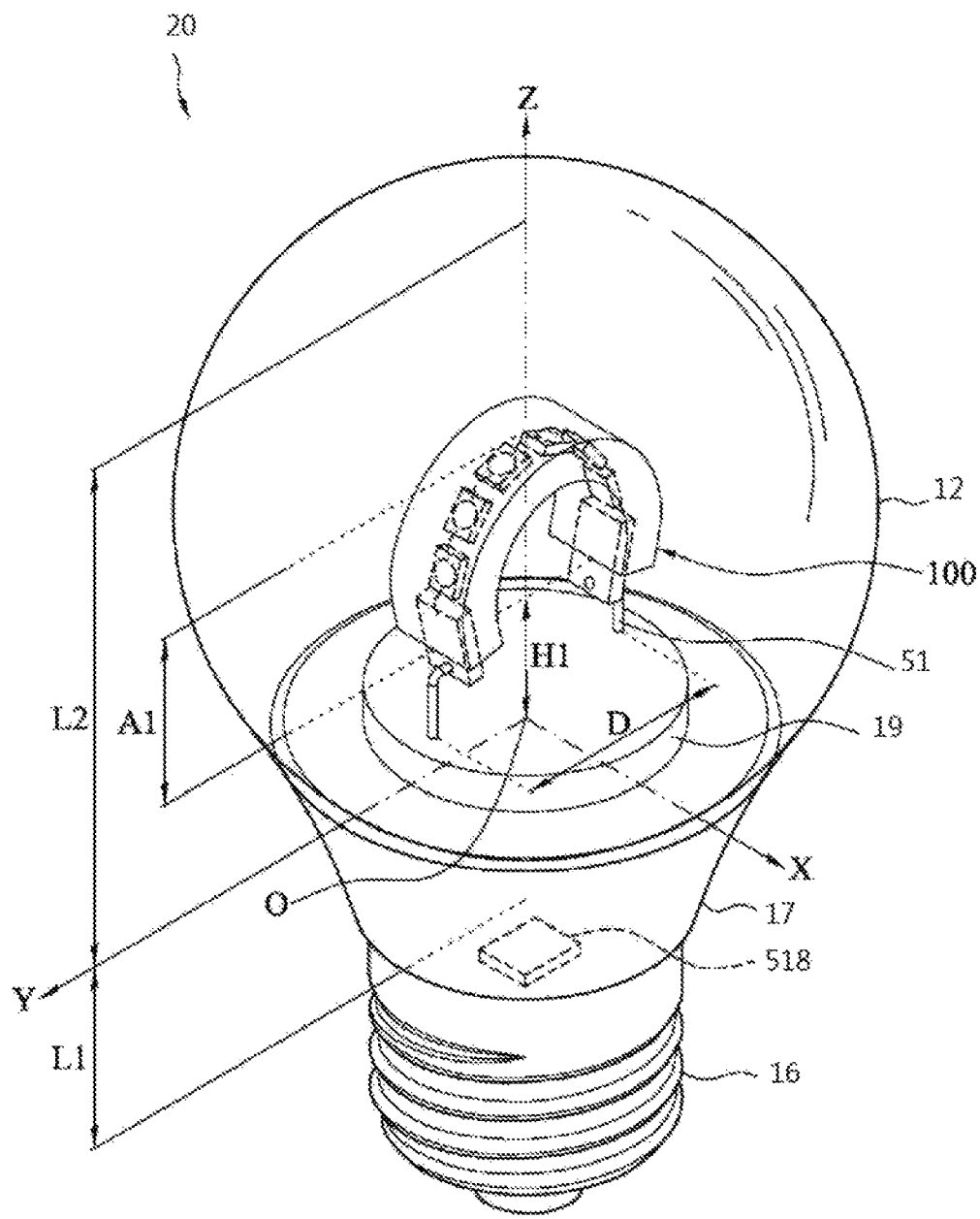
FIG. 34 shows an LED light bulb in accordance with an exemplary embodiment of the present invention.
Figure 36:
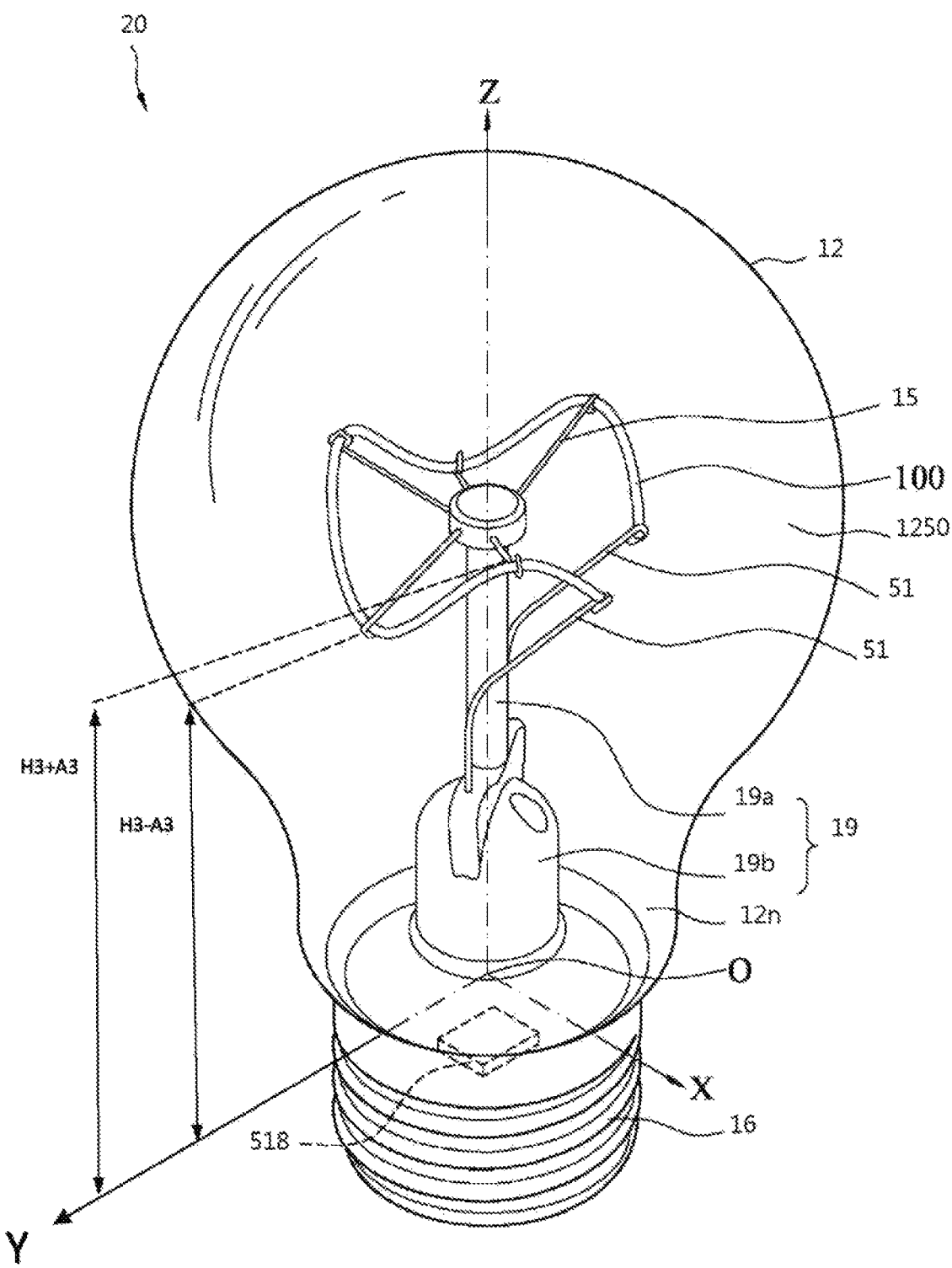
FIG. 36 shows an LED light bulb in accordance with an exemplary embodiment of the present invention.

Shifting to FIG. 36, the LED light bulb 20 comprises a light transmissive envelope 12, a base 16, a stem press 19, exactly one LED filament 100, exactly a pair of lead wires 51, a rectifier 518 and a plurality of support wires 15. The light transmissive envelope 12 has a bulbous main chamber 1250 for housing the LED filament 100 and a neck 12n for connecting the light transmissive envelope 12 to the base 16. The rectifier 518 is disposed within the base 16. The plurality of support wires 15 radiates (slightly deviating from the horizon, for example) from the post portion 19a of the stem press 19 to form a spoke-and-hub structure inside the light transmissive envelope 12. The support wire 15 is attached to the post portion 19a at a first end and to the LED filament 100 at a second end. In the embodiment, the LED filament 100 defines a sinuous curve along an arc meandering in the light transmissive envelope 12. The sinuous curve oscillates in the range from H3+A3 to H3−A3 on the z-axis, where H3 represents the average height of the LED filament 100 in the LED light bulb and A3 the amplitude of the sinuous curve the LED filament 100 defines. A3 is greater than A2; likewise, H3 is greater than H2. Consequently, the stem press 19 in FIGS. 34 and 35 is a shorter structure projecting from projecting from the base 16. By contrast, the stem press 333 we need in FIG. 36 to elevate the LED filament 100 to a higher position in the main chamber 1250 becomes a longer structure having a basal portion 19b and an elongated post portion 19a. The plurality of support wires 15 has a same length R. The posture of the LED filament 100 in the LED light bulb 20 is defined by all points in the set (X, Y, Z+H3), where −R=<X=<-R=<Y=<R; and −A3=<Z=<A3. The length between the endpoints of the LED filament 100 is D. The length of the actual length of the LED filament 100 is L. The sinuosity (S) of the LED filament 100 is L/D. Other things equal, the greater S is, the closer to an omnidirectional luminary the LED light bulb 20 will be. Preferably, S is from 2 to 20. Most preferably, S is from 10 to 14. M is the ratio of the length of the LED filament 100 on the x-axis to the length of the light transmissive envelope 12 on the x-axis. N is the ratio of the length of the LED filament 100 on the y-axis to the length of the light transmissive envelope 12 on the y-axis. P is the ratio of the length of the LED filament 100 on the z-axis to the length of the light transmissive envelope 12 on the z-axis. In the embodiment, P is from 0.2 to 0.7. Preferably, P is from 0.2 to 0.4. Preferably, M is from 0.2 to 0.8 and N is from 0.2 to 0.8. Most preferably, M is from 0.3 to 0.4 and N is from 0.3 to 0.4.

Figure 37:
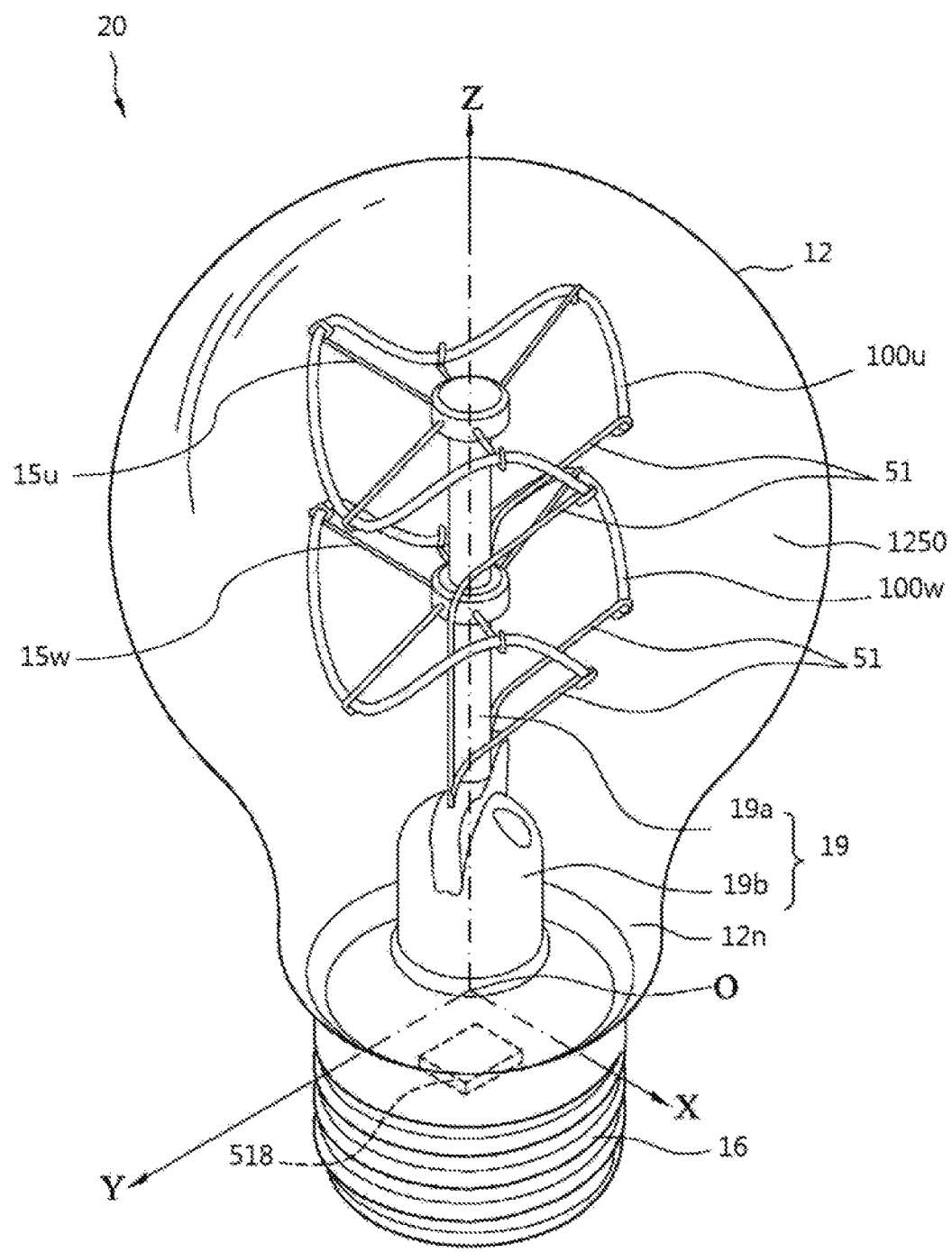
FIG. 37 shows an LED light bulb in accordance with an exemplary embodiment of the present invention.

Shifting to FIG. 37, the LED light bulb comprises a light transmissive envelope, a base, a stem press, an upper LED filament 100u, a lower LED filament 100w, a set of lead wires 51, a rectifier 518, an upper set of support wires 100u and a lower set of support wires 100w. The light transmissive envelope 12 has a bulbous main chamber 1250 for housing the LED filaments 100u, 100w and a neck 12n for connecting the light transmissive envelope 12 to the base 16. The rectifier 518 is disposed within the base 16. The set of support wires 15u, 15w radiate (slightly deviating from the horizon, for example) from the post portion 19a to form a spoke-and-hub structure in the light transmissive envelope 12. The support wire 15u, w is attached to the post portion 19a at a first end and to the LED filament 100u, 100w at a second end. The upper set of support wires 15u is configured to hold the upper LED filament 100u in position. The lower set of support wires 15w is configured to hold the lower LED filament 100w in position. Other things equal, a shorter LED filament 100 is needed to produce the same luminosity of omnidirectional light with the LED light bulb 20 in FIG. 37 than the LED light bulb 20 in FIG. 36. Likewise, the LED light bulb 20 in FIG. 37 is amenable to a smaller girth than the LED light bulb 20 in FIG. 36. In the embodiment, the LED filament 100 defines a sinuous curve along an arc meandering in the light transmissive envelope 20. The upper LED filament 100u defines an upper sinuous curve oscillating in the range from H4+A4 to H4−A4 on the z-axis, where H4 represents the average height of the upper LED filament 100u in the LED light bulb 20 and A4 the amplitude of the upper sinuous curve the upper LED filament 100u defines. The lower LED filament 100w defines a lower sinuous curve oscillating in the range from H5+A5 to H5−A5 on the z-axis, where H5 represents the average height of the lower LED filament 100w in the LED light bulb 20 and A5 the amplitude of the lower sinuous curve the lower LED filament 100w defines. H5 is less than H4, making the upper LED filament 100u higher in the light transmissive envelope 12 than the lower LED filament 100w. A4 is chosen to be, for example, the same as A5. The plurality of support wires 15u, 15w have a same length R. The posture of the upper LED filament 100u in the LED light bulb 20 is defined by all points in the set (X, Y, Z+H4), where −R=<X=<-R=<Y=<R; and −A4=<Z=<A4. The posture of the lower LED filament 100w in the LED light bulb 20 is defined by all points in the set (X, Y, Z+H5), where −R=<X=<-R=<Y=<and −A5=<Z=<A5. The length of between the endpoints of the LED filament 100u, 100w is D. The length of the actual length of the LED filament 100u, 100w is L. The sinuosity (S) of the LED filament 100u, 100w is L/D. Other things equal, the greater S is, the closer to an omnidirectional luminary the LED light bulb 20 will be. Preferably, S is from 2 to 20. Most preferably, S is from 12 to 16. M is the ratio of the aggregate of the lengths of the pair of LED filaments 100u, 100w on the x-axis to the length of the light transmissive envelope 12 on the x-axis. N is the ratio of the aggregate of the lengths of the pair of LED filaments 100u, 100w on the y-axis to the length of the light transmissive envelope 12 on the y-axis. P is the ratio of the aggregate of the lengths of the pair of the LED filaments 100u, 100w on the z-axis to the length of the light transmissive envelope 12 on the z-axis. In an embodiment, P is from 0.4 to 1.7. Preferably, M is from 0.4 to 1.6 and N is from 0.4 to 1.6. Most preferably, M is from 0.6 to 0.8 and N is from 0.6 to 0.8. Related features are described in FIGS. 44A to 46B and 47A to 48D in U.S. Ser. No. 15/499,143 filed Apr. 27, 2017.

What is claimed is:

1. An LED filament, comprising:
an enclosure;
a linear array of LED devices, wherein the LED devices are interconnected with bond wires; and
an electrical connector, wherein:
the enclosure includes an optically transmissive binder; and the linear array of LED devices is conformally wrapped around by the enclosure to be operable to emit light when energized through the electrical connector, wherein:
the LED filament is capable of self-sustained plastic deformation for maintaining a suitable posture in an LED light bulb;
the enclosure includes a posture maintainer;
the posture maintainer includes a wire system embedded in the optically transmissive binder; and
the LED filament maintains the suitable posture in the LED light bulb by physically attaching the electrical connector to a lead wire of the LED light bulb;
wherein the wire system is not electrically connected to the linear array of LED devices.

2. The LED filament in claim 1, wherein the posture maintainer includes an aperture system beneath a surface of the enclosure where tight turns are planned for the posture the LED filament is designed to maintain in the LED light bulb.

3. The LED filament in claim 2, wherein the enclosure has a texturized outer surface for improving light extraction.

4. The LED filament in claim 1, wherein:
the enclosure further includes a wavelength converter;
the wavelength converter is formed by embedding a plurality of light conversion particles in the optically transmissive binder; and
the plurality of light conversion particles is in a state of thermal optimum for forming a plurality of heat transfer paths.

5. The LED filament in claim 4, wherein the plurality of heat transfer paths radiates outwardly from the LED device toward a surface of the enclosure in a radial direction.

6. The LED filament in claim 1, wherein:
the entire enclosure is a monolithic structure made from a single piece of optically transmissive material;
the enclosure includes three regions defined by a pair hypothetical cylindrical surfaces having a central axis of the LED filament as its central axis;
the three regions defined by a coaxial pair of the hypothetical cylindrical surfaces compartmentalizing the enclosure into a core region, an outer region and a middle region sandwiched by the core region and the outer region;
the core region has a different set of properties from that of the outer region;
the linear array of LED devices is disposed in the core region; and
the regions of the enclosure are defined by a hypothetical cylindrical surface having a central axis of the LED filament as its central axis;
a cross section perpendicular to a longitudinal axis of the LED filament reveals the core region and other regions of the enclosure;
R3 is a ratio of an area of the core region to an overall area of the cross section; and
R3 is from 0.1 to 0.8.

7. The LED filament in claim 6, wherein:
a cross section perpendicular to a longitudinal axis of the LED filament reveals the middle region and other regions of the enclosure;
R4 is a ratio of an area of the middle region to an overall area of the cross section; and
R4 is from 0.1 to 0.8.

8. The LED filament in claim 7, wherein:
the enclosure includes a posture maintainer; and
the posture maintainer includes a wire system embedded in the optically transmissive binder.

9. The LED filament in claim 8, wherein:
the LED devices are interconnected with a bond wire; and
a sinuosity of the bond wire is from 2 to 8.

10. The LED filament in claim 1, wherein:
the enclosure is a modular structure assembled from modules;
the enclosure includes three modules defined by a pair hypothetical cylindrical surfaces having a central axis of the LED filament as a central axis of the pair hypothetical cylindrical surfaces;
the three modules defined by a coaxial pair of the hypothetical cylindrical surfaces compartmentalizing the enclosure into a core module, an outer module and a middle module sandwiched by the core module and the outer module;
the core module has a different set of properties from that of the outer module;
the linear array of LED devices is disposed in the core module;
the modules of the enclosure are defined by a hypothetical cylindrical surface having a central axis of the LED filament as a central axis of the hypothetical cylindrical surface a cross section perpendicular to a longitudinal axis of the LED filament reveals the core module and other modules of the enclosure;
R8 is a ratio of an area of the core module to an overall area of the cross section; and
R8 is from 0.1 to 0.8.

11. The LED filament in claim 10, wherein:
a cross section perpendicular to a longitudinal axis of the LED filament reveals the middle module and other modules of the enclosure;
R9 is a ratio of an area of the middle module to an overall area of the cross section; and
R9 is from 0.1 to 0.8.

12. The LED filament in claim 11, wherein:
the enclosure includes a posture maintainer; and
the posture maintainer includes a wire system embedded in the optically transmissive binder.

13. The LED filament in claim 12, wherein:
the LED devices are interconnected with a bond wire; and
a sinuosity of the bond wire is from 2 to 8.

14. The LED filament in claim 1, wherein:
the wire system includes straight wires extending longitudinally in the enclosure of the LED filament.

15. The LED filament in claim 1, wherein:
the wire system includes sinuous springs extending longitudinally in the enclosure of the LED filament.

16. The LED filament in claim 1, wherein:
the wire system includes a helical spring extending longitudinally in the enclosure of the LED filament.

* * * * *